United States Patent [19]

Matsuo et al.

[11] Patent Number: 5,781,468
[45] Date of Patent: Jul. 14, 1998

[54] SEMICONDUCTOR MEMORY DEVICE COMPRISING TWO KINDS OF MEMORY CELLS OPERATING IN DIFFERENT ACCESS SPEEDS AND METHODS OF OPERATING AND MANUFACTURING THE SAME

[75] Inventors: Ryuichi Matsuo; Tomohisa Wada; Kazutoshi Hirayama; Shigeki Ohbayashi, all of Hyogo, Japan

[73] Assignee: Mitsubishi Denki Kabushiki Kaisha, Tokyo, Japan

[21] Appl. No.: 851,757

[22] Filed: May 6, 1997

Related U.S. Application Data

[62] Division of Ser. No. 469,161, Jun. 6, 1995, Pat. No. 5,663,905.

[30] Foreign Application Priority Data

Aug. 30, 1994 [JP] Japan ..................... 6-205340
Oct. 31, 1994 [JP] Japan ..................... 6-267752
Jan. 18, 1995 [JP] Japan ..................... 7-6069

[51] Int. Cl.$^6$ .................................. G11C 11/24
[52] U.S. Cl. ............... 365/149; 365/154; 365/189.05; 365/230.03; 365/185.08
[58] Field of Search .................... 365/149, 150, 365/154, 156, 189.05, 230.03, 222, 103, 230.02, 230.04, 185.08

[56] References Cited

U.S. PATENT DOCUMENTS 4,811,305 3/1989 Watanabe et al. .......... 365/239
4,984,200 1/1991 Saitoo et al. .............. 365/154
5,249,282 9/1993 Segers ..................... 395/425

FOREIGN PATENT DOCUMENTS 62-209797 9/1987 Japan ............... G11C 11/34
62-222487 9/1987 Japan ............... G11C 7/00
1-243147 9/1989 Japan ............... G06F 12/08
2-7141 1/1990 Japan ............... F11C 11/401

OTHER PUBLICATIONS

Design of CMOS Ultra-LSI, Apr. 1989, Baifukan Publishing Co., Ltd., pp. 155–166.
"Digital Integrated Electronics", Taub and Schilling, 1997, McGraw-Hill, pp. 450–451.

Primary Examiner—David C. Nelms
Assistant Examiner—Andrew Q. Tran
Attorney, Agent, or Firm—McDermott, Will & Emery

[57] ABSTRACT

A semiconductor memory device comprises a dynamic memory cell array, a static memory cell array, a plurality of word lines, a plurality of DRAM bit line pairs and a plurality of SRAM bit line pairs. The dynamic memory cell array comprises a plurality of dynamic memory cells arranged in the shape of a matrix. The static memory cell array is arranged adjacent to the dynamic memory cell array. The static memory cell array includes the static memory cells arranged in the shape of a matrix. A plurality of word lines are arranged in a plurality of rows. Each word line is connected to the dynamic and static memory cells arranged in the corresponding rows. A plurality of DRAM bit line pairs are arranged in a plurality of columns. Each DRAM bit line pair is connected to the dynamic memory cells. A plurality of SRAM bit line pairs are arranged in the other plurality of columns. Each SRAM bit line pair is connected to the static memory cells arranged in the corresponding columns.

3 Claims, 64 Drawing Sheets

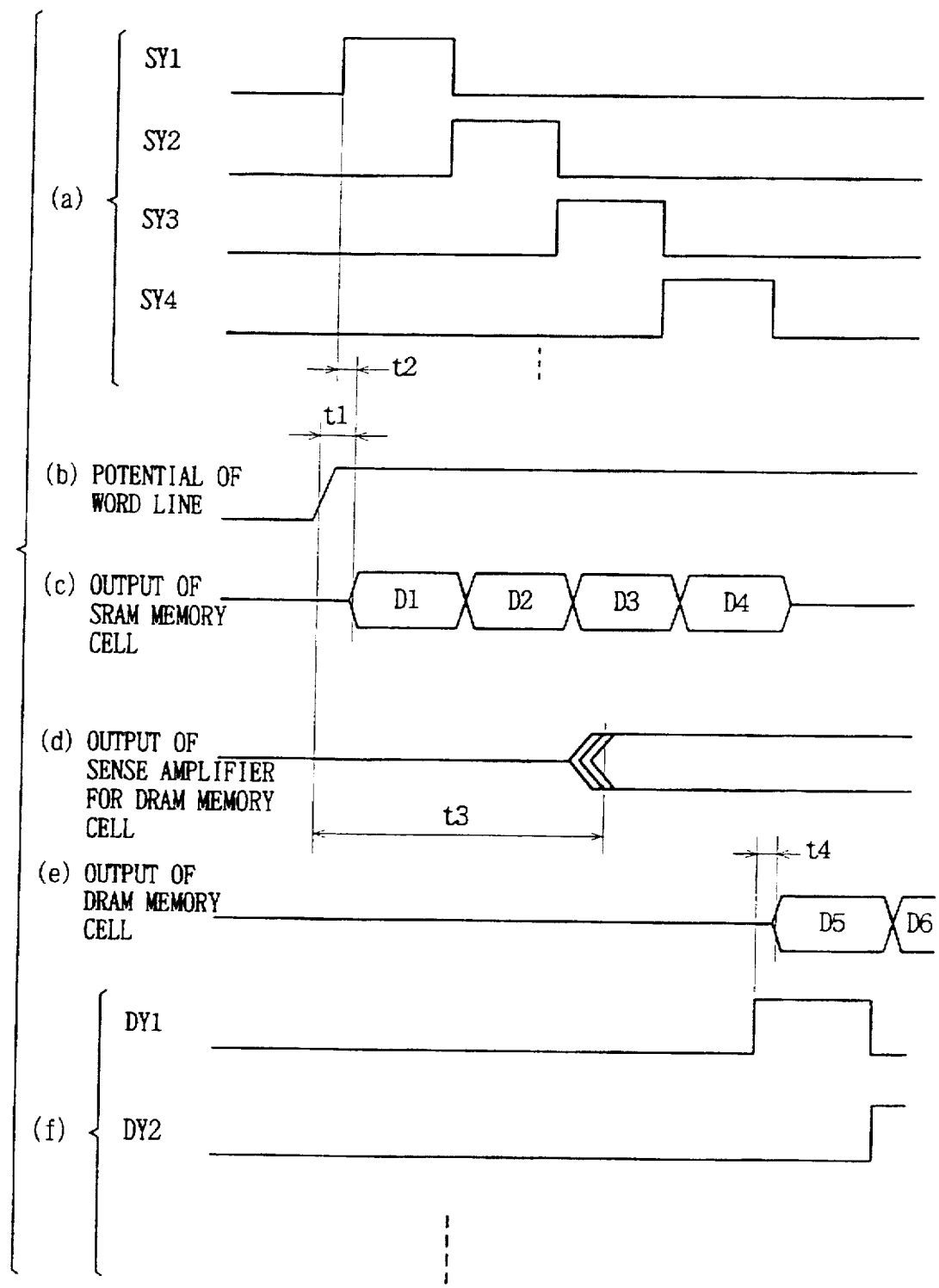

HIGH SPEED MEMORY CELL    LOW SPEED MEMORY CELL

F I G. 3 2
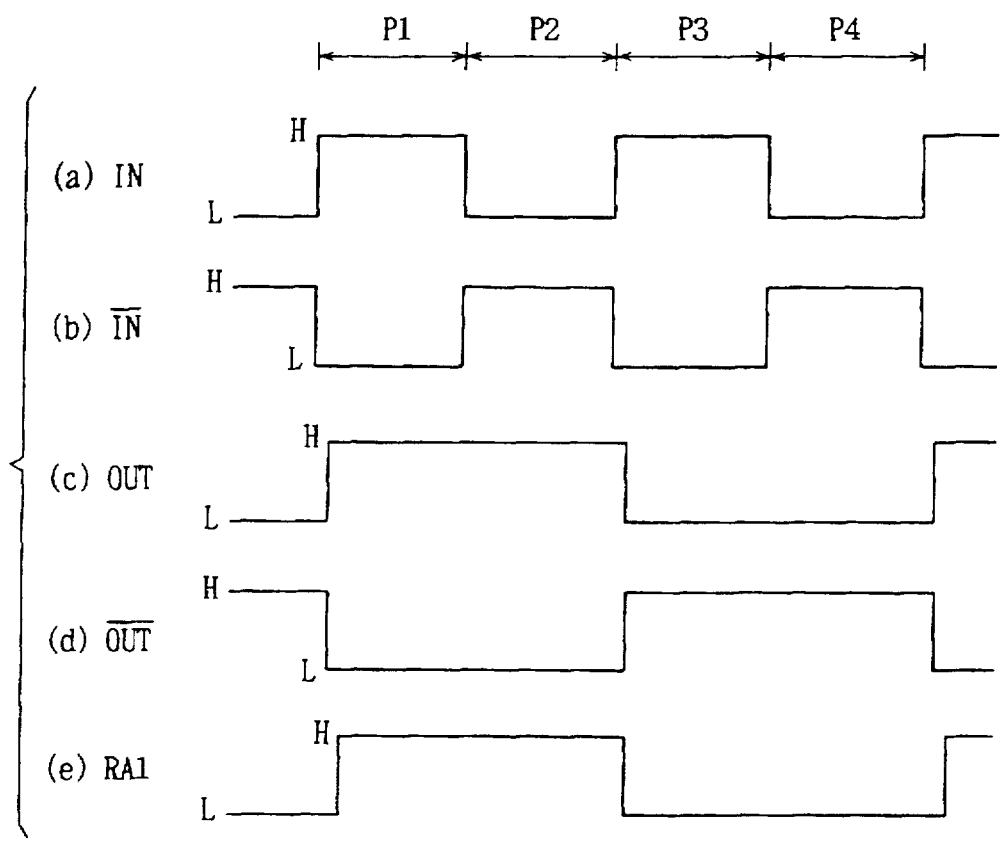

F I G. 6 9 PRIOR ART

SEMICONDUCTOR MEMORY DEVICE COMPRISING TWO KINDS OF MEMORY CELLS OPERATING IN DIFFERENT ACCESS SPEEDS AND METHODS OF OPERATING AND MANUFACTURING THE SAME

This application is a division of application Ser. No. 08/469,161 filed Jun. 6, 1995, now U.S. Pat. No. 5,663,905 issued Sep. 2, 1997.

BACKGROUND OF THE INVENTION

1. Field of the Invention

The present invention relates to a semiconductor memory device and methods of operating and manufacturing the same and more specifically to a small size semiconductor device enabling high speed access.

2. Description of the Related Arts

In general, a memory can roughly be sorted to a RAM (Random Access Memory) and a ROM (Read Only Memory). The RAM is further classified into a DRAM (Dynamic RAM) and an SRAM (static RAM). The DRAM stores information depending on charges to be stored in a capacitor. The SRAM stores information in a flip-flop circuit.

The DRAM will be first schematically explained hereunder. In the DRAM developed after the generation of 4K bits, a memory cell having the structure utilizing one N-channel MOS transistor and one capacitor is mainly introduced. Such a memory cell is also employed in the current 1M bits, 4M bits and 16M bits DRAMs.

FIG. 64 is a circuit diagram indicating a memory cell of DRAM. FIG. 65A is a plan view illustrating a structure of a trench type memory cell of DRAM, while FIG. 65B is a cross-sectional view of FIG. 65A along the cutting line B—B. FIG. 64 and FIG. 65 are introduced on pages 158 and 160 of the "Design of CMOS Ultra-LSI", issued on Apr. 25, 1989, Baifukan Publishing Co. Ltd.

As shown in FIG. 64 and FIGS. 65A, 65B, a memory cell DMC for DRAM is composed of one access transistor T1 and one memory capacitor Cs. In the write operation, the potential of word line WL becomes H (logical high) level and access transistors T1 becomes conductive. Thereby, the potential of the bit line BL is transferred to one electrode of the memory capacitor Cs, that is, a memory node M1 via the access transistor T1. When the potential of the bit line BL is H level, the potential of the memory node M1 is also H level and when the potential of the bit line BL is L (logical low) level, the potential of the memory node M1 also becomes L level. Thereby, when the potential of the word line WL becomes L level, the access transistor T1 becomes conductive. As a result, charges are accumulated in the memory capacitor Cs. A constant cell plate potential Vcp is applied to the other electrode of the memory capacitor Cs.

In the read operation, the bit line BL is to the predetermined potential and thereafter the potential of the word line WL becomes H level. Thereby, the access transistor T1 becomes conductive and charges of the memory node M1 are read out to the bit line BL via the access transistor T1. Thereby, the potential of the bit line BL changes from the predetermined potential and a resultant potential difference is amplified by a sense amplifier (not illustrated).

Next, SRAM will be schematically explained. A memory cell for SRAM is structured by a bistable circuit such as a flip-flop circuit. The memory cell for SRAM is roughly classified into several types of cells depending on types of a load element. For example, when an N-channel MOS transistor is used as a load, the cell is called an NMOS load type cell and when a P-channel MOS transistor is used as a load, the cell is called a CMOS type cell. Moreover, when a high resistance is used as a load element, the cell is called a high resistance load type cell. Furthermore, when a P-channel MOS thin film transistor is used as a load element, the cell is called a TFT type cell. In current, the high resistance load type cell is mainly used.

FIG. 66 is a circuit diagram illustrating a memory cell for SRAM. FIG. 67 is a plan view illustrating a structure of memory cell for SRAM. FIG. 66 and FIG. 57 are shown on the page 164 of "Design of CMOS Ultra-LSI".

As shown in FIG. 66 and FIG. 67, a memory cell SMC for SRAM comprises two access transistors T2, T3, high resistances R1, R2 for pulling up the memory nodes M2, M3 up to the power source voltage Vcc and two cross-coupled driver transistors T4, T5.

In the write operation, the potential of the word line WL becomes H leveland the access transistors T2, T3 become conductive. Thereby, the potential of the bit line BL is transferred to the memory node M2 via the access transistor T2 and the potential of the bit line /BL is transferred to the memory node M3 via the access transistor T3. For instance, when the bit line BL becomes H level and the bit line /BL becomes L level, the potential of the memory node M2 becomes H level, while the potential of the memory node M3 becomes L level. Subsequently, when the potential of the word line WL becomes L level, the access transistors T2 and T3 become non-conductive. Since high resistances R1, R2 and driver transistors T4, T5 form a bistable circuit (flip-flop), the memory nodes M2, M3 maintain the given potential, respectively.

In the read operation, the potential of the word line WL becomes H level and the access transistors T2 and T3 become conductive. Thereby, the potentials of the memory nodes M2 and M3 are transferred to the bit lines BL and /BL, respectively and these potentials are amplified by the sense amplifiers (not illustrated).

Since the former memory cell for DRAM DMC is formed of one transistor T1 and one capacitor Cs, one memory cell DMC occupies a small area. Therefore, DRAM has a merit of easily realizing a large memory capacity. However, DRAM has also a demerit that it is difficult to operate the sense amplifier at a high speed because charges are read from the capacitor Cs. Therefore, a longer time is required until the corresponding data is outputted from input of an address signal.

FIG. 68 is a timing chart indicating the read operation of DRAM in the page mode. When a row address strobe signal /RAS falls as indicated in FIG. 68(a), the given external address signal Add is fetched as a row address signal X as indicated in FIG. 68(c). Subsequently, as illustrated in FIG. 68(b), when a column address strobe signal/CAS falls, the given external address signal Add is fetched as a column address signal Y1. One memory cell is designated by these row address signal X and column address signal Y1 and the data D1 is read from such memory cell as illustrated in FIG. 68(d). When the column address strobe signal/CAS rises again, the column address signal Y2 is fetched and the data D2 is read from the memory cell designated by the row address signal X and column address signal Y2.

As explained above, here lies a problem that the time Tr (usually, 60 nS) until the data D1 is read first from fall of the row address strobe signal/RAS becomes longer than the time Tc (usually, 15 nS) until the next data D2 is read from fall of the column address strobe signal/CAS.

Moreover, in the DRAM, since charges are stored in the capacitor Cs, amount of charges is reduced with passage of time. Therefore, the DRAM requires the refresh operation by executing the write operation to the capacitor Cs with charges in every predetermined period.

Meanwhile, the latter SRAM has a merit that it does not require the refresh operation because a memory cell SMC thereof is formed of a bistable circuit. Moreover, since the bit lines BL, /BL consisting of a couple of complementary signal lines are used, a sense amplifier can easily be operated at a high speed. However, since SRAM usually uses a memory cell SMC consisting of six elements, it has a demerit that the occupation area of the memory cell SMC becomes larger than the memory cell DMC for DRAM. Therefore, the manufacturing cost of SRAM becomes higher than that of DRAM. Until now, the DRAM having the storage capacity four times that of the SRAM has been realized with the manufacturing technique of the same generation.

By the way, the Japanese Patent Application Laid-open No. 62-222487 discloses a semiconductor memory device wherein data is latched from the DRAM by starting the data read operation from the SRAM circuit and precharging the bit lines of the DRAM circuit and selecting the word lines during such data read operation. Moreover, the Japanese Patent Application Laid-open No. 62-209797 discloses a memory cell of the DRAM circuit is formed of three transistors. In these semiconductor devices, since it is required to provide two row decoders for SRAM and DRAM, current consumption becomes large. Moreover, complicated internal circuits must be provided for controlling the operation timings of SRAM and DRAM and such operation times are also complicated.

SUMMARY OF THE INVENTION

It is therefore an object of the present invention to provide a semiconductor memory device having a large storage capacity.

It is another object of the present invention to provide a semiconductor memory device ensuring high access speed.

It is further object of the present invention to provide a method of manufacturing, at a low manufacturing cost, a semiconductor memory device which ensures a large storage capacity and high access speed.

According to an aspect of the present invention, a semiconductor memory device comprises a word line, first and second bit line pairs, a dynamic memory cell and a static memory cell. The first and second bit line pairs are arranged crossing the word line. A dynamic memory cell is connected to the word line and a first bit line pair. A static memory cell is connected to the word line and a second bit line pair.

According to another aspect of the present invention, a semiconductor memory device comprises a plurality of word lines, a plurality of first bit line pairs, a plurality of first memory cells, a second bit line pair and a plurality of second memory cells. A plurality of word lines are arranged in a plurality of rows. A plurality of first bit line pairs are arranged in a plurality of columns. A plurality of first memory cells are arranged corresponding to any intersecting points between the word line and any one of the first bit line pair. Each first memory cell has a first access speed and is connected to the corresponding word line and the first bit line pair. The second bit line pair is arranged crossing the word line. A plurality of second memory cells are arranged corresponding to any intersecting points between the word line and any one of the second bit line pair. Each second memory cell has a second access speed which is higher than the first access speed and is connected to the corresponding word line and second bit line pair.

A method of operating such semiconductor memory device comprises steps for selecting one word line, latching the data read to the second bit line pair from the second memory cell connected to the selected word line, latching respectively the data read to the first bit line pair from a plurality of first memory cells connected to the selected word line, selecting only one data of the first memory cell being latched, transferring the selected data to the second bit line pair and also transferring the data of the second memory cell being latched to the first bit line pair.

According to the other aspect of the present invention, a semiconductor memory device comprises word lines, first and second bit line pairs, first to third access transistors, cell capacitor and first and second driver transistors. The first and second bit line pairs cross the word lines. The first access transistor is connected between any one of the first bit line pair and the first memory node and turns ON responsive to the potential of the word lines. The cell capacitor is connected to the first memory node. The second access transistor is connected between any one of the second bit line pair and the second memory node and turns ON responsive to the potential of the word lines. The third access transistor is connected between the other of the second bit line pair and the third memory node and turns ON responsive to the potential of the word lines. The first driver transistor is connected between the second memory node and the ground not to which the ground potential is applied and turns ON responsive to the potential of the third memory node. The second drive transistor is connected between the third memory node and the ground node and turns ON responsive to the potential of the second memory node.

A method of manufacturing such semiconductor memory device comprises steps for forming a first insulating film on a semiconductor substrate, forming, on the first insulating film, word lines to form gate electrodes of the first to third access transistors, a first gate wiring to form a gate electrode of the first driver transistor and a second gate wiring to form a gate electrode of the second driver transistor, forming, within the semiconductor substrate, the source/drain regions of the first to third access transistors and first and second driver transistors and forming, on the semiconductor substrate, the first and second bit line pairs. Any one of the first bit line pair is connected to the one source/drain region of the second access transistor, while any one of the second bit line pair is connected to the one source/drain region of the third access transistor. This method further comprises a step for forming a cell capacitor connected to the other source/drain region of the first access transistor.

Therefore, in this semiconductor memory device, when the predetermined potential is supplied to the word lines, the data of static memory cell is first read to the second bit line pair and subsequently the data of dynamic memory cell is read to the first bit line pair. Therefore, since the data of static memory cell is outputted before the data of dynamic memory cell is outputted, high speed access operation is enabled.

In the method of operating this semiconductor memory device, data of the first and second memory cells are respectively latched, the data of the first memory cell latched is then transferred to the second memory cell, and the data of the second memory cell latched is then transferred to the first memory cell. Therefore, data can be transferred between the first and second memory cells without destruction.

In the method of manufacturing this semiconductor memory device, a dynamic memory cell is formed and simultaneously a static memory cell can also be formed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a timing chart illustrating the read operation by the semiconductor memory device shown in FIG. 1 and FIG. 2;

FIG. 32 is a timing chart illustrating operation of the counter shown in FIG. 31;

DESCRIPTION OF THE PREFERRED EMBODIMENTS

Figure 1:
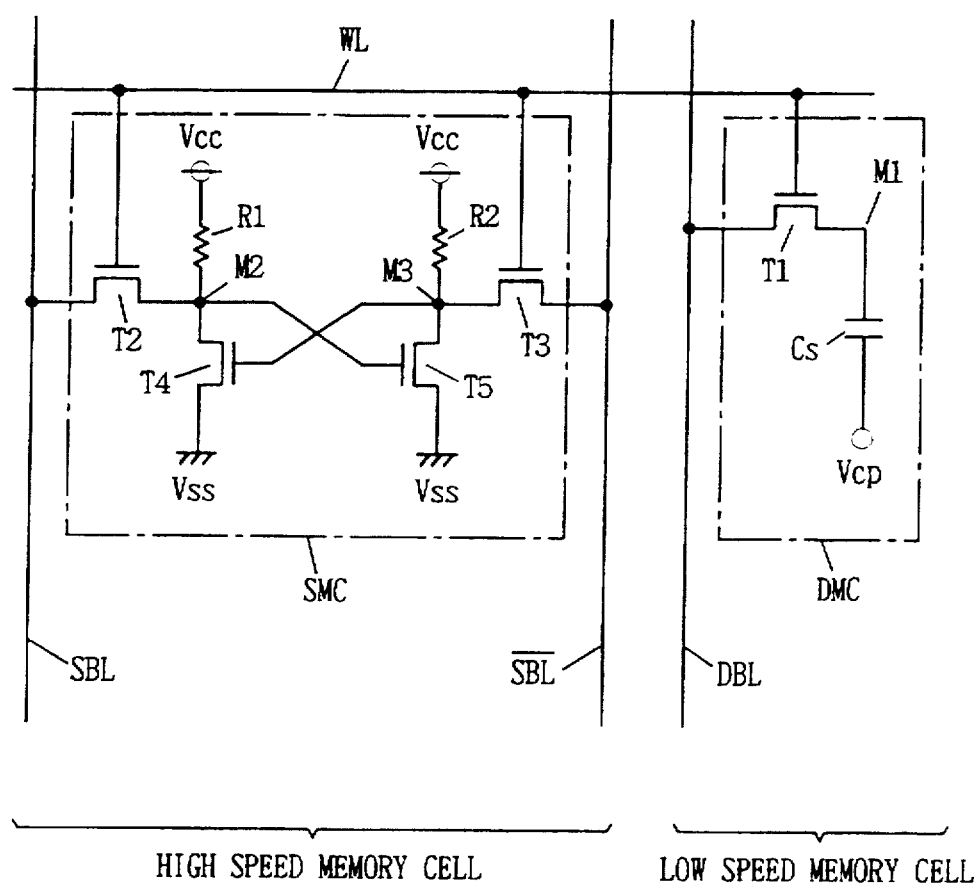
FIG. 1 is a circuit diagram illustrating the essential portion of a semiconductor memory device depending on an embodiment 1 of the present invention.

The preferred embodiments of the present invention will then be explained in detail with reference to the accompanying drawings. The like reference numerals designate the same or similar elements throughout the drawings.

|Embodiment 1|

Figure 2:
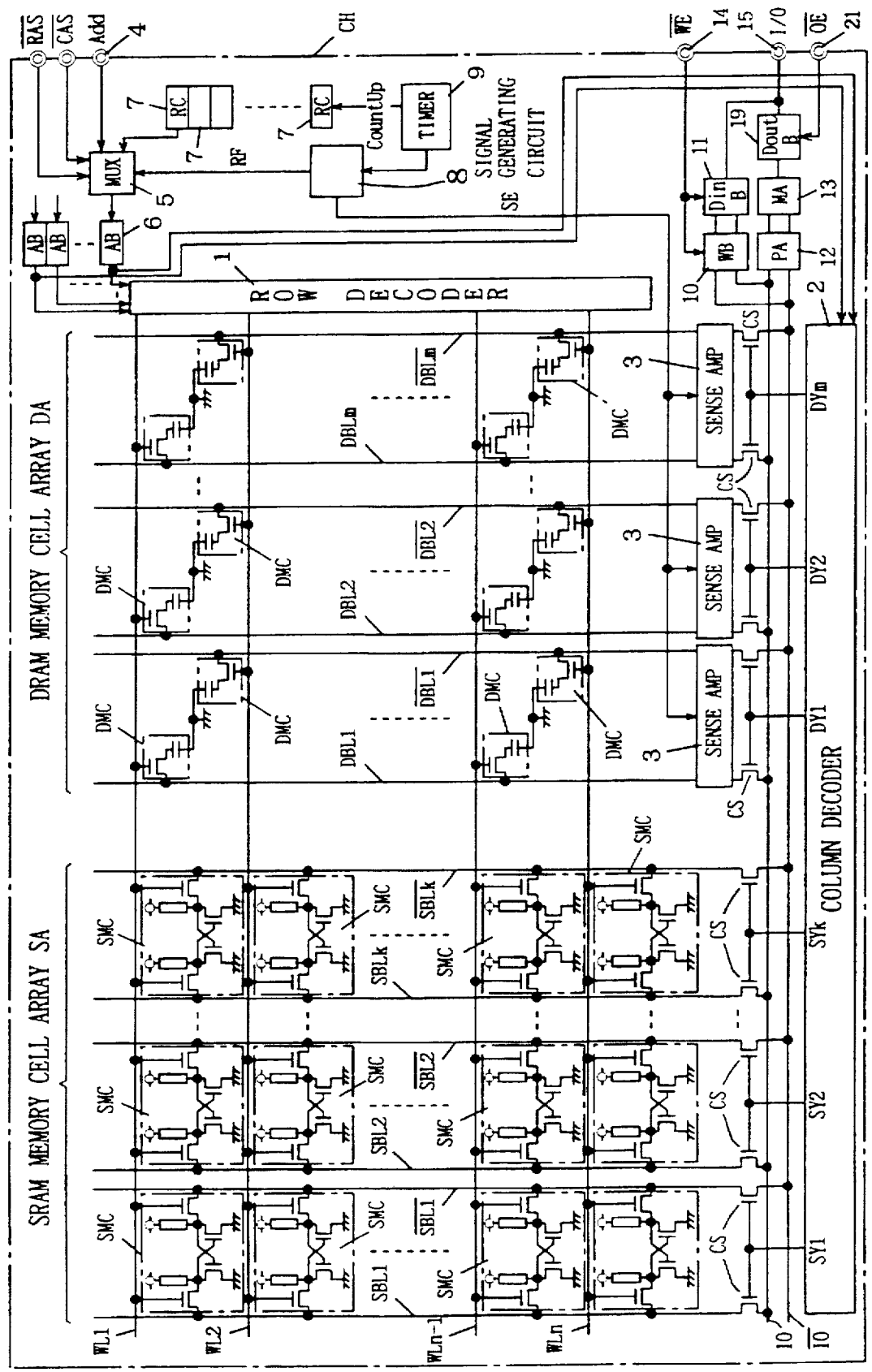
FIG. 2 is a block diagram illustrating a total structure of the semiconductor memory device shown in FIG.

FIG. 2 is a block diagram illustrating a total structure of a semiconductor memory device depending on an embodiment 1 of the present invention. With reference to FIG. 2, the semiconductor memory device comprises n word lines WL1–WLn arranged in the n rows, (k+m) pairs of bit lines SBL1, /SBL1–SBLk, /SBLk and DBL1, /DBL1–DBLm, /DBLm arranged crossing the word lines WL1–WLn, a row decoder 1 for selecting one word line among WL1–WLn and a column decoder 2 for selecting a pair of the bit lines from the bit lines SBL1, /SBL1–SBLk, /SBLk and DBL1, /DBL1–DBLm, /DBLm.

This semiconductor memory device comprises an SRAM memory cell array SA and a DRAM memory cell array DA. In the SRAM memory cell array SA, the k pairs of SRAM bit lines SBL1, /SBL1–SBLk, /SBLk are arranged in the k columns. Moreover, in the SRAM memory cell array SA, the (n×k) SRAM memory cells SMCs are arranged in the form of a matrix. That is, the (n×k) SRAM memory cells SMCs are provided corresponding to all intersecting points of the n word lines and k pairs of bit lines.

In the DRAM memory cell array DA, the m pairs of DRAM bit lines DBL1, /DBL1–DBLm, /DBLm are arranged in the m columns. Moreover, in the DRAM memory cell array DA, the (n×m) DRAM memory cells DMCs are arranged in the form of a matrix. The memory cells DMCs are respectively provided corresponding to the intersecting points of the word lines of odd numbers WL1, WL3, . . . , WLn–1 and bit lines DBL1–DBLm and the intersecting points of the word lines of even numbers WL2, WL4, . . . , WLn and bit lines /DBL1–/DBLm.

Moreover, in the DRAM memory cell array DA, the m sense amplifiers are provided corresponding to m pairs of bit lines. Moreover, the 2×(k+m) column selection gates CSs are provided corresponding to 2×(k+m) bit lines SBL1–SBLk, /SBL1–/SBLk, DBL1–DBLm, /DBL1–/DBLm.

This semiconductor memory device further comprises a pair of data input/output lines IO and /IO. Each column selection gate CS is connected between the corresponding one SBL1–SBLk, DBL1–DBLm and the data input/output line IO or between the corresponding one bit line /SBL1–/SBLk, /DBL1–/DBLm and data input/output line /IO.

This semiconductor memory device further comprises an address terminal 4 for receiving an external address signal Add, a multiplex circuit (MUX) 5 for selecting any one of the external address signal Add and an internal address signal and an address buffer (AB) 6 for amplifying the address signal selected by the multiplex circuit 5 to supply the amplified the address signal to the row decoder 1. The multiplex circuit 5 supplies the external address signal Add given responsive to the row address strobe signal /RAS to the address buffer 6 as the row address signal and supplies the external address signal Add given responsive to the column address strobe signal /CAS to the address buffer 6 as the column address signal. In FIG. 2, only one address terminal 4 is indicated but a plurality of address terminals are actually provided. The multiplex circuit 5 is also indicated only as a single circuit but a plurality of multiplex circuits are actually provided corresponding to a plurality of address terminals. Moreover, a plurality of address buffers 6 are also actually provided corresponding to a plurality of multiplex circuits.

This semiconductor memory device also comprises refresh circuits for self-refresh operation. The refresh circuit is composed of a timer, a refresh counter (RC 7) for counting up the internal addresses responsive to the timer 9 and a signal generator 8 for generating a sense amplifier enable signal SE and a refresh request signal RF responsive to the timer 9.

This semiconductor memory device further comprises a write buffer circuit 10 and data input buffer circuit 11 which are activated responsive to a write enable signal/WE, a preamplifier circuit 12 and a main amplifier circuit 13 for amplifying data read from the memory cells SMC, DMC and a data output buffer circuit 19 which is activated responsive to an output enable signal/OE. The write enable signal/WE is transferred, via the write enable terminal 14, to the write buffer circuit 10 and the data input buffer circuit 11. The input/output data I/O is supplied, in the data read operation, to an external circuit through the data input/output lines IO, /IO, preamplifier 12, main amplifier 13 and data input/output terminal 15 and is also supplied, in the data write operation, to an internal circuits through the data input/output terminal 15, data input buffer circuit 11, write buffer circuit 10 and data input/output lines IO, /IO.

All elements such as word lines WL1–WLn, bit lines SBL1–SBLk, /SBL1–/SBLk, DBL1–SBLm, /DBL1–/DBLm, memory cells SMC, DMC are formed on a sheet of semiconductor chip CH.

FIG. 1 is a circuit diagram illustrating in detail one SRAM memory cell SMC and one DRAM memory cell DMC in the semiconductor memory device shown in FIG. 2. With reference to FIG. 1, the SRAM memory cell SMC is composed of a pair of resistances R1, R2 having high resistance values and four N channel MOS transistors T2–T5. The transistor T2 forms an access transistor which makes conductive or non-conductive the line between the bit lines SBL and memory node M2 responsive to the potential of the word lines WL. The transistor T3 forms an access transistor which makes conductive or non-conductive the line between the bit lines /SBL and memory node M3 responsive to the potential of the word lines WL. The resistance R1 pulls up the potential of the memory node M2 up to the power source voltage Vcc, while the resistance R2 pulls up the potential of the memory node M3 up to the power source voltage Vcc. The transistor T4 is connected between the memory node M2 and the ground node to which the ground potential Vss is applied to form a driver transistor. The transistor T5 is connected between the memory node M3 and ground node to form a driver transistor. Moreover, the potential of the memory node M2 is applied to a gate electrode of the driver transistor T5, while the potential of the memory node M3 is applied to a gate electrode of the driver transistor T4. Therefore, the resistances R1 and R2 and driver transistors T4 and T5 form a flip-flop circuit.

In case the data of H level is stored in the SRAM memory cell SMC, the driver transistor T5 is in the conductive condition because the potential of the memory node M2 is in the H level. Therefore, the potential of the memory node M3 is in the L level. Since the potential of the memory node M3 is in the L level, the driver transistor T4 is in the non-conductive state. Therefore, the potential of the memory node M2 is pulled up to the power source voltage Vcc, that is, to the H level by the resistance R1.

Meanwhile, when a data of L level is stored in the memory cell SMC, since the potential of the memory node M2 is in the L level, the driver transistor T5 is in the non-conductive state. Therefore, the potential of the memory node M3 is pulled up to the power source voltage Vcc, that is, the H level by the resistance R2. Since the potential of the memory node M3 is in the H level, the driver transistor T4 is in the conductive state. Accordingly, the memory node M2 is pulled down to the ground potential Vss, that is, the L level by the driver transistor T4.

When data is read from the memory cell SMC, the potential of the word lines WL turns to the H level, thereby setting the access transistors T2 and T3 to the conductive state. Therefore, the potential of the memory node M2 is transferred to the bit lines SBL via the access transistor T2 and the potential of the memory node M3 is transferred to the bit lines /SBL via the access transistor T3. When the data of H level is stored in the memory cell SMC, the potential of the bit lines SBL becomes H level, setting the potential of the bit lines /SBL to the L level. Meanwhile, when the data of L level is stored in the memory cell SMC, the bit lines SBL becomes L level, setting the bit lines /SBL to the H level.

When data is written into the memory cell SMC, the potential of the word lines WL becomes H level and thereby the access transistors T2 and T3 become conductive. Therefore, the potential of the bit lines SBL is transferred to the memory node M2 via the access transistor T2, while the potential of the bit lines /SBL to the memory node M3 via the access transistor T3. When the potential of the bit lines SBL is in the H level and the potential of the bit lines /SBL is in the L level, the potential of the memory node M2 becomes H level and the potential of the memory node M3 becomes L level. When the potential of the bit lines SBL is in the L level and the potential of the bit lines /SBL is in the H level, the potential of the memory node M2 becomes L level and the potential of the memory node M3 becomes H level.

Referring to FIG. 1, a DRAM memory cell DMC is composed of one N channel MOS transistor T1 and one cell capacitor Cs. The transistor T1 forms an access transistor which makes conductive or non-conductive the line between the bit lines DBL and memory node M1 responsive to the potential of the word lines WL. One electrode of the cell capacitor Cs is connected to the memory node M1, while the other electrode is given a constant cell plate potential Vcp. In this embodiment 1, the other electrode is given the ground potential Vss as the cell plate potential Vcp but may be given the potential, for example, of Vcc/2.

When the data of H level is stored in the memory cell DMC, the potential of the memory node M1 is in the H level and charges are accumulated in the cell capacitor Cs. Meanwhile, when the data of L level is stored in this memory cell DMC, the potential of the memory node M1 is in the L level and charges are not accumulated in the cell capacitor Cs.

When data is read from the memory cell DMC, the bit lines DBL are precharged to the predetermined potential. When the potential of the word lines WL turns to the H level, the access transistor T1 becomes conductive. Thereby, charges of the capacitor Cs move to the bit lines DBL via the access transistor T1 and thereby the potential of the bit lines DBL changes a little from the precharged potential. When the H level is accumulated in the memory cell DMC, the potential of the bit lines DBL becomes higher than the precharged potential. When the data of L level is stored in the memory cell DMC, the potential of the bit line DBL becomes lower than the precharged potential. This voltage difference is amplified by the sense amplifier 3 shown in FIG. 2.

Moreover, when data is written into the memory cell DMC, the potential of the word lines WL becomes H level and thereby the access transistor T1 becomes conductive. Therefore, the potential of the bit lines DBL is transferred to the memory node M1 via the access transistor T1. When the potential of the bit lines DBL is H level, charges are accumulated in the cell capacitor Cs and when the potential of the bit lines DBL is L level, charges are not accumulated in the cell capacitor Cs.

As explained above, since the data is latched by the flip-flop circuit in the SRAM memory cell SMC, the refresh operation is unnecessary, but since data is stored in the capacitor Cs in the DRAM memory cell DMC, the refresh operation is necessary. However, since the SRAM memory cell SMC is composed of six elements, it occupies a large area but since the DRAM memory cell DMC is composed of two elements, it occupies a smaller area. In general, the occupation area of the SRAM memory cell SMC is 2 to 4 times that of the DRAM memory cell DMC.

Moreover, the complementary data are read to the bit lines SBL and /SBL in the SRAM memory cell SMC, while the potential of one bit line DBL changes a little in the DRAM memory cell DMC. Therefore, since a voltage difference must be amplified with the sense amplifier 3 in the DRAM memory cell DMC, the access rate of the SRAM memory cell SMC becomes higher than that of the DRAM memory cell DMC.

In the emebodiment 1, the word lines for driving the SRAM memory cell SMC and the word lines for driving the DRAM memory cell DMC are used in common. This is the most distinctive feature of the present invention.

FIG. 3 is a timing chart indicating the read operation of the semiconductor memory device of the present invention. FIG. 3(a) shows the waveforms of the decode signals SY1, SY2, SY3, SY4, . . . for selecting the SRAM bit lines SBL1, /SBL1, SBL2, /SBL2, . . . FIG. 3(b) shows the waveform of the potential of the word lines. FIG. 3(c) shows the waveform of an output data from the SRAM memory cell SMC. FIG. 3(d) shows the output waveform of the sense amplifier 3. FIG. 3(e) shows the waveform of output data of the DRAM memory cell DMC. FIG. 3(f) shows the decode signals DY1, DY2, . . . for selecting the DRAM bit lines DBL1, /DBL1, DBL2, /DBL2, . . . .

In FIG. 3, t1 is the time until output of the SRAM memory cell data from rise of the word line potential, t2 is the time until output of the SRAM memory cell data from rise of the decode signal SY1. t3 is the time until stabilization of the output of the sense amplifier for DRAM memory cell from rise of the decode signal SY1. t4 is the time until output of the DRAM memory cell data from rise of the decode signal DY1.

(1) Read operation in the page mode

Next, the read operation in the page mode of the semiconductor memory device will be explained with reference to FIG. 2 and FIG. 3.

The external address signal Add applied to the address terminal 4 is then impressed to the row decoder 1 responsive to the row address strobe signal /RAS through the multiplex circuit 5 and address buffer 6. Moreover, the external address signal Add is impressed to the column decoder 2 responsive to the column address strobe signal /CAS through the multiplex circuit 5 and address buffer 6.

The row decoder 1 selects one word line from n word lines WL1–WLn responsive to the given address signal and boosts the potential of the selected word line to the level higher than the power source voltage. The column decoder 2 selects a pair of bit lines among the (k+m) pairs of bit lines responsive to the impressed address signal and boosts the gate voltage of the column selection gate CS connected to the selected bit line to the H level.

For instance, when the potential of the word line WL1 rises, the access transistors T2, T3 of all SRAM memory cells SMCs connected to the word line WL1 turn ON and the access transistors T1 of all DRAM memory cells DMCs connected to the word line WL1 also turn ON. Thereby, the potentials of the memory nodes M2, M3 in the memory cells SMC are respectively transferred to the corresponding bit lines. Moreover, charges of the cell capacitor Cs in the memory cell DMC are read out to the corresponding bit lines.

For instance, when the H level data is stored in the memory cell SMC connected to the word line WL1 and bit lines SBL1, /SBL1, the bit line SBL1 becomes H level and the bit line /SBL1 becomes L level. As explained above, since the complementary data are outputted from the memory cell SMC and the memory node M2 is pulled down by the driver transistor T5, the potential of the bit line SBL1 quickly becomes H level and the potential of the bit line /SBL1 quickly becomes L level.

Moreover, when the data of H level is stored in the memory cell DMC connected to the word line WL1 and bit line DBL1, the potential of the bit line DBL1 rises a little from the precharge voltage (for example, Vcc/2). The potential of the bit line /DBL1 forming a pair with the bit line DBL1 does not change from the precharge voltage. Therefore, voltage difference is generated between the potentials of bit lines DBL1 and /DBL1.

In the page mode, the decode signals SY1–SYk, DY1–DYm rise sequentially from the decode signal SY1. In this semiconductor memory device, after the potential of the word lines rises, the decode signal SY1 also rises immediately. Since the decode signal SY1 of H level is applied to the gate electrodes of the corresponding column selection gates CS, these column selection gates CS become conductive. Accordingly, the potential of the bit lines SBL1 is transferred to the data input/output IO through the column selection gates CS and is then supplied to the preamplifier circuit 12. Moreover, the potential of the bit line/SBL1 is also transferred to the data input/output line/IO through the column selection gates CS and is then supplied to the preamplifier circuit 12. The potential of the bit lines SBL1, /SBL1 becomes H or L level immediately after the potential of the word line rises. Therefore, data stored in the memory cell SMC is accurately transferred to the preamplifier circuit 12. The data supplied to the preamplifier circuit 12 is amplified by the preamplifier circuit 12 and the main amplifier circuit 13 and is then outputted as the data D1 from the SRAM memory cell through the data output buffer circuit 19 and data input/output terminal 15.

Subsequently, when the decode signal SY2 becomes H level, the data D2 of the corresponding memory cell SMC is outputted. Similarly, when the decode signal SY3 becomes H level, the data D3 of the corresponding memory cell SMC is outputted and when the decode signal SY4 becomes H level, the data D4 of the corresponding memory cell SMC is outputted.

On the other hand, all sense amplifiers 3 in the DRAM memory cell array DA are activated immediately after the potential of the word line rises. Each sense amplifier 3 amplifies a voltage difference generated in the corresponding bit line pair and outputs the complementary signals as shown in FIG. 3(d). For instance, when the data of H level is stored in the memory cell DMC arranged at the intersecting point of the word line WL1 and bit line DBL1, the potential of the bit line DBL1 is turned to the H level by the sense amplifier 3, while the potential of the bit line /DBL1 is turned to the L level by the sense amplifier 3.

Therefore, the data corresponding to all memory cells DMCs connected to the word line WL1 is latched by the sense amplifier 3. Since the data latch operation by this sense amplifier 3 requires a very longer time, it is carried out while data D1-D4 are outputted from the SRAM memory cell SMC. In FIG. 3, all sense amplifiers 3 latch the data from the DRAM memory cell DMC until the timing where the fourth data D4 is outputted from the SRAM memory cell SMC.

Subsequently, when the decode system DY1 becomes H level, the data latched by the corresponding sense amplifier 3 is transferred to the data input/output lines IO, /IO through the column selection gate CS and is further applied to the preamplifier circuit 12. The applied data is amplified by the preamplifier 12 and main amplifier 13 and is further outputted as the output data D5 through the data output buffer circuit 19 and data input/output terminal 15. When the decode signal DY2 thereafter becomes H level, the data D6 latched by the corresponding sense amplifier 3 is outputted.

When the semiconductor memory device is designed based on the 0.6 μm rule, the time t1 is generally 8 ns, t2 is 4 ns, t3 is 30 ns and t4 is 4 ns. Here, t2 becomes almost equal to t4. It is because the data read out is transferred through the same signal path after the preamplifier circuit 12.

As explained above, the time t3 required until the data is latched by the sense amplifier 3 from the time when the data is read from the DRAM memory cell DMC is rather longer but data is sequentially read from the SRAM memory cell SMC during this period t3. Since the data from the DRAM memory cell DMC is latched by the sense amplifier 3 while the data is read from the SRAM memory cell SMC, the data is sequentially outputted from the DRAM memory cell DMC immediately after the data is read from the SRAM memory cell SMC.

As described above, after the potential of the word line rises, the data of the DRAM memory cell DMC are latched at a time by the sense amplifiers 3. Therefore, the data D6 of the memory cell DMC of the second column among m memory cells DMCs connected to one word line is read almost in the same period as the data of the SRAM memory cell.

(2) Write operation in the page mode

Figure 4:
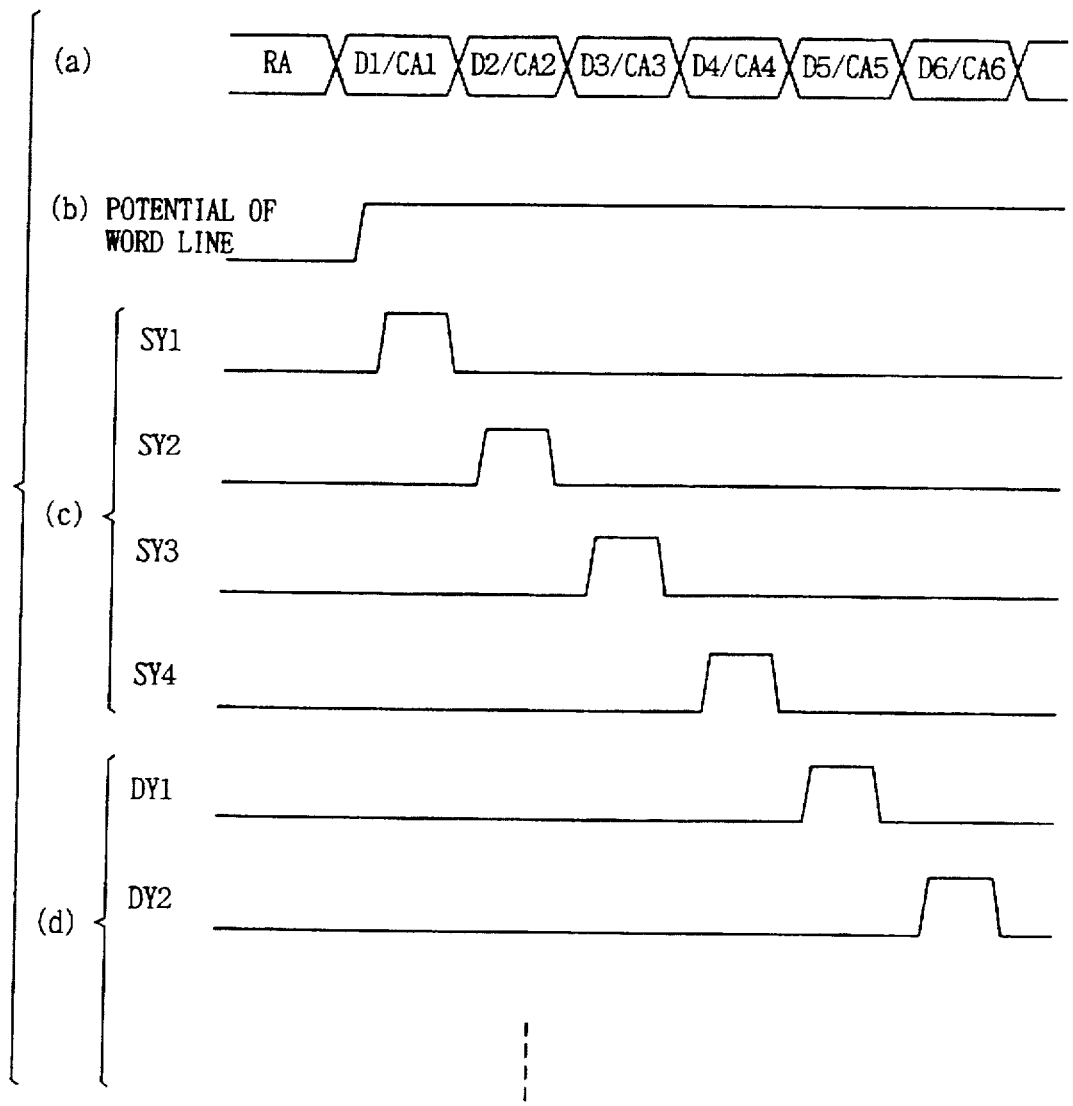
FIG. 4 is a timing chart illustrating the write operation by the semiconductor memory device shown in FIG. 1 and FIG. 2.

FIG. 4 is a timing chart indicating the write operation of this semiconductor memory device. This timing chart indicates the write operation in the page mode. With reference to FIG. 4, the write operation will be explained.

As indicated in FIG. 4(a), the input data D1-D6 are sequentially applied to the data input/output terminal 15. Moreover, as indicated in FIG. 4(a), the address signals RA, CA1-CA6 are sequentially applied to the address terminal 4.

The row decoder 1 selects one word line from n word lines WL1-WLn responsive to the applied row address signal RA. The potential of the selected word lines rises to H level as indicated in FIG. 4(b).

In continuation, the row decoder 2 selects the bit lines SBL1, /SBL1 responsive to the applied column address signal CA1. Therefore, the decode signal SY1 rises to the H level as indicated by FIG. 4(c). Similar to this decode signal SY1, the decode signals SY2-SY4 sequentially rise responsive to the column address signals CA2-CA4.

When the decode signal SY1 of the H level is applied to the gate electrode of the column selection gate CS, the input data D1 applied to the data input/output terminal 15 is amplified by the data input buffer circuit 11 and write buffer circuit 10 and is then written, through the data input/output lines IO, /IO and column selection gate CS, into the memory cell SMC connected to the word line of which potential rises. Similar to this input data D1, the input data D2-D4 are also written into the memory cell SMC.

After the decode signal SY4 falls, that is, after sufficient time has passed from rise of the potential of the word line, the decode signal DY1 becomes H level responsive to the applied column address signal CA5. Thereafter, the decode signal DY2 becomes H level responsive to the applied column address signal CA6. As described above, the decode signals DY1-DYm sequentially become H level and thereby the applied input data is sequentially written into the corresponding DRAM memory cells DMCs.

(3) Extended nibble mode

In the extended nibble mode, when the row address strobe signal /RAS falls, one row address signal is fetched. The row decoder 1 selects one word line among the word lines WL1-WLn responsive to this row address signal. For example, when the word line WL1 is selected, data is read to all bit line pars SBL1, /SBL1-SBLk, /SBLk and DBL1, /DBL1-DBLm, /DBLm from all memory cells SMC, DMC connected to the word line WL1. Sequentially, when the column address strobe signal /CAS falls, one column address signal is fetched. The column decoder 2 selects a pair of SRAM bit lines from the SRAM bit line pairs SBL1, /SBL1-SBLk, /SBLk responsive to this column address signal. For instance, when the bit line pair SBL1, /SBL1 is selected, the data of such bit line pair SBL1, /SBL1 are read to the external circuits.

Thereafter, a plurality of column address signals following the fetched column address signal are continuously generated in the column decoder 2.

Therefore, although column address signals are not fetched from the external circuits, the bit line pairs SBL2, /SBL2-SBLk, /SBLk and DBL1, /DBL1-DBLm, /DBLm are sequentially selected responsive to internally generated column address signals.

In the extended nibble mode described above, data is first read from the SRAM memory cell SMC and then data is sequentially read from the memory cells SMC, DMC which use the word lines in common with such memory cell SMC. Therefore, data can be read continuously at the speed higher than that of the existing DRAM.

In the embodiment 1, the SRAM memory cells SMCs are provided in the k columns, but it is preferable to provide such SRAM memory cells SMCs in the 4 columns or 8 columns and it is enough to provide the SRAM memory cells SMCs at least in one column.

As described, according to the embodiment 1, many DRAM memory cells DMCs and several SRAM memory cells SMCs are connected to one word line and data of the SRAM memory cells SMCs is read during the period until the data of DRAM memory cell DMC is latched by the sense amplifier 3. Therefore, a row address strobe signal is given and thereby data is read immediately after the potential of the word line rises. Accordingly, this semiconductor memory device allows access of data in such a high speed as SRAM, inspire it is formed in greater part of DRAM.

Moreover, in different point of view, it is formed in greater part of DRAM while it allows access of data in such a high speed as SRAM, a semiconductor having a larger memory capacity can be manufactured easily.

In the embodiment 1, the DRAM memory cells DMCs are arranged with the interval one-half that of the SRAM memory cells SMCs. That is, one SRAM memory cell SMC is arranged between the adjacent two word lines in the SRAM memory cell array SA, while two DRAM memory cells DMCs are arranged between the adjacent two word lines in the DRAM memory cell array DA. Therefore, the DRAM memory cells DMCs can be arranged in more closely than the SRAM memory cells SMCs. As a result, memory capacity becomes higher than the memory device where all memories are formed of the SRAM memory cells. In general, since the area occupied by the SRAM memory cells SMCs becomes two to four times that of the DRAM memory cells DMCs, it can easily be realized to provide two DRAM memory cells DMCs for one SRAM memory cell SMC.

[Embodiment 2]

Figure 5:
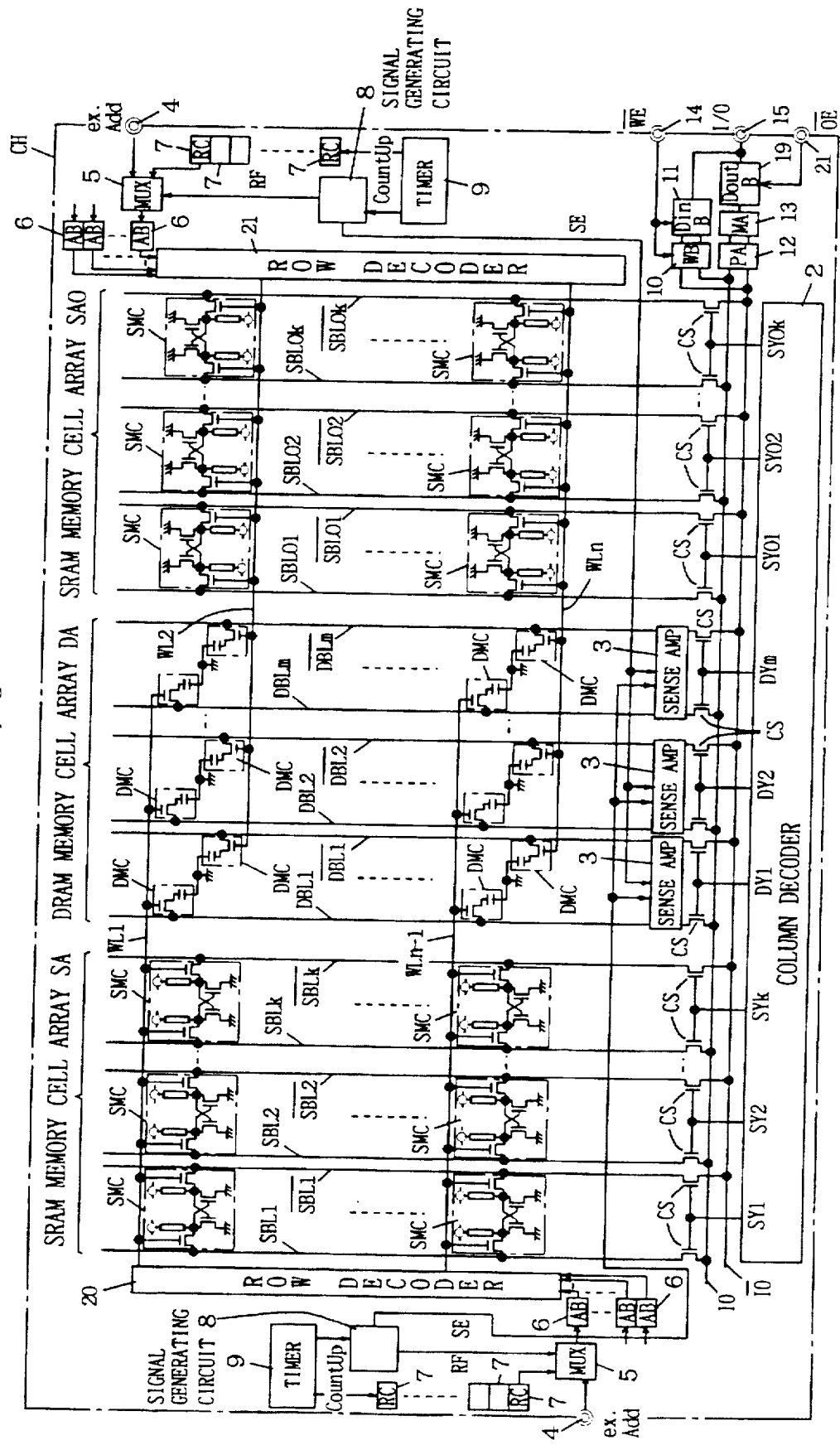
FIG. 5 is a block diagram illustrating a total structure of the semiconductor memory device depending on an embodiment 2 of the present invention.

FIG. 5 is a block diagram illustrating a total structure of the semiconductor memory device depending on an embodiment 2 of the present invention. With reference to FIG. 5, this semiconductor memory device comprises a DRAM memory array DA arranged at the center and the SRAM memory cell arrays SA and SA0 arranged at both sides thereof.

The SRAM memory cell array SA comprises (n/2) word lines WL1, WL3, . . . , WLn−1, k pairs of bit lines SBL1, /SBL1–SBLk, /SBLk and (2/2×k) SRAM memory cells SMCs.

The SRAM memory cell array SA0 comprises (n/2) word lines WL2, WL4, . . . , WLn, k pairs of bit lines SBL01, /SBL01–SBL0k, /SBL0k and (n/2×k) SRAM memory cells SMCs.

The DRAM memory cell array DA is same as the DRAM memory cell array DA shown in FIG. 2.

The word lines WL1, WL3, . . . .WLn−1 of the odd numbers are arranged over the SRAM memory cell array SA and DRAM memory cell array DA. Therefore, the word lines WL1, WL3, . . . , WLn−1 of the odd numbers are not extended up to the SRAM memory cell array SA0.

The word lines WL2, WL4, . . . , WLn of the even numbers are arranged over the SRAM memory cell array SA0 and DRAM memory cell array DA. Therefore the word lines WL2, WL4, . . . , WLn of the even numbers are not extended up to the SRAM memory cell array SA.

This semiconductor memory device further comprises row decoders 20 and 21 in both sides of the memory cell arrays SA, DA, SA0. The row decoder 20 selects any one word line of the word lines of odd numbers WL1, WL3, . . . , WLn−1. The row decoder 21 selects any one word line of the word lines of even numbers WL2, WL4, . . . , WLn.

This embodiment 2 comprises two row decoders 20, 21. Also one row decoder may be provided, for example, between the SRAM memory cell array SA and DRAM memory cell array DA or between the DRAM memory cell array DA and SRAM memory cell array SA0. In case one row decoder is provided, the layout area can be made smaller than that when two row decoders are provided.

This semiconductor memory device further comprises one column decoder 2 corresponding to the SRAM memory cell array SA, DRAM memory cell array DA and SRAM cell array SA0. The column decoder 2 selects one pair among the (2 k+m) pairs of bit lines. When the potential of the word lines of the odd numbers WL1, WL3, . . . , WLn−1 rises, the decode signals SY1, SY2, . . . , SYK, DY1, DY2, . . . , DYm become H level in this sequence. The potential of the word lines WL2, WL4, . . . , WLn of the even numbers rises, the decode signals SY0k, . . . , SY02, SY01, DYm, . . . , DY2, DY1 become H level in this sequence.

In the embodiment 2, the DRAM memory cells DMCs are arranged in the same pitch as the embodiment 1, but the SRAM memory cells SMCs are arranged in the pitch two times that of the embodiment 1. In general, the area occupied by the SRAM memory cell SMC is two to three times that of the DRAM memory cell DMC. Therefore, when the arrangement pitch of the SRAM memory cell SMC is wide like this embodiment 2, arrangement of the SRAM memory cell SMC becomes further easier.

[Embodiment 3]

Figure 6:
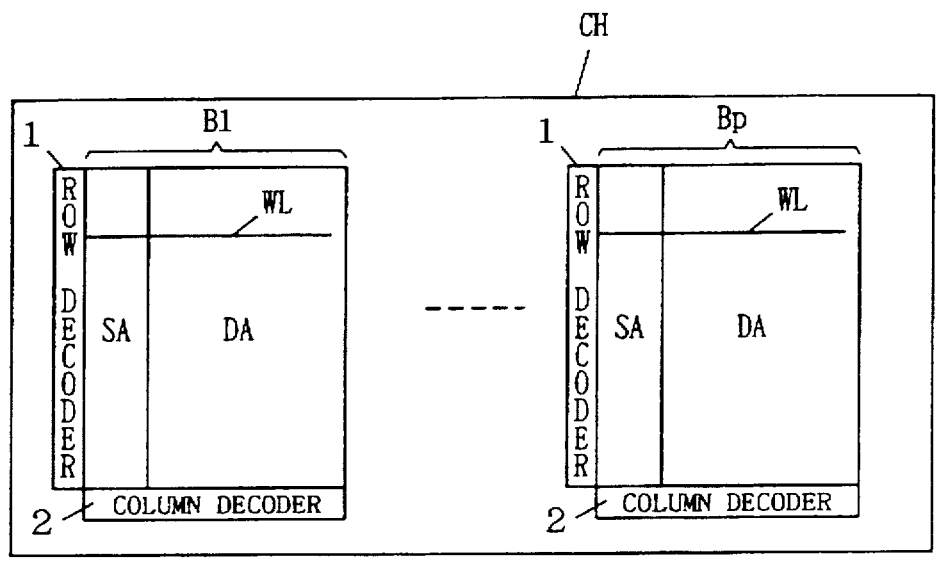
FIG. 6 is a layout illustrating a total structure of the semiconductor memory device depending on an embodiment 3 of the present invention.

FIG. 6 is a layout diagram illustrating a total structure of the semiconductor memory device depending on an embodiment 3 of the present invention. Referring to FIG. 6, this semiconductor memory device comprises p memory blocks B1–Bp which are formed on one semiconductor chip CH.

Each memory block is provided, as shown in FIG. 2, with the SRAM memory cell array SA and the DRAM memory cell array DA. That is, this semiconductor memory device is provided with p memory devices of the embodiment 1 shown in FIG. 2.

From another aspect of this embodiment 3, one word line is divided into p word lines. The divided one word line is connected with several SRAM memory cells and many DRAM memory cells.

Therefore, in this embodiment 3, access can be started from the SRAM memory cell array SA of the memory block B1 and access can also be started from the SRAM memory cell array SA of the other memory block. Accordingly, access can be made from the many addresses than that in the embodiment 1.

[Embodiment 4]

Figure 7:
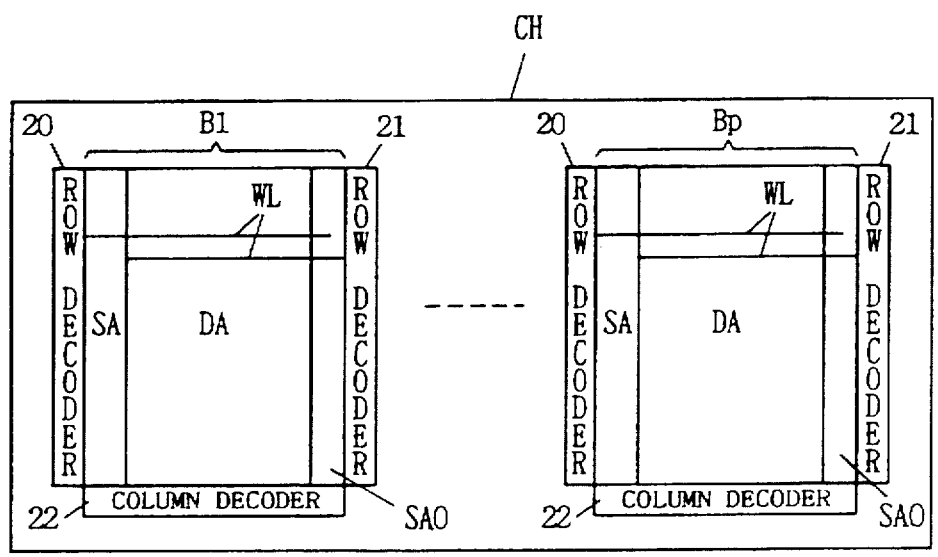
FIG. 7 is a layout illustrating a total structure of the semiconductor memory device depending on an embodiment 4 of the present invention.

FIG. 7 is a layout diagram illustrating a total structure of the semiconductor memory device depending on an embodiment 4 of the present invention. Referring to FIG. 7, this semiconductor memory device is provided with p memory blocks B1–Bp, which are formed on one semiconductor chip CH.

Each memory block is provided with one DRAM memory cell array DA and two SRAM memory cell arrays SA, SA0 arranged in both sides thereof as shown in FIG. 5. Namely, this semiconductor memory device is provided with p memory devices of the structure shown in FIG. 5.

In this embodiment 4, as in the case of the embodiment 3, access can be started not only from the SRAM memory cell arrays SA, SA0 of the memory block B1 but also from the SRAM memory cell array of the other memory blocks. Therefore, access can be made from more addresses than that of the embodiment 2.

[Embodiment 5]

Figure 8:
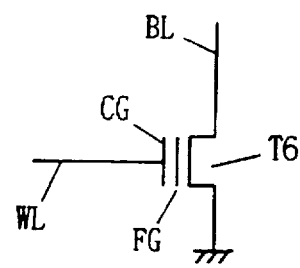
FIG. 8 is a circuit diagram illustrating a structure of a memory cell of the semiconductor memory device depending on an embodiment 5 of the present invention.

In above embodiments 1 to 5, only the combination of SRAM and DRAM has been explained, but the memory cell for EPROM shown in FIG. 8 may be used in place of the DRAM memory cell DMC. The transistor T6 forming the memory cell for EPROM is provided with a control gate CG and a floating gate FG. In such a stack gate type memory cell, the data of 1 bit can be stored by injecting charges to the floating gate FG. Moreover, the charges of the floating gate FG can be deleted by irradiation of ultraviolet ray. Thereby, data of this memory cell can be deleted. As the stack gate type memory cell, the memory cell for EEPROM and the memory cell for flash memory can be considered in addition to the memory cell for EPROM.

17

When the memory cell for EPROM of FIG. 8 is used in place of the DRAM memory cell DMC of FIG. 2 is used, one word line is selected, as in the case of the embodiment 1, responsive to the row address signal and data is read from all SRAM memory cells and memory cells for EPROM connected to the selected word line to the bit line pairs. Subsequently, the bit line pairs in the SRAM memory cell array can be selected sequentially and moreover the bit line pairs in the memory cell for EPROM array can be selected sequentially. Data is then read to the external circuits from the selected bit line pairs via the data input/output lines. Since the access rate of the SRAM memory cells is fast, data can be read from the SRAM memory cell immediately after the potential of the word line rises. In addition, since data is read from the memory cell for EPROM after the data is read from the SRAM memory cell, accurate data can be read from the EPRAM memory cell.

|Embodiment 6|

Figure 9:
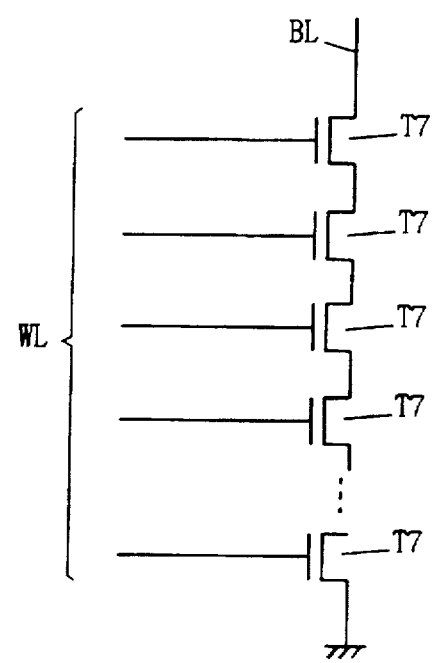
FIG. 9 is a circuit diagram illustrating a structure of a memory cell of the semiconductor memory device depending on an embodiment 6 of the present invention.

In the embodiment 5, the DRAM memory cell DMC is replaced with the memory cell for EPROM, but it may also be replaced with the memory cell for mask ROM as shown in FIG. 9. This memory cell for mask ROM is a NAND type memory cell for mask ROM and is provided with a plurality of N channel MOS transistors T7 connected in series. In this memory cell for mask ROM, data is written in the course of the manufacturing steps.

Here, the NAND type mask ROM is explained here, but a NOR type mask ROM may also be used. In the case of NOR type mask ROM, the row decoder explained in the embodiments 1 to 4 can be used but in the case of NAND type mask ROM, the logic of the word line drive signal outputted from the row decoder must be inverted. In the NAND type mask ROM, the word line is selected when the word line drive signal is L level and the word line is not selected when the word line drive signal is H level.

Figure 10:
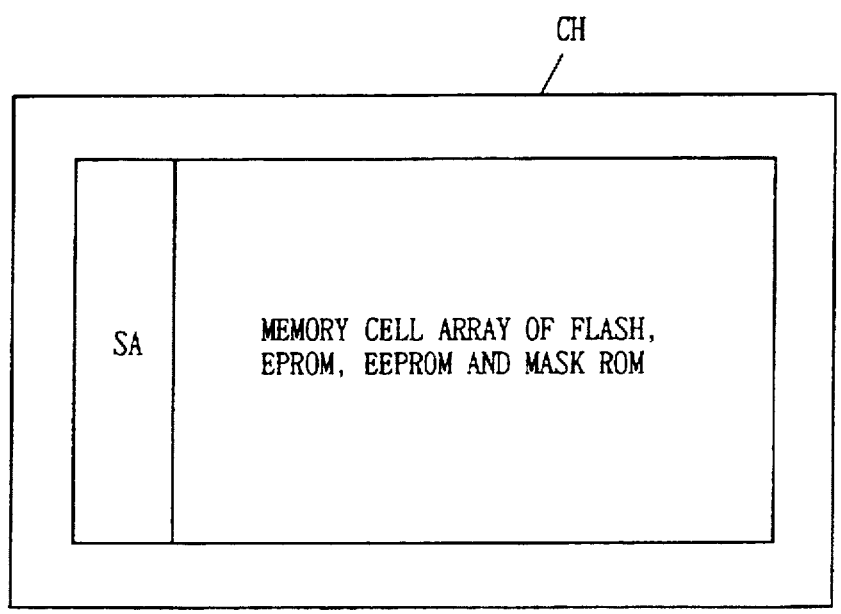
FIG. 10 is a layout of a total structure of the semiconductor memory device shown in FIG. 8 and FIG. 9.

FIG. 10 is a layout diagram illustrating a total structure of the semiconductor memory device utilizing an memory cell for EPROM or a memory cell for mask ROM in place of the DRAM memory cell. As shown in FIG. 10, when the memory cell for EPROM is used in place of the DRAM memory cell, a memory cell array including a plurality of memory cells for EPROM arranged in the form of a matrix may be arranged adjacent to the SRAM memory cell array SA. It can also be applied to the case where the flash memory, EPROM, memory cell for mask ROM is used in place of the memory cell for DRAM.

Even when the memory cell for mask ROM shown in FIG. 9 is used in place of the SRAM memory cell shown in FIG. 2, one word line is selected responsive to the row address signal as in the case of the embodiment 1. Data is read out to the bit line pair from all SRAM memory cells and memory cells for mask ROM connected to the selected word line. Continuously, the bit line pairs in the SRAM memory cell array are sequentially selected responsive to the column address signals and moreover the bit line pairs in the mask ROM memory cell array are also sequentially selected. Data of the selected bit line pairs is outputted to the external circuits through the data input/output lines. As explained above, since data is read from the SRAM memory cell ensuring higher access rate, the accurate data is read from the SRAM memory cell immediately after the potential of the word line rises. Moreover, after data is read from the SRAM memory cell, data is also read from the memory cell for mask ROM. Therefore, the accurate data is read from the memory cell for mask ROM.

18

|Embodiment 7|

Figure 11:
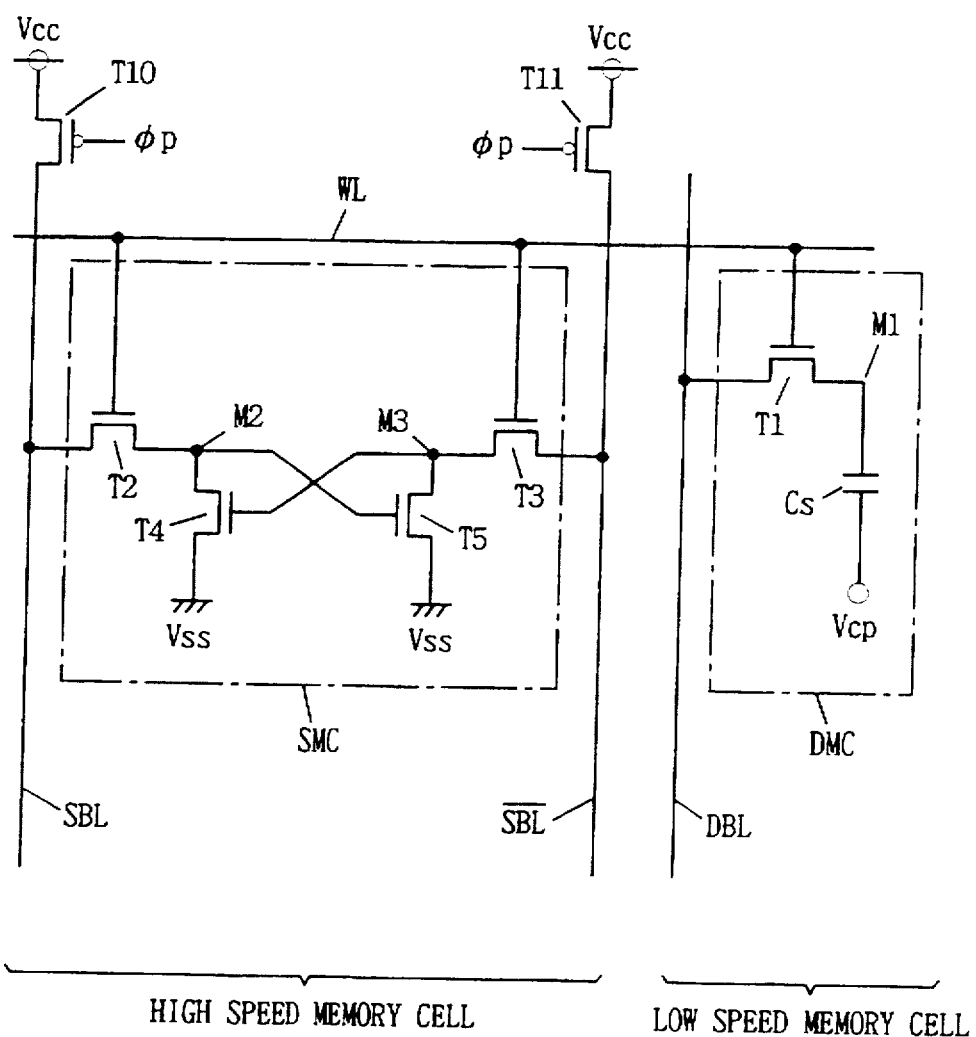
FIG. 11 is a circuit diagram illustrating a structure of a memory cell in the semiconductor memory device depending on an embodiment 17 of the present invention.

FIG. 11 is a circuit diagram illustrating a structure of two kinds of memory cells used in the semiconductor memory device depending on an embodiment 7 of the present invention. With reference to FIG. 11, unlike the SRAM memory cell shown in FIG. 1, this SRAM memory cell SMC does not include resistances R1 and R2. The SRAM bit lines SBL and /SBL are respectively connected to the power supply node through the P channel MOS transistors T10 and T11 as the loads. A control signal $\phi p$ applied to both gate electrodes of the transistors T10 and T11. Therefore, data is stored in the parasitic capacitance of the memory nodes M2 and M3 in such SRAM memory cell SMC.

The write operation to be performed when, for example, the potential of the SRAM bit line SBL is H level and the potential of the SRAM bit line /SBL is L level will be explained below. When the potential of the word line WL becomes H level, both access transistors T2 and T3 become conductive. Thereby, the potential of the SRAM bit line SBL is transferred to the memory node M2, while the potential of the SRAM bit line /SBL is transferred to the memory node M3. The memory node M2 also has a gate capacitance of the driver transistor T5, in addition to the parasitic capacitance described above. The memory node M3 also has a gate capacitance of the driver transistor T4, in addition to the parasitic capacitance described above. Therefore, capacitance of the memory node M2 is charged and thereby the potential of the memory node M2 becomes H level. On the other hand, the capacitance of the memory node M3 is discharged and thereby the potential of the memory node M3 becomes L level. As explained above, the SRAM memory cell SMC, if it does not have a load resistance, can store the data of one bit as in the case of the memory cell SMC shown in FIG. 1.

Next, the read operation of such memory cell SMC will then be explained. When the potential of the word line WL becomes H level, the access transistors T2 and T3 become conductive. Thereby, the potential of the memory node M2 is transferred to the SRAM bit line SBL, while the potential of the memory node M3 is transferred to the SRAM bit line /SBL.

Since data is stored in the capacitance in such memory cell SMC, such data is destroyed as the time passes as in the case of the DRAM memory cell DMC. Therefore, this SRAM memory cell SMC requires the refresh operation.

Figure 12:
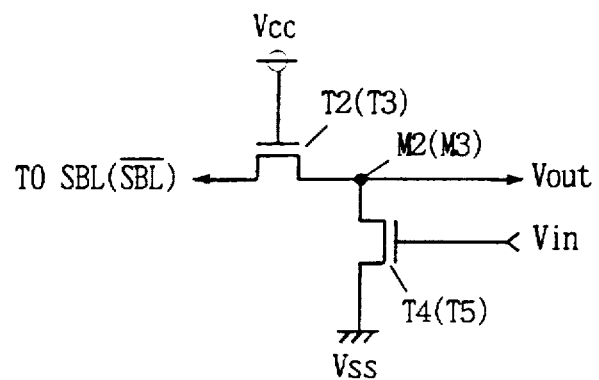
FIG. 12 is a circuit diagram for explaining the operation principle of the SRAM memory cell shown in FIG. 11.

Next, the refresh operation of this SRAM memory cell SMC will be explained. FIG. 12 is a circuit diagram illustrating only the access transistor T2 and driver transistor T4 in the SRAM memory cell SMC shown in FIG. 11. In FIG. 12, since the potential of the word line WL is H level, the power source voltage Vcc is applied to the gate electrode of the access transistor T2. Therefore, the access transistor T2 and driver transistor T4 form an enhancement load type inverter. In this inverter, an input potential Vin is inputted to the gate electrode of the driver transistor T4, while an output potential Vout is outputted from the memory node M2.

Meanwhile, the access transistor T3 and driver transistor T5 also form an enhancement load type inverter. Since these inverters are cross-coupled, an output potential Vout of one inverter is supplied as an input potential Vin of the other inverter and an output potential Vout of the other inverter is supplied as an input potential Vin of one inverter.

Figure 13:
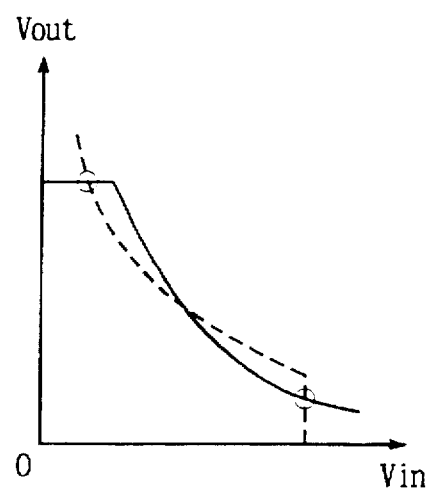
FIG. 13 is a graph indicating relationship between an input potential and an output potential shown in FIG. 12.

FIG. 13 is a graph indicating relationship between input voltages Vin and output voltages Vout of two inverters. In FIG. 13, a solid line indicates the characteristic of the inverter consisting of the transistors T2 and T4, while a dotted line indicates the characteristic of the inverter consisting of the transistors T3 and T5.

As is obvious from FIG. 13, this SRAM memory cell SMC has two stable points indicated by a circle of FIG. 13. Therefore, when the potential of the word line WL becomes H level, the potential of the one memory node M2 or M3 becomes H level, while the potential of the other memory node M3 or M2 becomes L level. This SRAM memory cell SMC may be refreshed when the potential of the word line WL becomes H level, even if the sense amplifier is not activated.

According to this embodiment 7, the manufacturing process can be simplified because the SRAM memory cell SMC does not have a load resistance. In general, when it is not required to form a load resistance, about 10 sheets of masks can be saved. Such memory cell SMC having no load must be refreshed, but since almost all DRAM memory cells DMCs intrinsically require the refresh operation, it is easy to also refresh such memory cells SMCs having no load. As explained, it is not always required to employ the SRAM memory cells having the static data storing characteristic for the high speed memory cells.

[Embodiment 8]

Figure 14:
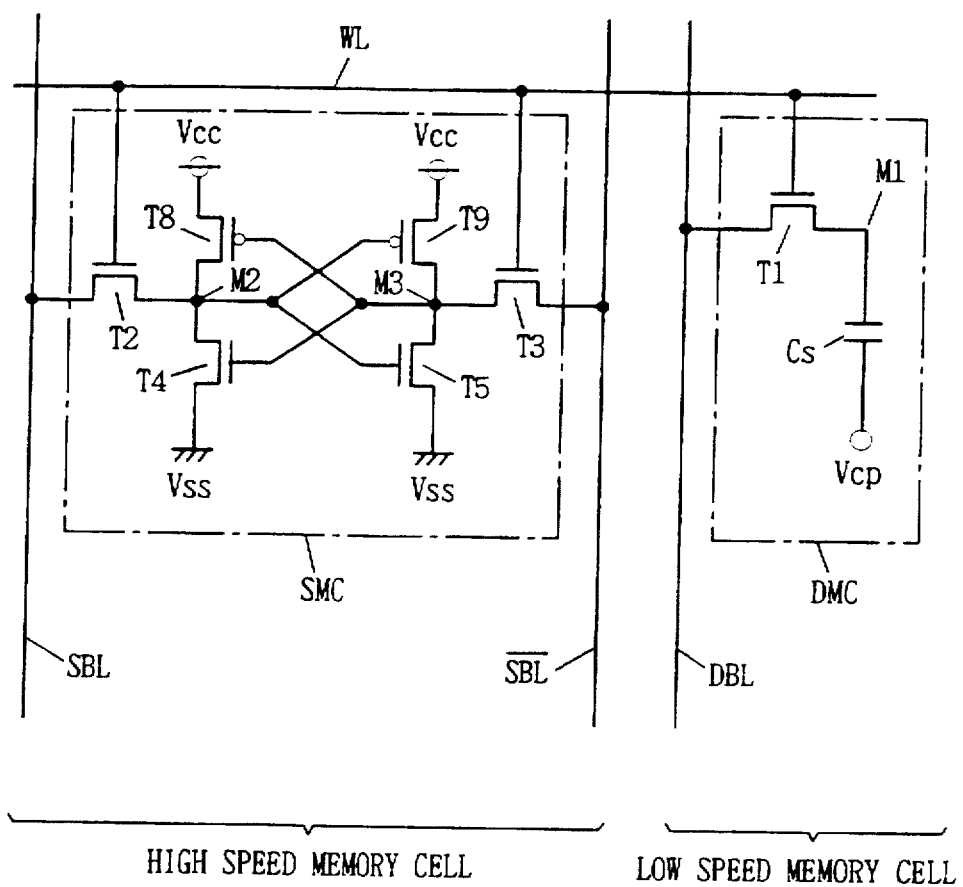
FIG. 14 is a circuit diagram illustrating a structure of a memory cell in the semiconductor memory device depending on an embodiment 8 of the present invention.

FIG. 14 is a circuit diagram illustrating structures of two kinds of memory cells in the semiconductor memory cell depending on an embodiment 8 of the present invention. As shown in FIG. 14, a full CMOS SRAM memory cell may be used as the high speed memory cell. This SRAM memory cell SMC comprises a P channel MOS transistor T8 as a load resistance of the driver transistor T4 and a P channel MOS transistor T9 as a load resistance of the driver transistor T5. This load transistor T8 is connected between the power source node and memory node M2 and becomes conductive responsive to the potential of the memory node M3. Moreover, the load transistor T9 is connected between the power source node and memory node M3 and becomes conductive responsive to the potential of the memory node M2. According to this full CMOS memory cell SMC, the cell area becomes large but data is quickly and reliably stored and power consumption is reduced.

[Embodiment 9]

Figure 15:
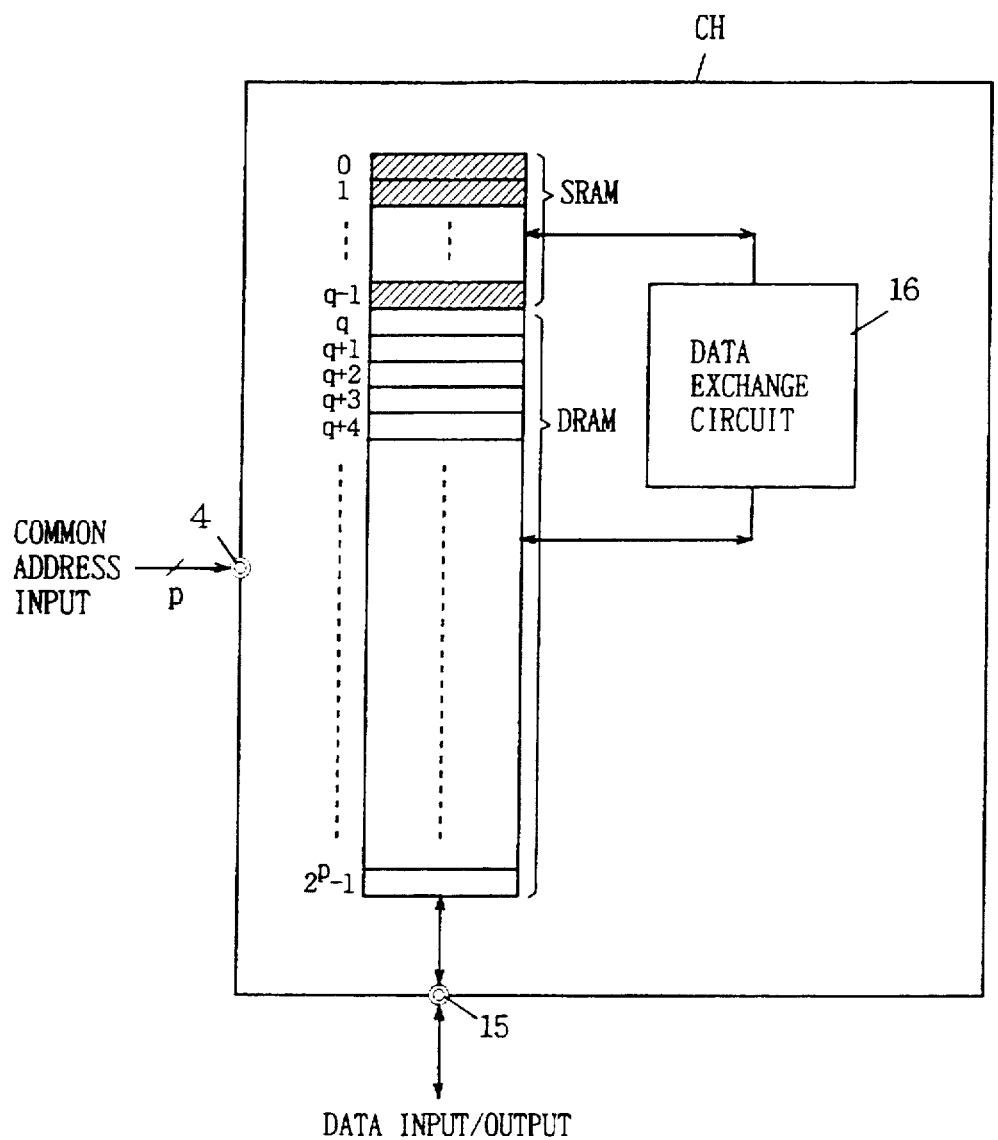
FIG. 15 is a block diagram illustrating a total structure of the semiconductor memory device depending on an embodiment 9 of the present invention.

FIG. 15 is a block diagram illustrating a total structure of the semiconductor memory device depending on an embodiment 9 of the present invention. Referring to FIG. 15, this semiconductor memory device further comprises a data exchange circuit 16. The data exchange circuit 16 mutually exchanges the data of SRAM circuit and the data of DRAM circuit.

This semiconductor memory device further comprises an address terminal 4 for receiving the p-bit address signal. Therefore, the SRAM and DRAM circuits form a memory space including the $2^P$ addresses. The SRAM circuit corresponds to the addresses from "0" to "q−1", while the DRAM circuit to the addresses from "q" to "$2^P$−1".

This semiconductor memory device further comprises a data input/output terminal 15. When one memory cell is specified responsive to the address signal supplied, data is outputted to the external circuit from the memory cell through the data input/output terminal 15 or data is written to the memory cell from the external circuit through the data input/output terminal 15.

In this embodiment, when the SRAM memory cell SMC is first accessed and subsequently the DRAM memory cell DMC is then accessed, total access rate becomes fast, but when the DRAM memory cell is first accessed, the access rate almost does not change from the existing one. The data exchange circuit 16 exchanges data when the data of low access frequency is stored in the SRAM memory cell array SA and the data of high access frequency is stored in the DRAM memory cell array DA.

When an access time of the SRAM memory cell SMC is defined as Tsram, an access time of the DRAM memory cell DMC as Tdram and an access rate of SRAM memory cell SMC for all memory cells as HIT, an average access time Tavg is expressed by the following formula.

$$Tavg = Tsram \times HIT + Tdram \times (1-HIT)$$

Therefore, when the access time of the SRAM memory cell SMC is 10 ns and the access time of the DRAM memory cell DMC is 70 ns, the average access time Tavg becomes 10 ns when the hit rate HIT is 1.0 or 16 ns when HIT is 0.9 or 22 ns when HIT is 0.8 or 28 ns when HIT is 0.7. In order to obtain a short average access time Tavg, the hit rate HIT must be approximated to 1 as closely as possible. A method called LRU (Least Recently Used) is an example of the method to approximate the hit rate HIT to 1. This method utilizes such a law in regard to a memory access pattern of computer that "the data which is once accessed has a higher probability for next access in near future". It becomes possible to approximate the hit rate HIT to 1 by storing the data which is once accessed in the SRAM memory cell SMC.

The data exchange circuit 16 performs data exchange between the SRAM memory cell SMC and the DRAM memory cell DMC conforming to the LRU system. Since the data of higher access frequency is stored in the SRAM memory cell SMC, the hit rate HIT becomes high. In this embodiment 9, since the data is exchanged between the SRAM memory cell SMC and the DRAM memory cell DMC, the desired data may not be stored in some cases in the accessed address. For example, when the data of address "q−1" is exchanged with the data of address "$2^P$−1", the addresses must be changed at the outside of the semiconductor memory device. Namely, when the access is made to the address "$2^P$−1", the address "q−1" must be accessed actually in place of such address.

Next, a method of transferring the data of DRAM memory cell DMC to SRAM memory cell SMC will be explained by referring to FIG. 2. If the data of higher access frequency is assumed to be stored in the DRAM memory cell DMC connected to the word line WL1 and the DRAM bit line DBL1, this data must be transferred to any SRAM memory cell SMC. Here, transfer of data to the SRAM memory cell SMC connected to the word line WL1 and bit line pair SBL1, /SBL1 will then be explained.

When the potential of the word line WL1 becomes H level, data is read to the bit line pair from all memory cells connected to the word line WL1. The data read to the bit line pair DBL1, /DBL1 is amplified and latched by the sense amplifier 3. Subsequently, when the decode signals SY1 and DY1 become H level, the corresponding column selection gate CS becomes conductive. Therefore, the data latched by the sense amplifier 3 is transferred to the SRAM bit line pair SBL1, /SBL1 through the data input/output line pair IO, /IO. The data of the SRAM bit line pair SBL1, /SBL1 is stored in the memory cell SMC connected to the word line WL1.

As explained, the data of DRAM memory cell array DMC can be transferred to the SRAM memory cell SMC through the data input/output line pair IO, /IO by making conductive a pair of column selection gates in the SRAM memory cell array SA and a pair of column selection gates in the DRAM memory cell array DA.

Figure 60:
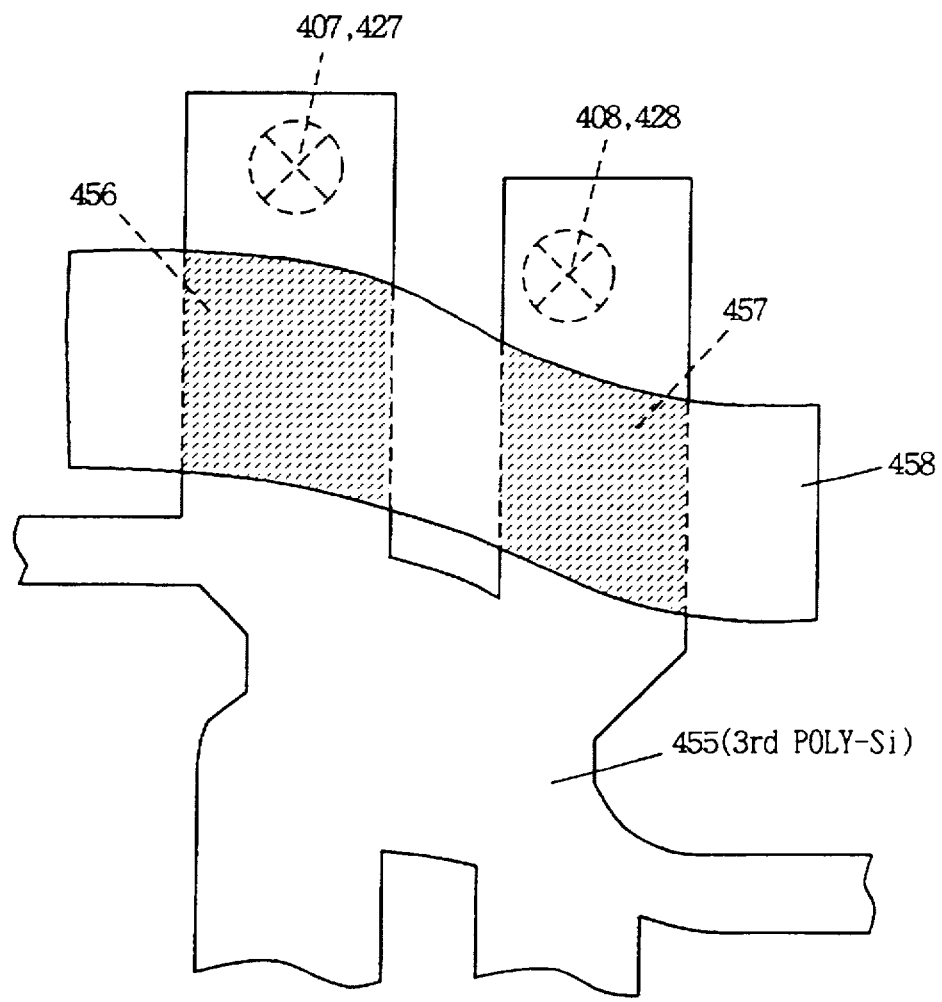
FIG. 60 is a plan view indicating the process step S71 of FIG. 59.

When such semiconductor memory device is used for a computer, the SRAM circuit and the DRAM circuit as a whole form the main memory, unlike the related art where the DRAM circuit forms the main memory and the SRAM does not form a cash memory like the conventional cash DRAM as shown in FIG. 60. Therefore, the storage capacity of DRAM circuit can be formed smaller than that of the conventional cash DRAM. Accordingly, a size of the semiconductor memory device can be reduced and moreover the manufacturing cost thereof can also be saved.

Moreover, since the data of high access frequency is almost stored in the SRAM memory cell array SA, this semiconductor memory device has the access rate which is substantially equal to that of SRAM. Therefore, it is now possible to make direct access to this semiconductor memory device from the CPU without particularly providing a cash memory.

|Embodiment 10|

Figure 16:
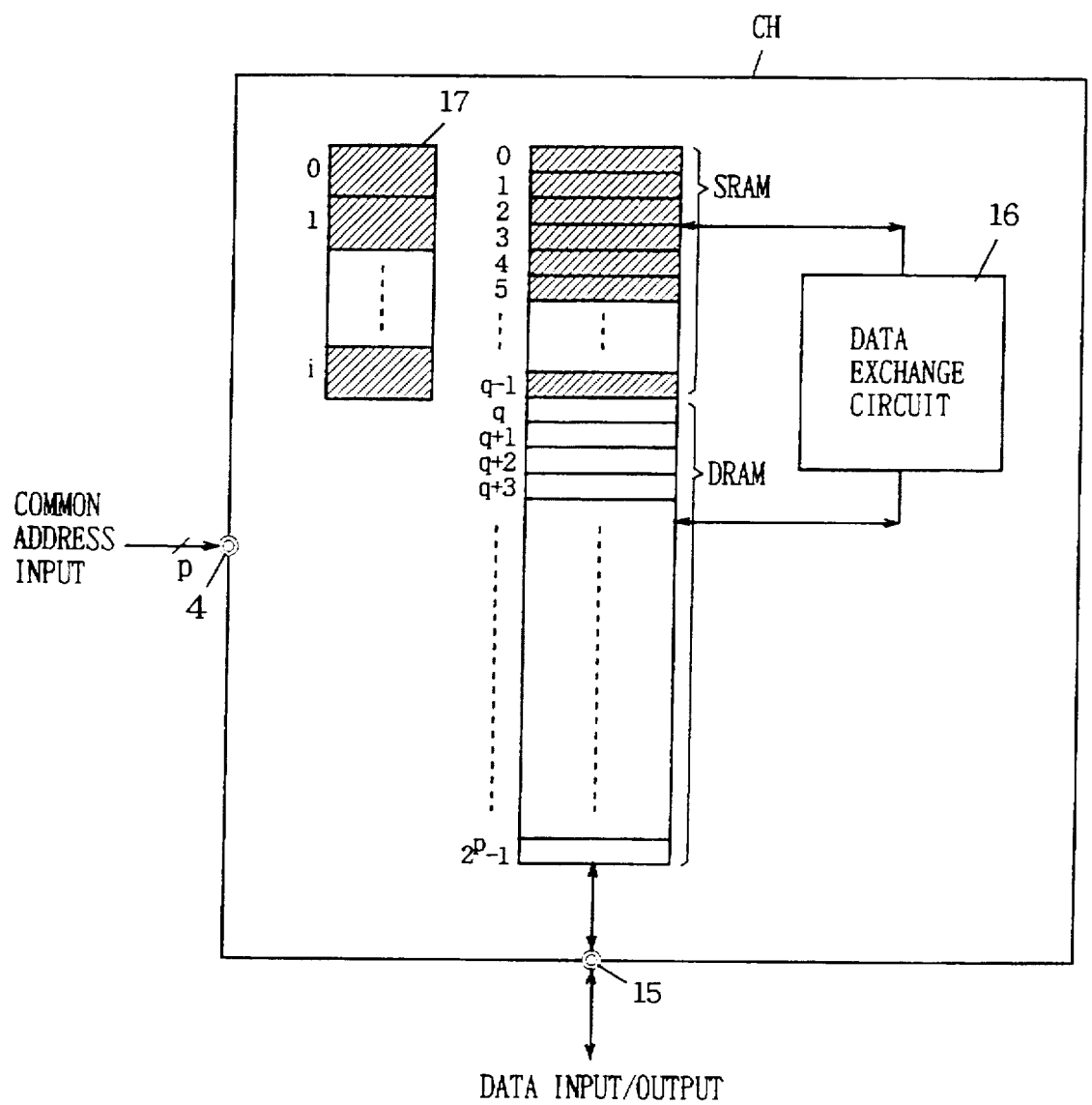
FIG. 16 is a block diagram illustrating a total structure of the semiconductor memory device depending on an embodiment 10 of the present invention.

FIG. 16 is a block diagram illustrating a total structure of the semiconductor memory device depending on an embodiment 10 of the present invention. By referring to FIG. 16, the semiconductor memory device further comprises a tag memory 17 in addition to the structure shown in FIG. 15.

Between the SRAM and DRAM circuits, the data of the predetermined format size can be exchanged. In FIG. 16, data is exchanged in every couple of addresses (for example, address 0 and address 1). Hereinafter, unit of the addresses to be exchanged is called an exchange block.

A tag memory 17 is provided with (i+1) tag blocks prepared corresponding to these exchange blocks. Each tag block stores the information indicating whether data of the SRAM memory cell in the corresponding exchange block is exchanged with the data of DRAM memory cell or not and the information indicating with which exchange block of the DRAM circuit the SRAM memory cell data is exchanged when data exchange has been performed. For example, when the data of addresses 0 and 1 are exchanged with the data of addresses q and q+1, the information indicating data exchange has been performed and the information indicating the address q are stored in the tag block 0.

Therefore, in this semiconductor memory device, when an address signal is supplied, a tag memory 17 is first retrieved. Thereby, it is judged whether the data to be accessed exists in the SRAM circuit or in the DRAM circuit. For instance, in above description, when the address signal indicating the address 0 is applied, it is found by the retrieval of the tag block 0 that the data in this address 0 is exchanged with the data in the address q. Therefore, the address q is accessed in place of the address 0.

As described above, according to the embodiment 10, since the tag memory 17 is provided, it is unnecessary to change the address in the external circuit unlike the embodiment 9 shown in FIG. 15 and any address signal may be applied in direct to the semiconductor memory device.

|Embodiment 11|

Figure 17:
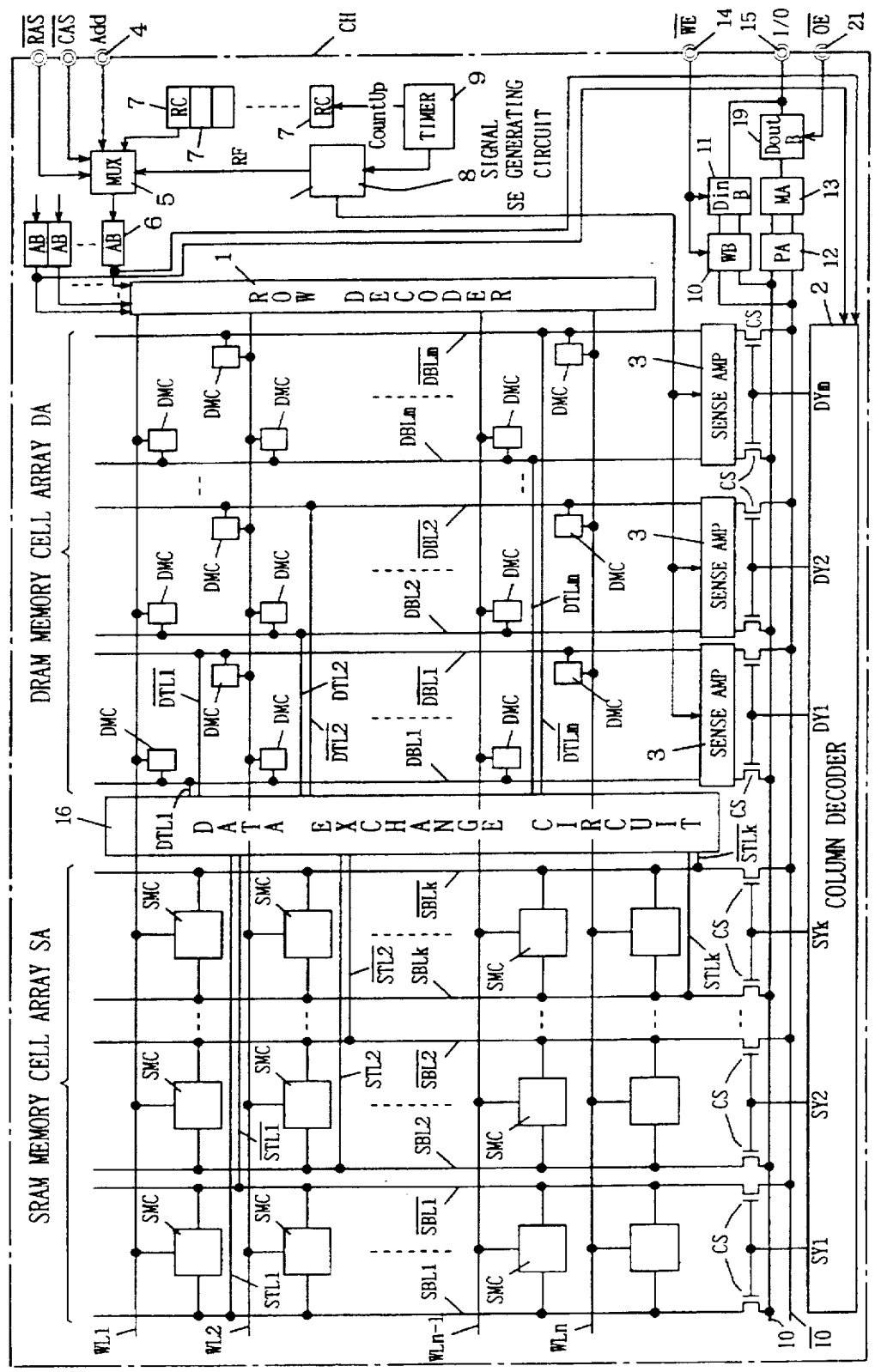
FIG. 17 is a block diagram illustrating a total structure of the semiconductor memory device depending on an embodiment 11 of the present invention.

FIG. 17 is a block diagram illustrating a total structure of the semiconductor memory device depending on an embodiment 11 of the present invention. With reference to FIG. 17, the semiconductor memory device further comprises, in addition to the structure shown in FIG. 2, a data exchange circuit 16, SRAM transfer line pairs STL1, /STL1–STLk, /STLk and DRAM transfer line pairs DTL1, /DTL1–DTLm, /DTLm.

The data exchange circuit 16 is arranged between the SRAM memory cell array SA and the DRAM memory cell array DA. All transfer line pairs STL1, /STL1–STLk, /STLk and DTL1, /DTL1–DTLm, /DTLm are connected to the data exchange circuit 16. The SRAM transfer line pair STL1, /STL1 is connected to the SRAM bit line pair SBL1, /SBL1, while SRAM transfer line pair STL1, /STL1 is connected to the SRAM bit line pair SBL1, /SBL1, and SRAM transfer line pair STLk, /STLk is connected to the SRAM bit line pair SBLk, /SBLk. Moreover, the DRAM transfer line pair DTL, /DTL1 is connected to the DRAM bit line pair DBL1, /DBL1, the DRAM transfer line pair DTL2, /DTL2 is connected to the DRAM bit line pair DBL2, /DBL2 and the DRAM transfer line pair DTLm, /DTLm is connected to the DRAM bit line pair DBLm, /DBLm. Such wiring structure is called the T type bit line structure and is disclosed in detail by the Japanese Patent Application Laid-Open No. 4-228188.

Figure 18:
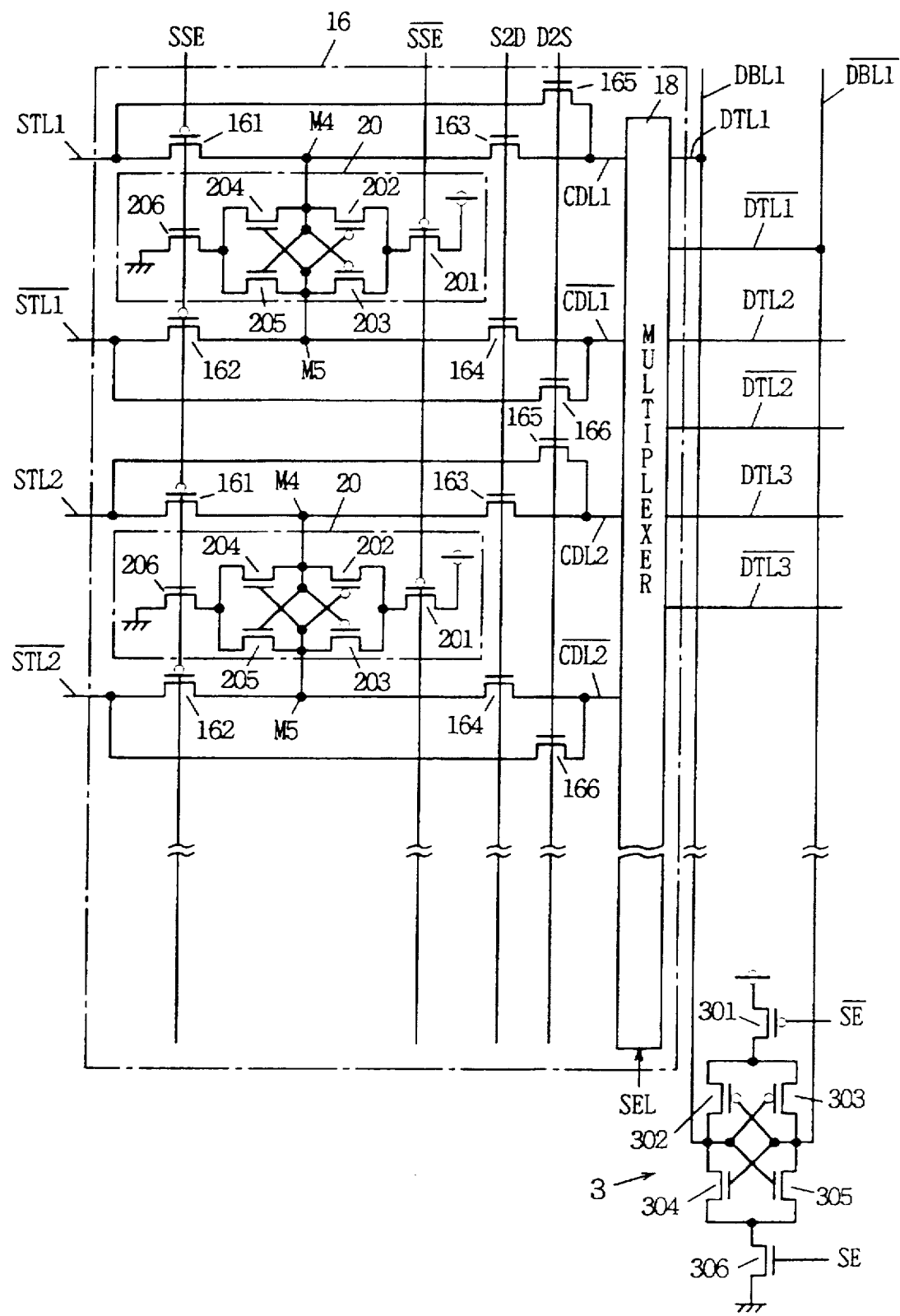
FIG. 18 is a circuit diagram illustrating a structure of a data exchange circuit shown in FIG. 17.

FIG. 18 is a circuit diagram illustrating a structure of the data exchange circuit 16 shown in FIG. 17. With reference to FIG. 18, the data exchange circuit 16 comprises a multiplexer 18 and k latch circuits 20. The latch circuits 20 are provided corresponding to the SRAM transfer line pairs STL1, /STL1–STLk, /STLk.

The multiplexer 18 connects the common data line pair CDL1, /CDL1 to any one pair of the DRAM transfer line pairs DTL1, /DTL1–DTLm, /DTLm responsive to a selection signal SEL. The multiplexer 18 also connects the common data line pair CDL2,/CDL2 to another pair of the DRAM transfer line pairs DTL1, /DTL1–DTLm, /DTLm. This connection rule is also adapted to the other common data line pairs.

The SRAM transfer line pair STL1, /STL1 is connected to the memory nodes M4 and M5 of the latch circuit 20 via the P channel MOS transistors 161 and 162 and moreover connected to the common data line pair CDL1, /CDL1 via the transistors 163 and 164. The SRAM transfer line pair STL1, /STL1 is also connected respectively to the common data line pair CDL1, /CDL1 via the N channel MOS transistors 165 and 166. This connection rule is also adapted to the other common SRAM transfer line pairs STL2, /STL2–STLk, /STLk.

The latch circuit 20 is a sense amplifier which amplifies and latches the data transferred from the SRAM memory cell SMC. Each latch circuit 20 comprises the P channel MOS transistors 201–203 and the N channel MOS transistors 204–206. The transistor 201 becomes conductive responsive to the sense amp enable signal ISSE to supply the power source potential to the source electrodes of the transistors 202 and 203. The transistor 206 becomes conductive responsive to the sense amp enable signal SSE to supply the ground potential to the source electrodes of the transistors 204 and 205. The transistors 202 and 203 are cross-coupled between the memory nodes M4 and M5, while the transistors 204 and 205 are cross-coupled between the memory nodes M4 and M5. The gate electrodes of the transistors 202 and 204 are connected to the memory node M5, while the gate electrodes of the transistors 203 and 205 are connected to the memory node M4.

The transistors 161 and 162 become conductive responsive to the sense amplifier enable signal SSE. The transistors become conductive complimentarily with the transistor 206. The transistors 163 and 164 become conductive responsive to the transfer signal S2D, while the transistors 165 and 166 also become conductive responsive to the transfer signal D2S.

The sense amplifiers 3 connected to each line of the DRAM bit line pair DBL1, /DBL1 are provided, like the latch circuit 20, with P channel MOS transistors 301–303 and N channel MOS transistors 304–306. The transistor 301 becomes conductive responsive to the sense amp enable signal /SE, while the transistor 306 becomes conductive responsive to the sense amp enable signal SE.

(1) Data transfer between SRAM memory cell and DRAM memory cell

An external row address signal is applied to an address terminal 4 and is then applied to the row decoder 1 via the address buffer 6. The row decoder 1 selects one word line from the word lines WL1–WLn responsive to its row address signal. Since the potential of the selected word line rises, the access transistors T1–T3 in the all memory cells SMC, DMC connected to such word line. Thereby, data of each memory cell is raed to the corresponding bit line pair. In this case, since the sense amp enable signal SSE is in the L level, the data, for example, of the SRAM bit line pair SBL1, /SBL1 is transferred to the memory nodes M4, M5 through the SRAM transfer line pair 6STL1, /STL1 and transistors 161, 162. The data of the other SRAM bit line pairs SBL2, /SBL2–SBLk, /SBLk are also transferred to the corresponding memory nodes M4, M5.

Thereafter, the sense amp enable signal SSE becomes H level and this H level sense amp enable signal SSE is applied to the transistor 206 and the L level sense amp enable signal /SSE is applied to the transistor 201. Thereby, the latch circuit 20 is activated to amplify and latch the data appearing on the memory nodes M4, M5. Since the H level sense amp enable signal SSE is also applied to the transistors 161 and 162, the memory nodes M4, M5 are electrically isolated from the corresponding SRAM transfer line pair.

Next, the L level sense amp enable signal /SE is applied to the transistor 301 of all sense amplifiers 3 and the H level sense amp enable signal SE is applied to the transistor 306. Thereby, all sense amplifiers 3 are activated to amplify and latch the data of all DRAM bit line pairs DBL1, /DBL1–DBLm, /DBLm. For example, when the H level data is stored in the DRAM memory cell DMC connected to the DRAM bit line DBL1, the potential of such DRAM bit line DBL1 rises to the H level and the potential of the opposed DRAM bit line /DBL1 falls to the L level.

Here, after the latch circuit 20 is activated, the sense amplifier 3 is activated, but since the latch circuit 20 and sense amplifier 30 operate independently with each other, the latch circuit 20 and sense amplifier 30 may be activated simultaneously or after the sense amplifier 3 is activated, the latch circuit 20 may be activated.

Next, the multiplexer 18 connects one pair of the DRAM transfer line pairs DTL1, /DTL1–DTLm, /DTLm to one common data line pair. For instance, in the case of exchanging data between the SRAM memory cell SMC connected to the SRAM bit line pair SBL1, /SBL1 and the DRAM memory cell DMC connected to the DRAM bit line DBL1, the DRAM transfer line pair DTL1, /DTL1 is connected to the common data line pair CDL1, /CDL1. Moreover, simultaneously when data is also exchanged between the SRAM memory cell SMC connected to the SRAM bit line pair SBL2, /SBL2 and the DRAM memory cell DMC connected to the DRAM bit line DBL2, the DRAM transfer line pair DTL2, /DTL2 is connected to the common data line pair CDL2, /CDL2.

Thereafter, when the transfer signal D2S becomes H level, the transistors 165 and 166 become conductive and the common data line pair CDL1, /CDL1 is connected to the SRAM transfer line pair STL1, /STL1. The other common data line pair is also connected to the SRAM transfer line pair. Accordingly, in above case, the DRAM bit line pair DBL1, /DBL1 is connected to the SRAM bit line pair SBL1, /SBL1. Since a potential difference of the DRAM bit line pair DBL1, /DBL1 is amplified up to full amplitude by the sense amplifier 3, a potential difference of the SRAM bit line pair SBL1, /SBL1 is also amplified up to full amplitude responding thereto. In this case, since the access transistors T2 and T3 in the SRAM memory cell SMC connected to the SRAM bit line pair SBL1, /SBL1 are in the conductive condition, the potentials of the SRAM bit lines SBL1, /SBL1 are respectively transferred to the memory nodes M2 and M3. Thereby, data transfer to the SRAM memory cell SMC from the DRAM memory cell DMC can be completed.

Next, after the transfer signal D2S becomes L level and the sense amplifier 3 is inactivated, the transfer signal S2D becomes H level. The transfer signal S2D of H level is applied to the transistors 163 and 164 and thereby the transistors 163 and 164 become conductive. Therefore, the DRAM bit line pair DBL1, /DBL1 is connected to the memory nodes M4, M5 through the DRAM transfer line pair DTL1, /DTL1, multiplexer 18, common data line pair CDL1, /CDL1 and transistors 163, 164. Therefore, the data of SRAM memory cell SMC latched by the latch circuit 20 is transferred to the DRAM bit line pair DBL1, /DBL1. In this case, since the access transistor T1 in the DRAM memory cell DMC connected to the DRAM bit line DBL1 is in the conductive state, the potential of the DRAM bit line DBL1 is transferred to the memory node M1 through the access transistor T1. Thereby, transfer of data to the DRAM memory cell DMC from the SRAM memory cell SMC is completed.

When the data in the latch circuit 20 is transferred to the DRAM bit line pair DBL1, /DBL1, the potential difference of the other DRAM bit line pairs to which data is not transferred must be amplified up to full amplitude. Therefore, when data is transferred only between the SRAM bit line pair SBL1, /SBL1 and DRAM bit line pair DBL1, /DBL1, only the sense amplifier 3 connected to the DRAM line pair DBL1, /DBL1 is inactivated and all sense amplifiers 3 connected to the other DRAM bit line pairs DBL2, /DBL2–DBLm, /DBLm are continuously activated. Moreover, all sense amplifiers 3 in the DRAM memory cell array DA may be simultaneously inactivated, but in this case, after the data of the SRAM memory cell SMC is selectively transferred to the DRAM memory cell DMC, all sense amplifiers 3 are activated again and thereby the potential difference of all DRAM bit line pairs DBL1, /DBL1–DBLm, /DBLm must be amplified up to full amplitude.

(2) Data transfer to DRAM memory cell from SRAM memory cell

First, one word line, for example, the word line WL1 is selected from the word lines WL1–WLn and thereby data is respectively read from all memory cells SMC, DMC connected to the selected word line WL1 to all bit line pairs SBL1, /SBL1–SBLk, /SBLk and DBL1, /DBL1–DBLm, /DBLm.

Next, for example, when data is transferred to the DRAM memory cell DMC connected to the DRAM bit line DBL1 from the SRAM memory cell SMC connected to the SRAM bit line pair SBL1, /SBL1, the data of the SRAM memory cell SMC is latched by the latch circuit 20.

Next, the DRAM transfer line pair DTL1, /DTL1 is connected to the common data line pair CDL1, /CDL1 by the multiplexer 18.

Here, the transfer signal S2D becomes H level and thereby the data in the latch circuit 20 is transferred to the DRAM bit line pair DBL1, /DBL1, completing the data transfer to the DRAM memory cell DMC from the SRAM memory cell SMC.

According to such a transfer method, the data in the DRAM memory cell DMC is destroyed but the control becomes more easier than that for data transfer between the SRAM memory cell and DRAM memory cell.

In this case, since the potential difference of the DRAM bit line pair DBL1, /DBL1 is amplified up to full amplitude by the latch circuit 20, it is not particularly necessary to activate the corresponding sense amplifier 3. However, when the word line WL1 is selected, the data is read to the other DRAM bit line pairs DBL2, /DBL2–DBLm, /DBLm. Therefore, the data in the corresponding DRAM memory cell DMC is destroyed. Accordingly, after the data is transferred to the DRAM bit line pair DBL1, /DBL1 from the latch circuit 20, all sense amplifiers 3 must be activated and thereby the potential difference of all DRAM bit line pairs DBL1, /DBL1–DBLm, /DBLm must be amplified up to the full amplitude. Therefore, it is also possible to activate all sense amplifiers 3 in the DRAM memory cell array DA after the data of SRAM memory cell SMC is latched by the latch circuit 20. That is, only the transfer step to the SRAM memory cell SMC from the DRAM memory cell DMC may be deleted from the transfer operations between the SRAM memory cell SMC and DRAM memory cell DMC.

(3) Data transfer to SRAM memory cell from DRAM memory cell

For example, when data is transferred to the SRAM memory cell SMC connected to the word line WL1 and the SRAM bit line pair SBL1, /SBL1 from the DRAM memory cell DMC connected to the word line WL1 and DRAM bit line DBL1, the word line WL1 is first selected and thereby data is then read to all bit line pairs SBL1, /SBL1–SBLk, /SBLk and DBL1, /DBL1–DBLm, /DBLm. Next, all sense amplifiers 3 in the DRAM memory cell array DA are activated to amplify and latch the data of the DRAM bit line pairs DBL1, /DBL1–DBLm, /DBLm. Next, the DRAM transfer line pair DTL1, /DTL1 is connected to the common data line pair CDL1, /CDL1 by the multiplexer 18.

Thereafter, when the transfer signal D2S becomes H level, the transistors 165 and 166 become conductive and thereby the data of DRAM memory cell DMC is transferred to the SRAM memory cell SMC. On the occasion of transferring data to the SRAM memory cell SMC from the DRAM memory cell DMC, the step for latching the data of SRAM memory cell SMC and the step for transferring such latched to the DRAM bit line pair DBL1, /DBL1 can be deleted from the transfer operations between the SRAM memory cell and DRAM memory cell explained above.

According to such data transfer operation, data of the SRAM memory cell SMC is destroyed but the control can be more simplified than that of the transfer operations between the SRAM memory cell and DRAM memory cell explained above.

According to the embodiment 11, since the data exchange circuit 16 is provided to exchange the data of SRAM memory cell with the data of DRAM memory cell, the data having higher access frequency can be stored in the SRAM memory cell and the data having lower access frequency can also be stored in the DRAM memory cell. Thereby, the data can always be read at a high speed.

|Embodiment 12|

The embodiment 11 is intended to transfer the data of higher access frequency to the SRAM circuit by exchanging the data of SRAM with the data of DRAM and thereby obtain a short average access time Tavg, while this embodiment 12 is intended to obtain a short average access time Tavg by utilizing a software.

Figure 61:
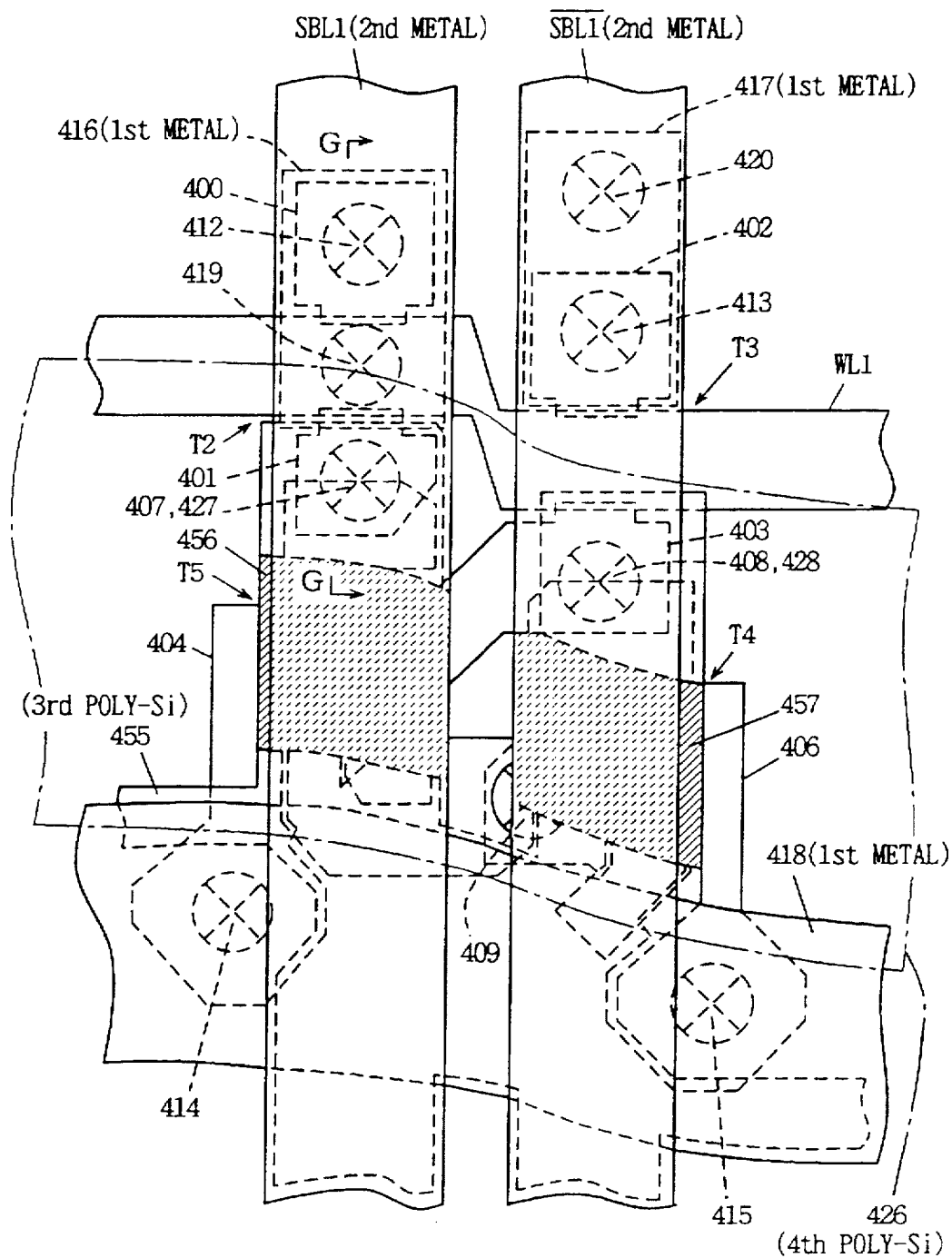
FIG. 61 is a plan view illustrating a structure of the memory cell in the semiconductor memory device depending on an embodiment 27 of the present invention.

A main memory of the conventional computer has a plurality of storage areas as shown in FIG. 61. Each storage area is assigned with one address. In general, these storage areas are all composed of DRAM.

Figure 19:
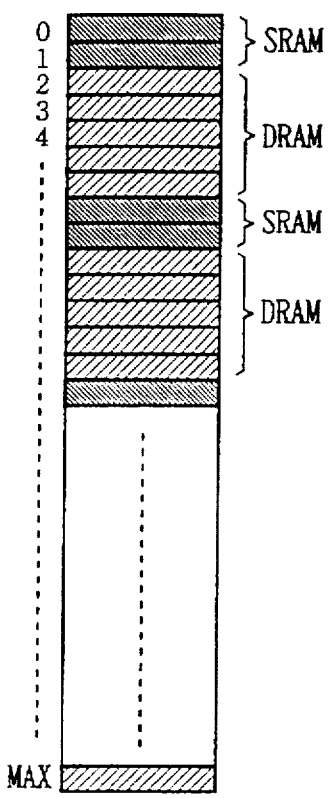
FIG. 19 is a diagram illustrating memory space of the semiconductor memory device depending on an embodiment 12 of the present invention.

FIG. 19 is a diagram illustrating a memory space of the semiconductor memory device depending on an embodiment 12 of the present invention. As shown in FIG. 19, the SRAM circuits and the DRAM circuits are alternately arranged on the memory space. For example, the addresses 0 and 1 are assigned in the SRAM circuit, while the addresses 2 to 6 are assigned in the DRAM circuit.

In general, when a certain program is executed on the computer, the program is first loaded on the main memory. Thereafter the program is then executed while data in the program is being accessed depending on the instructions of program on the main memory.

In this embodiment 12, the part having a higher access frequency in the program is loaded to the address of SRAM circuit. Therefore, the average access time Tavg is shortened and thereby the program execution time can also be reduced.

|Embodiment 13|

The embodiment 13 further embodies the embodiment 12. The table 1 indicates an example of the program written by the assembly language of the MIPS system.

TABLE 1

| L1 |       | ADD | R1, | R2,  | R3    |
|----|-------|-----|-----|------|-------|
| L2 |       | SUB | R4, | R5,  | R6    |
| L3 |       | BEQ | R1, | R4,  | LABEL |
| L4 |       | ADD | R1, | R7,  | R8    |
| .  |       | .   | .   | .    | .     |
| .  |       | .   | .   | .    | .     |
| L5 | LABEL | ADD | R9  | R10  | T11   |

Here, "ADD" of the line L1 indicates an instruction for addition. "SUB" of the line L2 indicates an instruction for subtraction. "BEQ" in the line L3 indicates a condition branching instruction for comparing the register R1 in the CPU with the register R4 and then branching, when these registers are equal, to the line L5 indicated as "LABEL".

In general, the instruction of each line is executed sequentially, except for the branching instruction. In the CPU provided with a cash memory, instructions in the main memory are copied to the cash memories for every block of a certain size and the instructions in the cash memory are sequentially executed. Therefore, in the case of the programs in the Table 1, when the line L1 is executed, the line L1 is also copied in the cash memory. A size of the block explained above corresponds generally to several or to several tens of instructions. Therefore, the probability for the lines L2 to L4 being copied to the cash memory is high. The line L5 which is a branching destination of the line L3 is separated from the line L1, the probability for the line L5 being copied to the cash memory is rather low. Therefore, when branching occurs in the line L3, probability for cash mistake is high. If cash mistake occurs, the main memory must be accessed in place of the cash memory. Therefore, in this embodiment 13, the line L5 is stored in the SRAM circuit of the main memory shown in FIG. 19.

According to the embodiment 13, since instructions as the branching destination of the branching instructions having higher access frequency and data are stored in the SRAM circuit, this semiconductor memory device may always be accessed at a high speed.

|Embodiment 14|

The embodiment 14 is another example for further embodying the embodiment 12. Array is a data format for the data processed by the computer. In this array, addresses are indicated by indices. The table 2 shows an example of array data in size of "100". On the main memory, data is arranged in the sequence of index thereof.

TABLE 2

| ARRAY |0| |
|---|
| ARRAY |1| |
| ARRAY |2| |
| . |
| . |
| ARRAY |99| |

As described in regard to the embodiment 13, when a cash memory is provided between CPU and main memory, CPU generally makes access to the cash memory. If cash mistake occurs, the data be accessed is transferred to the cash memory from the main memory. Such data transfer is carried out in every block of the predetermined size.

Therefore, in this embodiment 14, the leading array data ARRAY |0| is assigned to the SRAM circuit of the main memory. The subsequent array data ARRAY |1|–|99| are assigned to the DRAM circuit of the main memory. In general, the array data becomes to have higher access frequency in the index sequence, namely in the sequence of index 0, 1, . . . , 99. Therefore, since the data in the DRAM circuit is busted out after the data in the SRAM circuit is busted out frequently, the average access time Tavg can be shortened.

If a cash mistake occurs when one block corresponds, for example, to four array data, the cash memory has a higher probability of allowing the writing of the block of array data ARRAY |0|–|3|. Therefore, the block to be transferred to the cash memory from the main memory has a probability of being corresponding to the array data |4|–|7| having the next higher access frequency. In this case, the array data ARRAY |4| is assigned to the SRAM circuit of the main memory. If a cash mistake occurs during transfer of block other than the array data |0|–|3| to the cash memory, it shows a higher probability that the array data ARRAY |0|–|3| having the highest access frequency are transferred to the cash memory from the main memory. Therefore, in this case, the array data |0| is assigned to the SRAM circuit of the main memory.

|Embodiment 15|

During execution of the programs, a temporary data saving area is generally required in addition to the data area assigned to the main memory area before execution of the programs. For instance, when a so-called recursive call for citing a subroutine with itself is generated, the data of a plurality of sets belonging to such subroutine are necessary. Particularly, since depth of nesting of the recursive call can be determined freely, the data area of a plurality of sets corresponding to such data is necessary on the main memory. In general, such data area is called a stack.

Figure 20:
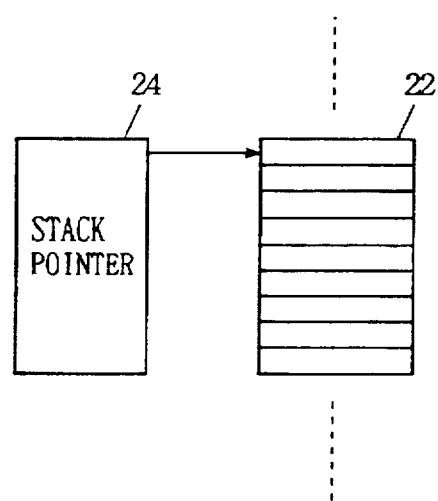
FIG. 20 is a diagram illustrating a part of memory space of the semiconductor memory device depending on an embodiment 15 of the present invention.

FIG. 20 shows a stack 22 and a stack pointer 24 for designating an address in the stack. As illustrated in FIG. 20, a part of the area of the main memory is assigned to the stack 22. An address register called the stack pointer 24 saves data to the corresponding area of the main memory. When data is saved in the stack 22, the stack pointer 24 is incremented to the next address of the saving address. Thereby, the stack pointer 24 indicates the address to which data is saved next. When such saved data is no longer necessary, the stack pointer 24 is decremented. Therefore, the stack 22 is expanded or compressed depending on the amount of data to be saved. In general, the data on the stack 22 having a small address difference has a higher probability for use within one subroutine. Therefore, such data has a high probability for continuous access. Moreover, the leading address in the stack 22 has the highest probability for access frequency.

Therefore, in the embodiment 15, the leading address in the stack 22 is assigned to the SRAM circuit. Accordingly, the frequency of initiation of access from the SRAM memory cell SMC becomes high and thereby the average access time Tavg can be shortened.

|Embodiment 16|

Figure 21:
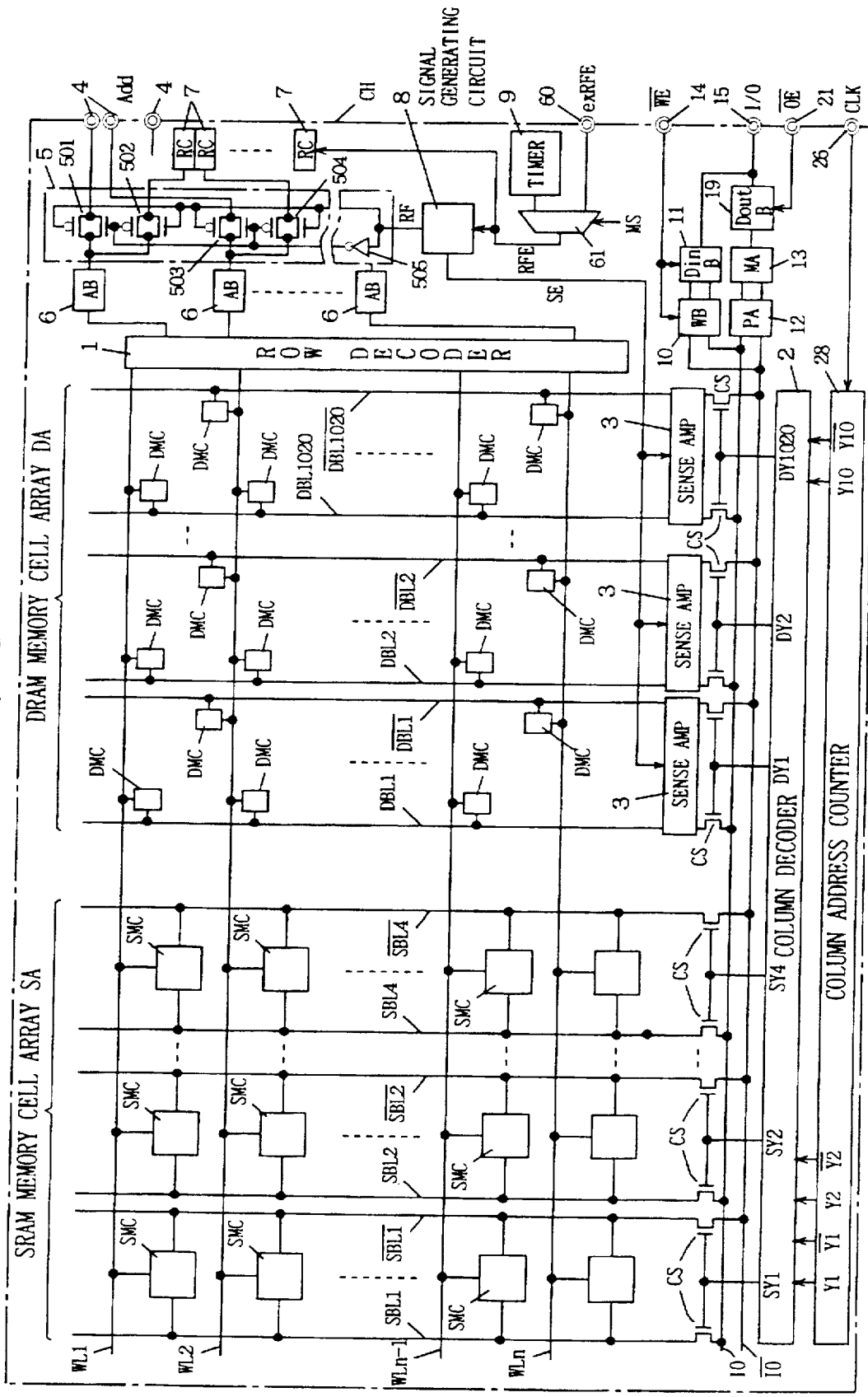
FIG. 21 is a block diagram illustrating a total structure of the semiconductor memory device depending on an embodiment 16 of the present invention.

FIG. 21 is a block diagram illustrating a total structure of the synchronous type semiconductor memory device depending on an embodiment 16 of the present invention. With reference to FIG. 21, this semiconductor memory device is provided with a column address counter 28, in addition to the structure of FIG. 2. The column address counter 28 generates the column address signals Y1–Y10, /Y1–/Y10 responsive to an external clock signal CLK supplied to an external clock terminal 26. The column decoder 2 generates the decode signals SY1–SY4, DY1–DY1020 responsive to the column address signals Y1–Y10, /Y1–/Y10.

In this embodiment 16, four SBL bit line pairs SBL1, /SBL1–SBL3, /SBL4 and 1020 DRAM bit line pairs DBL1, /DBL1–DBL1020, /DBL1020 are arranged.

Figure 22:
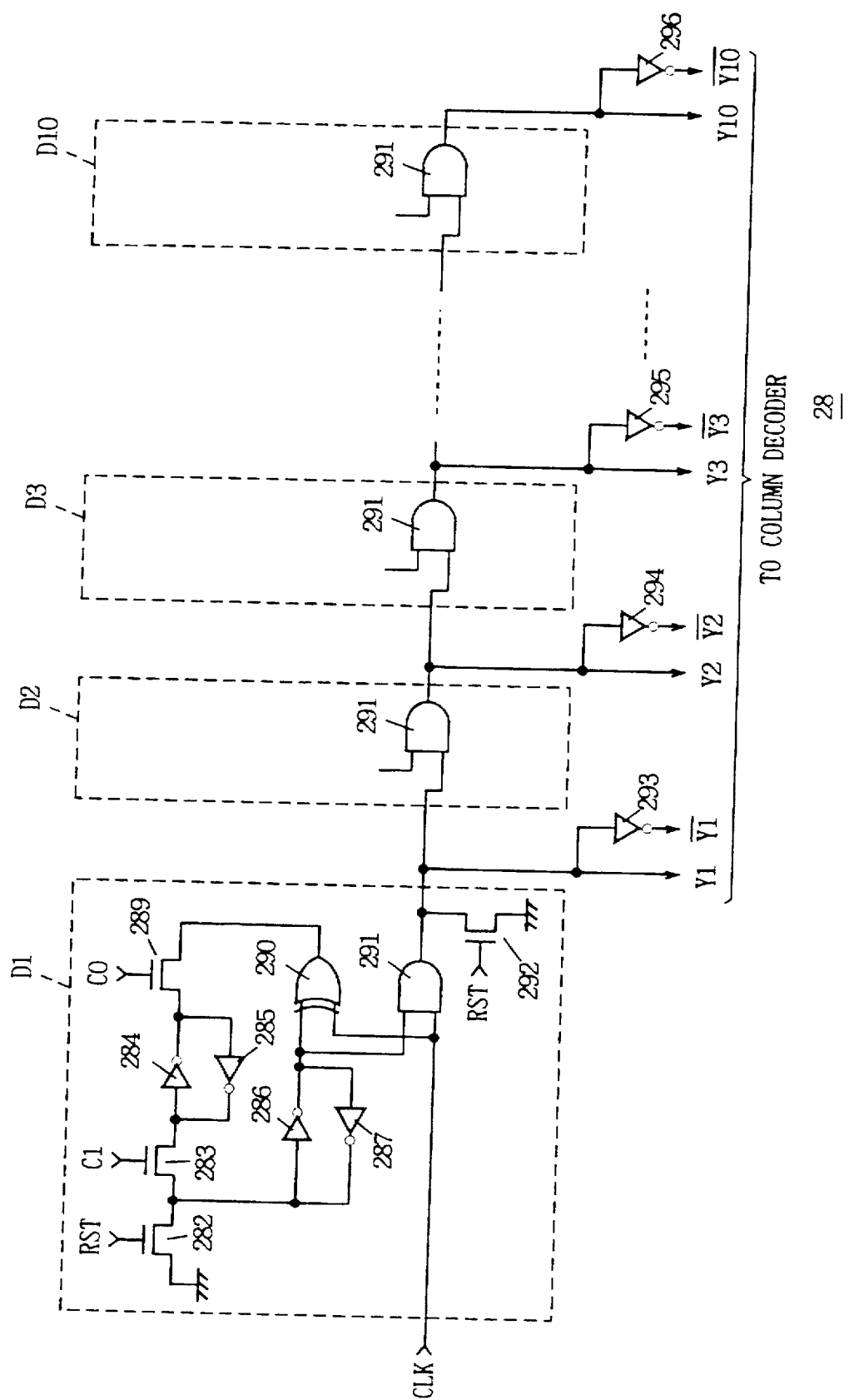
FIG. 22 is a circuit diagram illustrating a structure of a column address counter shown in FIG. 21.

FIG. 22 is a block diagram illustrating a structure of the column address counter 28 of FIG. 21. With reference to FIG. 22, the column address counter 28 is provided with 10 frequency-dividers D1–D10. The frequency divider D1 comprises four N channel MOS transistors 282, 283, 289, 292, four inverters 284–287, an exclusive OR gate 290 and an AND gate 291. The transistors 282, 292 become conductive responsive to a reset signal RST. The transistor 283 becomes conductive responsive to a synchronous signal C1. The transistor 289 becomes conductive responsive to the synchronous signal C0. The other frequency dividers D2–D10 are also composed as explained above.

The clock signal CLK is applied to one input terminal of the AND gate 291 in the frequency divider D1. The frequency divider D1 generates an address signal Y1 of the least significant bit. This address signal Y1 is applied to one input terminal of the AND gate 291 in the frequency divider D2. The frequency divider 2 generates an address signal Y2. The address signal Y2 is applied to one input terminal of the AND gate 291 in the frequency divider D3. The frequency divider D10 generates the most significant address signal Y10. The output nodes of the frequency dividers D1–D10 are connected with the inverters 293–296 for inverting the address signals Y1–Y10. Therefore, the address signals Y1–Y10 of 10 bits are incremented responsive to the clock signal CLK.

Figure 23:
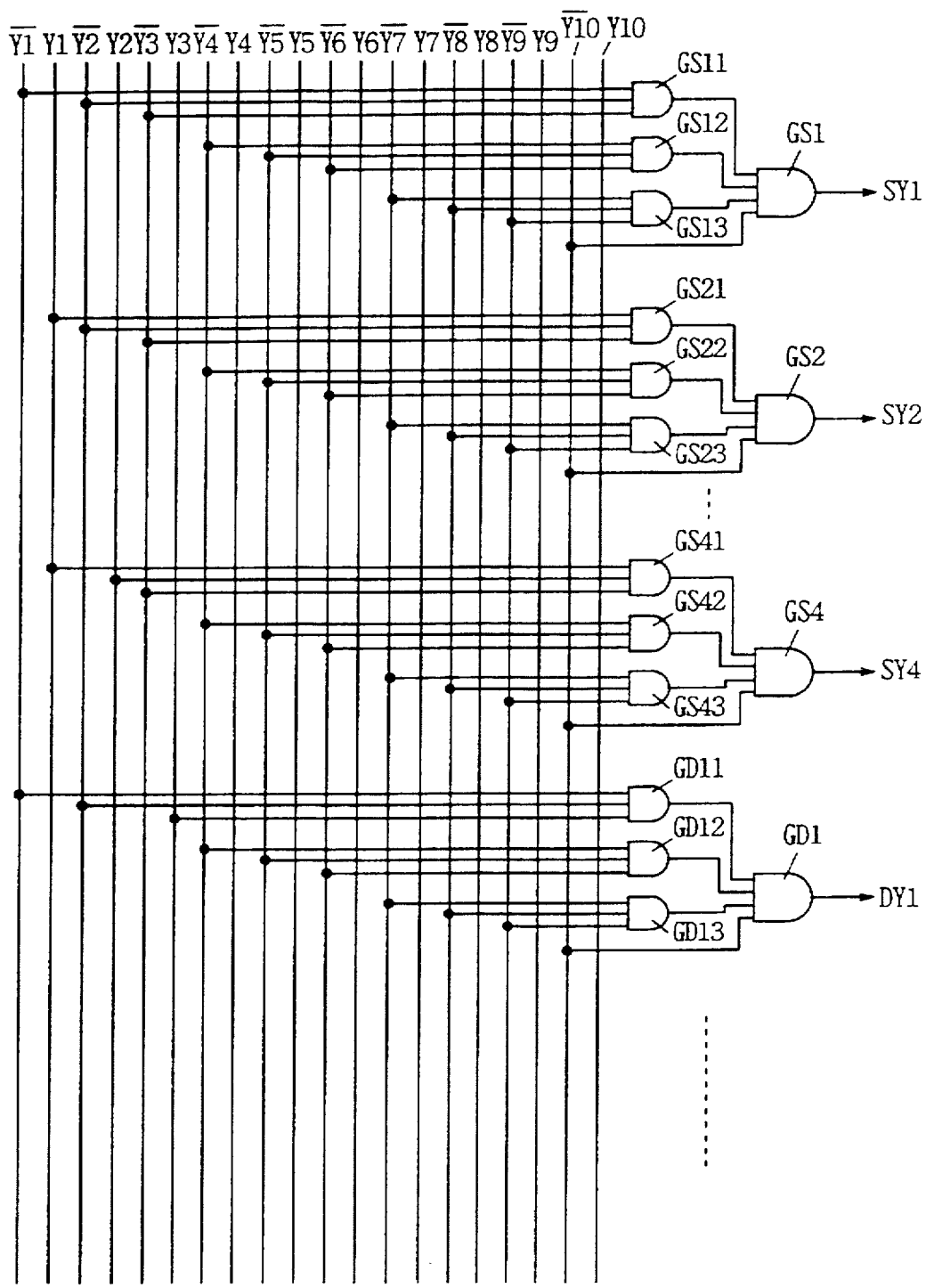
FIG. 23 is a circuit diagram illustrating a structure of a column decoder shown in FIG. 21.

FIG. 23 is a circuit diagram illustrating a structure of the column decoder shown in FIG. 21. With reference to FIG. 23, the column decoder is provided with four AND gates GS1–GS4 for generating the decode signals SY1–SY4 and the AND gates GD1–GD1020 for generating the decode signals DY1-DY 1020. The AND gates GS3 and GD2-GD1020 are not illustrated.

This column decoder 2 is further provided with three AND gates corresponding to the AND gates GS1-GS4, GD1-GD1020. For instance, the AND gate GS11 receives the address signals /Y1, /Y2 and /Y3 and applies its OR signals to the AND gate GS1. Moreover, the AND gate GS12 receives the column address signals /Y4, /Y5 and /Y6 and applies its OR signal to the AND gate GS1. Moreover, the AND gate GS13 receives the column address signal /Y7, /Y8 and /Y9 and applies its OR signal to the AND gate GS1. The AND gate GS1 also receives the column address signal /Y10. Therefore, when the column address signals Y1 Y10 are incremented from "0" to "1023" with the decimal numbers, the decode signals sequentially become H level from SY1 to DY1020.

(1) Read operation

Figure 24:
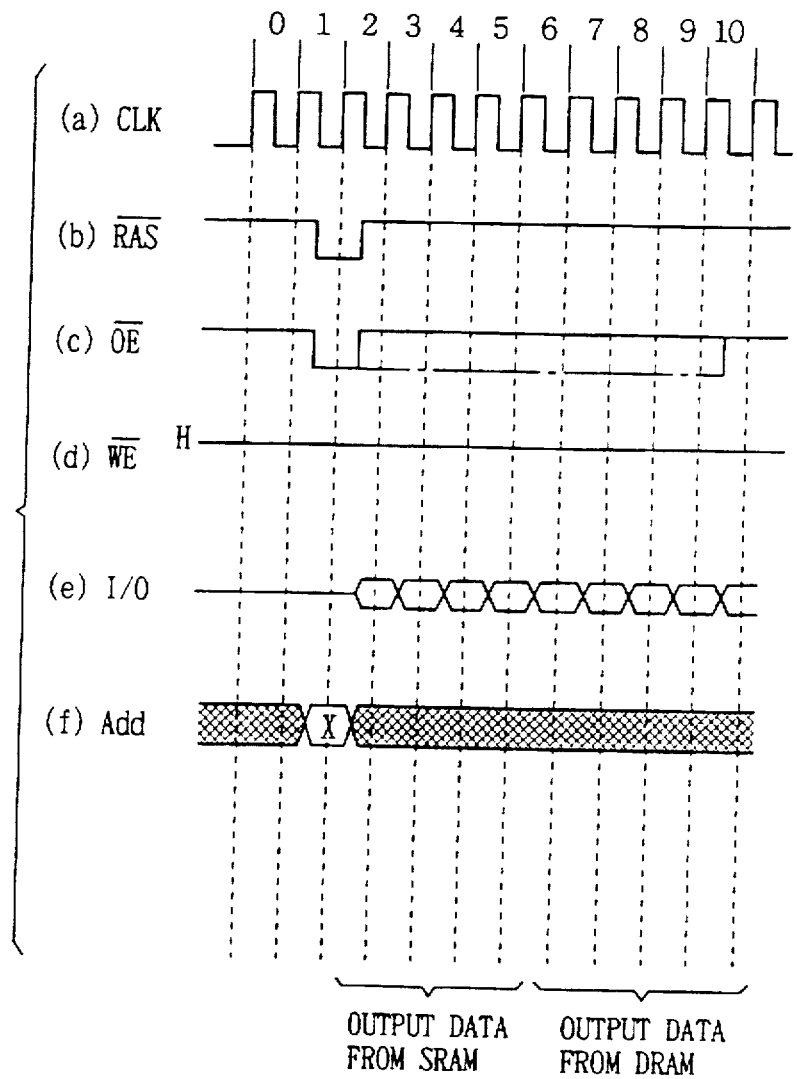
FIG. 24 is a timing chart illustrating read operation of the semiconductor memory device shown in FIG. 21.

In the case where such synchronous type semiconductor memory device is used within a computer, a system clock of the computer is applied, as the external clock signal CLK, to an external clock terminal 26 of this synchronous type semiconductor memory device. FIG. 24 is a timing chart indicating the read operation of the synchronous type semiconductor memory device shown in FIG. 21.

When the row address strobe signal /RAS falls as shown in FIG. 24(b), an external address signal Add being applied to the address terminal 4 is fetched as a row address signal X. The row decoder 1 selects one word line from the word lines WL1-WLn responsive to the row address signal X. For instance, when the word line WL1 is selected, data is respectively read from all memory cells SMC, DMC connected to the word line WL1 to the bit line pairs SBL1, /SBL1-SBL4, /SBL4 and DBL 1, /DBL1-DBL1020, /DBL1020.

The column address counter 28 increments the column addresses Y1-Y10 responsive to the clock signal CLK of FIG. 24(a). Therefore, the column decoder 2 selects first the SRAM bit line pair SBL1, /SBL1. Namely, the decode signal SY1 of H level is respectively supplied to the gate electrodes of the column selection gate CS. Since the memory cell SMC connected to the bit line pair SBL1, /SBL1 is a static type memory cell, data appears on the bit line pair SBL1, /SBL1 after 10 to 15 nS from selection of the word line WL1. The data of the bit line pair SBL1, /SBL1 is transferred to the data input/output line pair IO, /IO via the column selection gate CS and moreover outputted through the preamplifier circuit 12, main amplifier 13 and data output buffer circuit 19.

Subsequently, when the SRAM bit line pair SBL2, /SBL2 is selected, the data read out to the bit line pair SBL2, /SBL2 is outputted via the data input/output line pair IO, /IO.

Here, when the word line WL1 is selected, all sense amplifiers 3 are immediately activated and about 60 nS is required until the potential difference between the bit line pairs DBL1, /DBL1 and DBL1020, /DBL1020 is amplified and latched. However, since four SRAM bit line pairs SBL1, SBL1-SBL4, /SBL4 are selected until the DRAM bit line pair SBL1, /DBL1 is selected, when the DRAM bit line pair DBL1, /DBL1 is selected, the data read from the DRAM memory cell DMCC is perfectly latched by the corresponding sense amplifier 3. Therefore, when the DRAM bit line pair DBL1, /DBL1 is selected immediately after the SRAM bit line SBL4 is selected, the data latched by the sense amplifier 3 is outputted to the external circuit through the data input/output line pair IO, /IO.

Therefore, as shown in FIG. 24(e), data is continuously outputted to the external circuit responsive to rise of the clock signal CLK. Since four SRAM bit line pairs SBL1, /SBL1-SBL4, /SBL4 are arranged in the SRAM memory array SA, the output data from the first to the fourth data are read from the SRAM memory cell SMC. Moreover, the fourth and subsequent output data are read from the DRAM memory cell DMC.

According to the embodiment 16 as explained above, since the SRAM bit line pair SBL1, /SBL1 is selected first responsive to the external clock signal CLK, the data of the SRAM memory cell SMC is read first. Since the DRAM bit line pair DBL1, /DBL1 is selected after the sense amplifier 3 perfectly latches the data of the DRAM memory cell DMC, perfect data can be read from the DRAM memory cell DMC.

(2) Write operation

Figure 25:
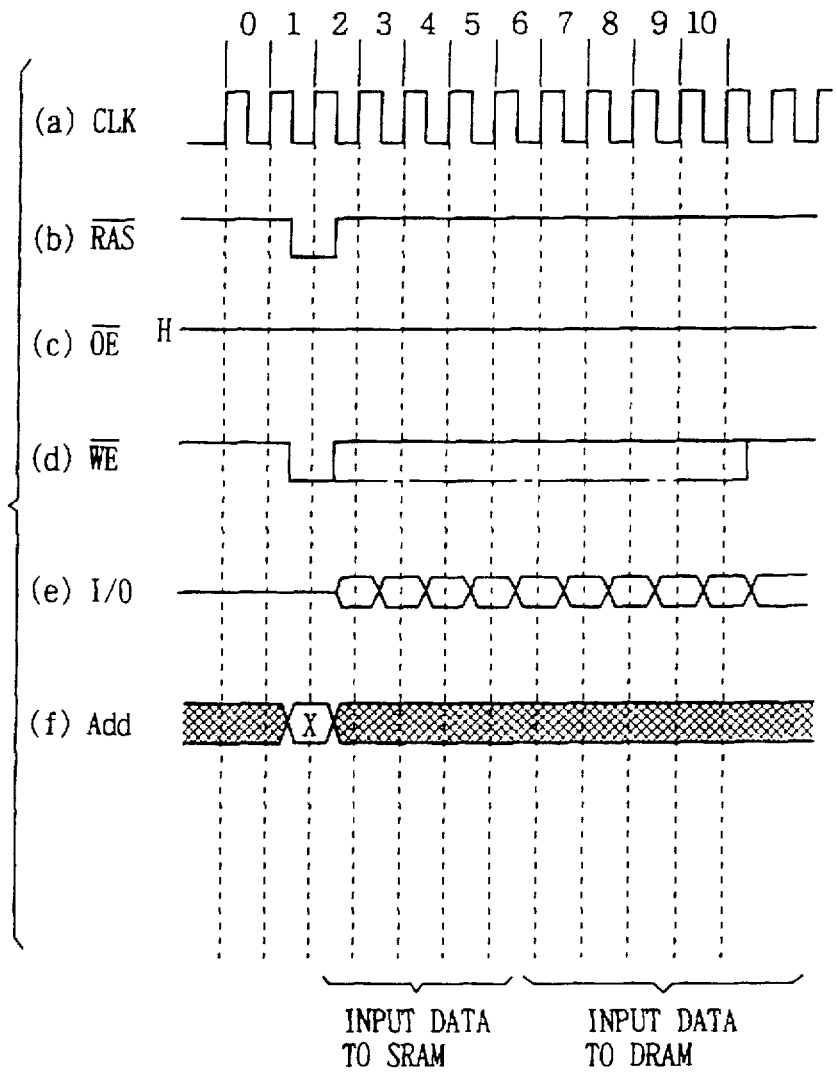
FIG. 25 is a timing chart illustrating write operation of the semiconductor memory device shown in FIG. 21.

FIG. 25 is a timing chart illustrating the write operation of the synchronous type semiconductor memory device shown in FIG. 21. When the row address strobe signal /RAS falls as shown in FIG. 25(b) while the write enable signal /WE is L level as shown in FIG. 25(d), the external address signal Add applied to the address terminal 4 is fetched to the internal circuits as the row address signal X. The row decoder 1 selects one word line from the word lines WL1-WLn responsive to the row address signal X. For instance, when the word line WL1 is selected, the access transistors in all memory cells SMC, DMC connected to the word line WL1 become conductive.

As shown in FIG. 25(e), continuous data are externally supplied to the data input/output line pair IO, /IO through the data input/output terminal 15, data input buffer circuit 11 and write buffer circuit 10. Like the read operation as explained above, the column address signals Y1-Y10 in the side of the column address counter 28 are incremented responsive to the external clock signal CLK. Therefore, the column decoder 2 first selects the SRAM bit line pair SBL1, /SBL1 and then sequentially selects the bit line pairs SBL2, /SBL2-DBL4, /SBL4 and DBL1, /DBL1-DBL1020, /DBL1020. Therefore, the data which is first supplied to the data input/output line pair IO, /IO is transferred to the bit line pair SBL1, /SBL1 through the column selection gate CS and moreover stored in the SRAM memory cell SMC. Thereafter, when the bit line pair SBL2, /SBL2 is selected, the next data is then stored in the corresponding SRAM memory cell SMC. As explained above, the continuous 1024 data are stored in the memory cells SMC and DMC connected to the word line WL1.

Figure 26:
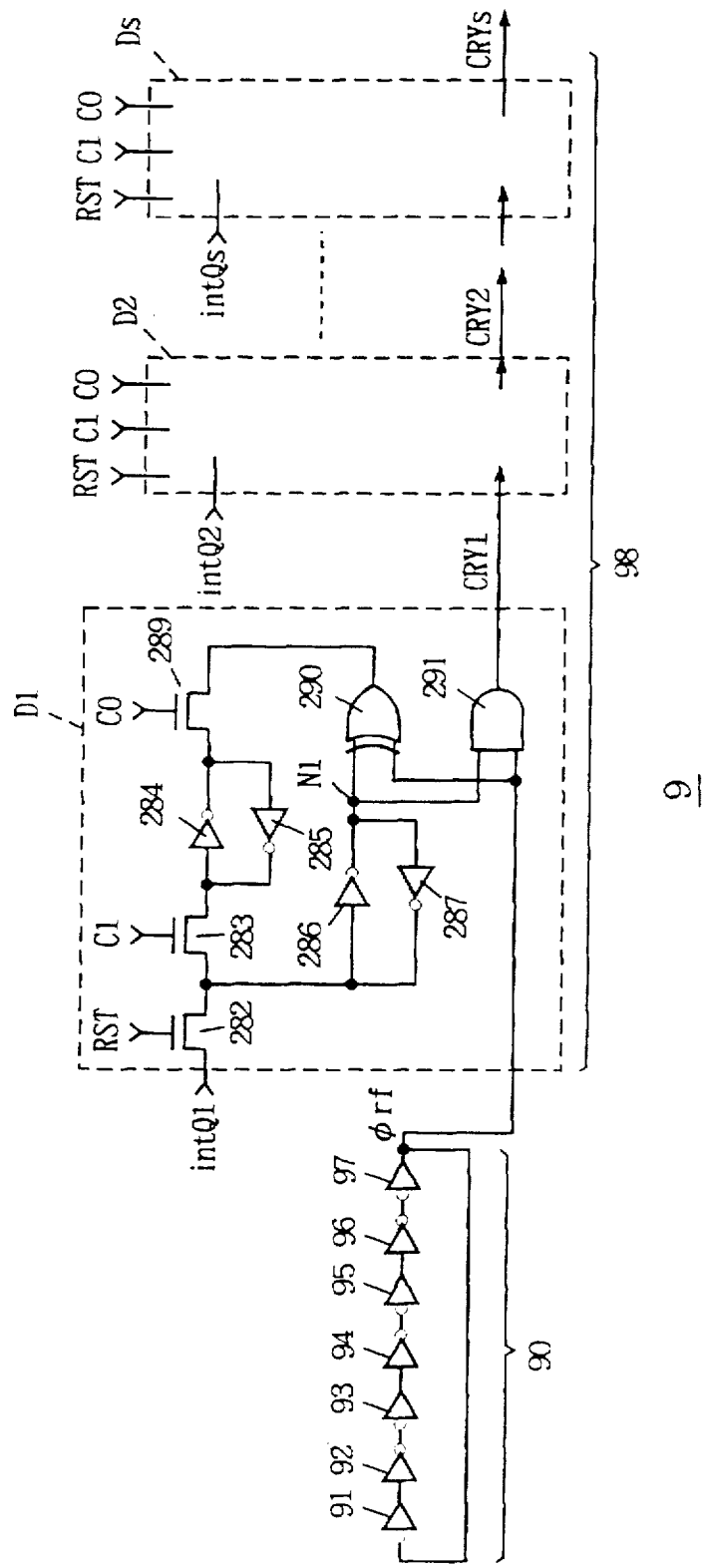
FIG. 26 is a circuit diagram illustrating a structure of a refresh timer shown in FIG. 21.

FIG. 26 is a block diagram illustrating a structure of the refresh timer 9 shown in FIG. 21. With reference to FIG. 26, the refresh timer 9 is provided with a ring oscillator 90 and a counter circuit 98. The ring oscillator 90 is provided with seven inverters 91-97 connected in the shape of a ring. Therefore, the ring oscillator 90 generates a pulse signal φrf of the predetermined period. The counter circuit 98 is composed almost in the same structure as the column address counter 28 of FIG. 28. However, this counter 98 is provided with s frequency dividers D1-Ds. Internal control signals intQ1-intQs are respectively supplied to the source/drain electrodes of the transistor 282 of the frequency dividers D1-Ds. Moreover, the carry signal CRY from each frequency divider is applied to one input terminal of the AND gate 291 in the frequency divider of the next stage.

Figure 27:
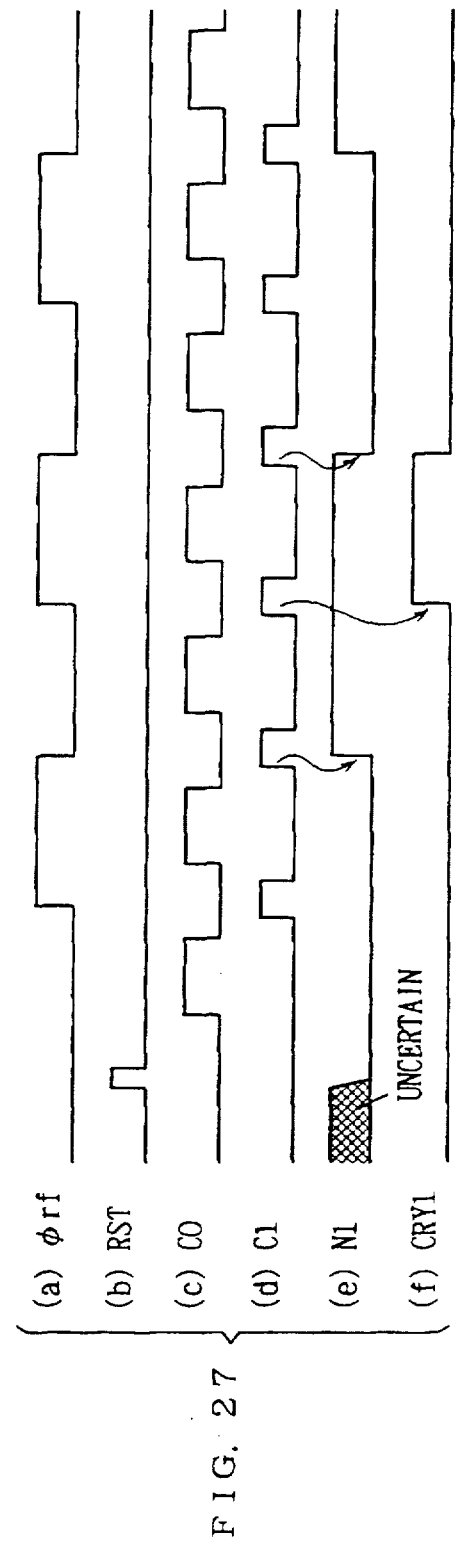
FIG. 27 is a timing chart illustrating operation of a frequency divider of the first stage shown in FIG. 26.

FIG. 27 is a timing chart indicating operation of the frequency divider D1 of the first stage of the counter 98 shown in FIG. 26. As shown in FIG. 27(b), when the reset signal RST of H level is applied to the gate electrode of the transistor 282, the internal control signal intQ1 is latched as the initial value by the latch circuit consisting of the inverters 286 and 287. Thereby, as shown in FIG. 27(e), the potential of the output node N1 of the latch circuit is determined. Next, when the synchronous signals C0 and C1 as shown in FIG. 27(c) and FIG. 27(d), a carry signal CRY1 is outputted as shown in FIG. 27(f). Therefore, this frequency divider D1 generates the carry signal CRY1 by dividing the frequency of the pulse signal ϕrf to ½. Namely, one carry signal CRY1 is generated responsive to two pulse signals ϕrf.

Figure 28:
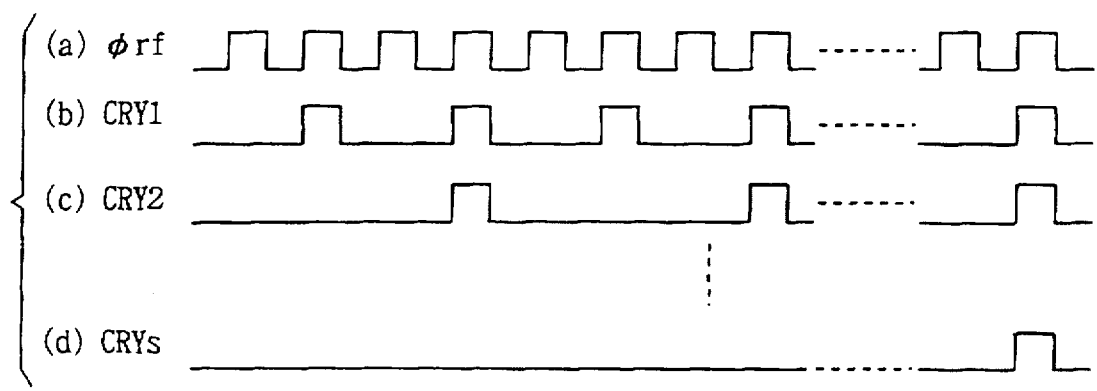
FIG. 28 is a timing chart illustrating operation of the refresh timer shown in FIG. 26.

FIG. 28 is a timing chart indicating operation of the counter 28 as a whole shown in FIG. 26. The frequency divider D2 of the second stage generates the carry signal CRY2 by further dividing the frequency of the carry signal CRY1 to ½. Therefore, the frequency divider D2 generates one carry signal CRY2 responsive to two carry signals CRY1. As a result, one carry signal CRY2 is generated responsive to four pulse signals ϕrf.

As explained above, since the carry signal from each frequency divider is applied to the frequency divider of the next stage, one carry signal CRYs is generated from the frequency divider of the final stage responsive to 2s pulse signals ϕrf as shown in FIG. 28(d). Accordingly, this refresh timer 9 generates the carry signal CRYs in every predetermined period.

Referring to FIG. 21 again, this semiconductor memory device is provided with a refresh control terminal 60 to which an external refresh enable signal exRFE is impressed and a selector 61 for selecting any one of the external refresh enable signal exRFE or the carry signals CRYs from the refresh timer 9.

Figure 29:
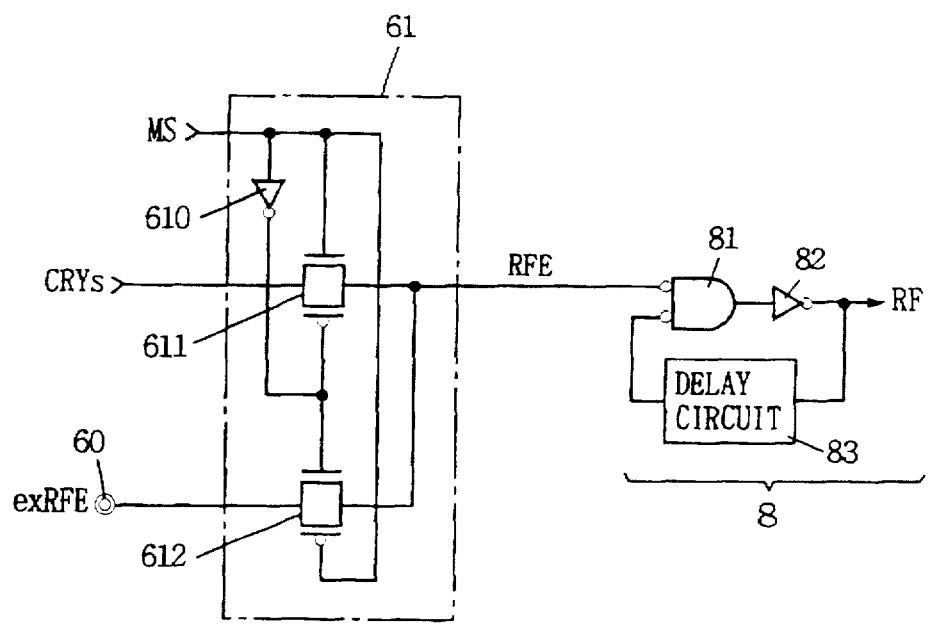
FIG. 29 is a block diagram illustrating a structure of a selector and a signal generating circuit shown in FIG. 21.

FIG. 29 is a block diagram illustrating a structure of a selector 61 and a signal generating circuit 8 shown in FIG. 21. With reference to FIG. 29, the selector 61 comprises transfer gates 611 and 612 consisting of P and N channel MOS transistors and an inverter 610 for inverting the mode switching signal MS and applying respectively the inverted signal to the P channel MOS transistor of the transfer gate 611 and the N channel MOS transistor of the transfer gate 612.

In the selector 61, when the mode switching signal MS of the L level is applied, the transfer gate 611 becomes conductive and the transfer gate 611 becomes non-conductive and thereby the carry signal CRYs is applied respectively to the refresh counter 7 and signal generating circuit 8 as the internal refresh enable signal RFE. On the other hand, when the mode switching signal MS of the H level, the transfer gate 611 becomes non-conductive and the transfer gate 612 becomes conductive. Thereby the external refresh enable signal exRFE is respectively applied to the refresh counter 7 and signal generating circuit 8 as the internal refresh enable signal RFE.

Moreover the signal generating signal 8 comprises a NAND gate 81, an inverter 82 and a delay circuit 83. This signal generating circuit 8 generates a refresh request signal RF by expanding the pulse width of the internal refresh enable signal RFE supplied from the selector 61.

Figure 30:
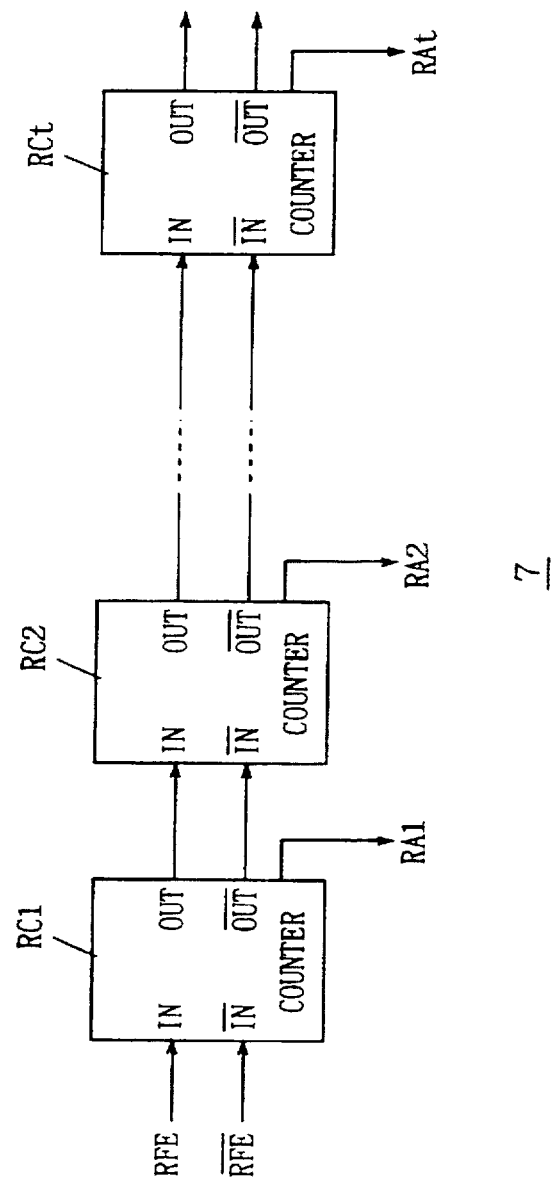
FIG. 30 is a block diagram illustrating a structure of a refresh counter shown in FIG. 21.

FIG. 30 is a block diagram illustrating a structure of the refresh counter 7 of FIG. 21. As illustrated in FIG. 30, the refresh counter 7 is composed of t counters RC1–RCt in the cascade connection.

Figure 31:
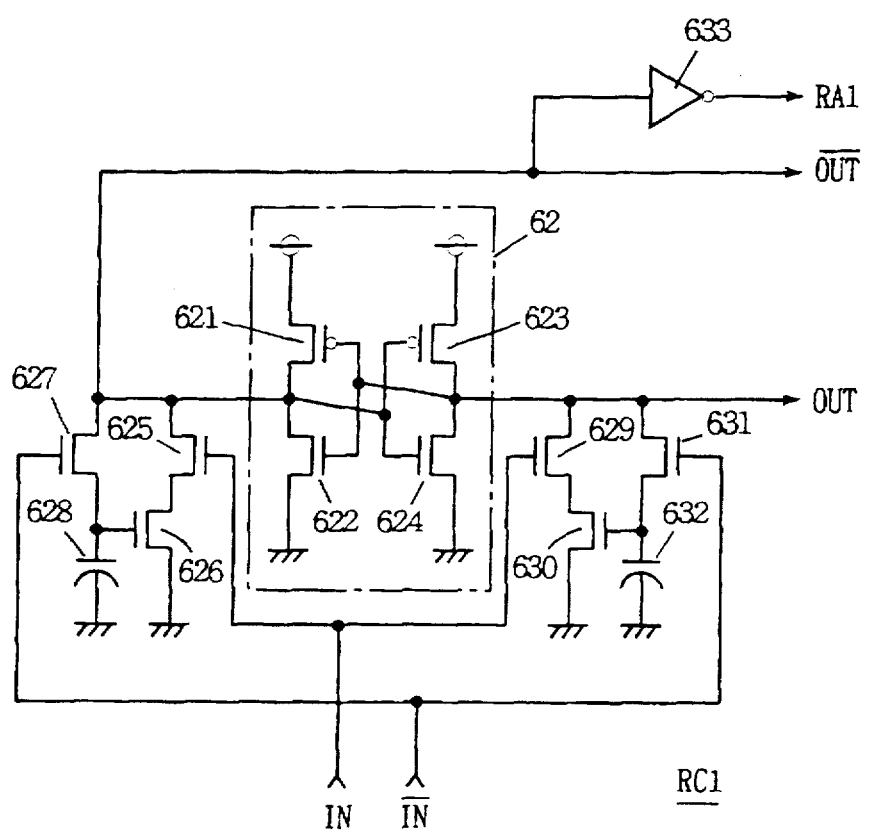
FIG. 31 is a circuit diagram illustrating a structure of a counter of the first stage shown in FIG. 30.

FIG. 31 is/ a circuit diagram illustrating a structure of the counter RC1 of the first stage shown in FIG. 30. With reference to FIG. 31, the counter RC1 is composed of a latch circuit 62, transistors 625–627, 629–631, MOS capacitors 628 and 632 and an inverter 633. The MOS capacitors 628 and 632 respectively hold the preceding conditions.

In this counter RC1, an input signal IN is applied to the gate electrodes of the transistors 625 and 629. The input signal /IN which is complementary signal of the input signal IN is applied to the gate electrodes of the transistors 627 and 631. Moreover, an output signal OUT is outputted from an inverter consisting of the transistors 623 and 624. The output signal /OUT which is complementary signal of the output signal OUT is outputted from an inverter consisting of the transistors 621 and 622. This output signal /OUT is inverted by the inverter 633 and the inverted signal is outputted as the internal address signal RA1 for refresh operation.

FIG. 32 is a timing chart illustrating operations of the counter RC1 shown in FIG. 31. In this counter RC1, when the input signals IN and /IN as shown in FIG. 32(a) and FIG. 32(b) are applied, the condition of the latch circuit 62 is inverted during the periods P1 and P3 wherein the input signal IN is in the H level. On the other hand, during the periods P2 and P4 where the input signal IN is in the L level, the preceding condition held in he MOS capacitors 628 and 632 is latched by the latch circuit 62.

Therefore, as shown in FIG. 32(c) and FIG. 32(d), the output signals OUT, /OUT obtained by dividing the frequencies of the input signals IN and /IN to ½ can be generated. Moreover, as shown in FIG. 32(e), an internal address signal RA1 obtained by inverting the output signal /OUT can also be generated.

Figure 33:
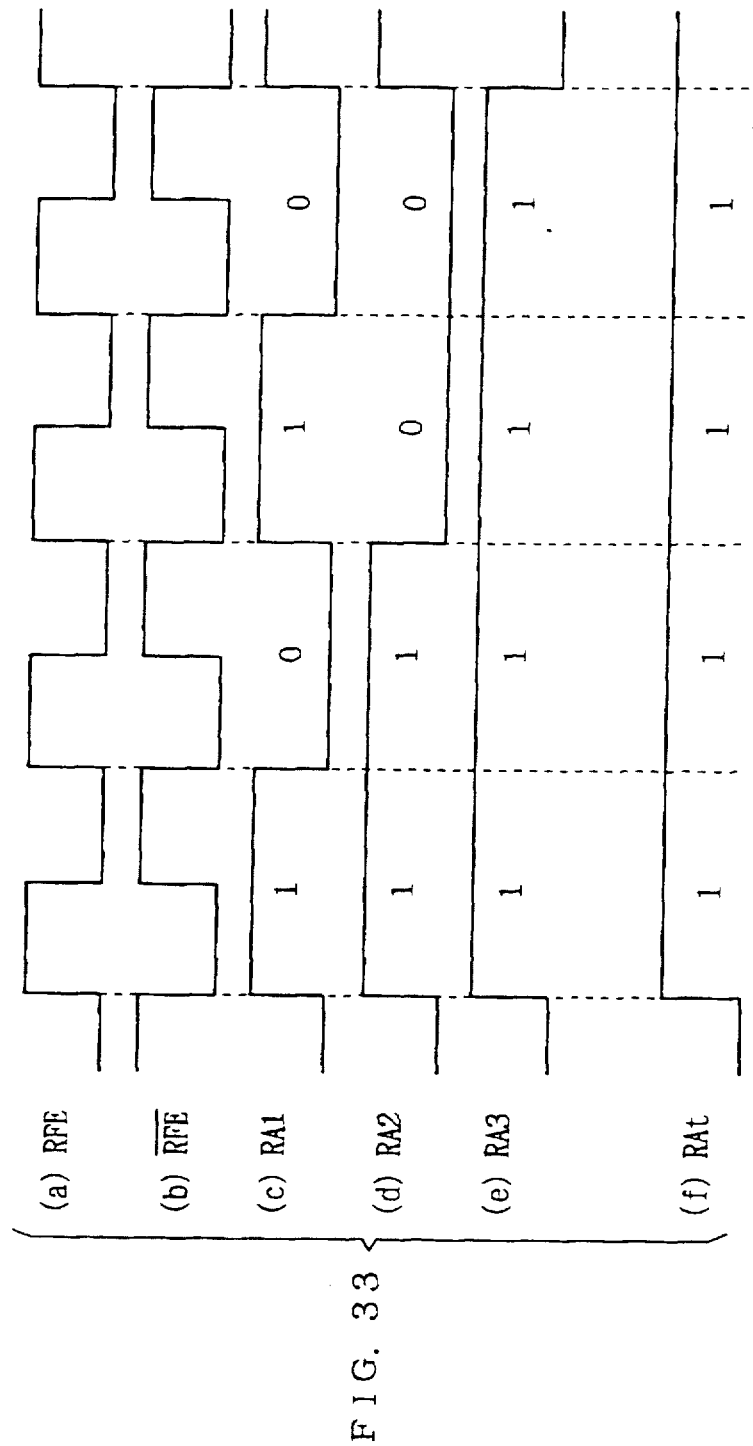
FIG. 33 is a timing chart illustrating operations of the refresh counter shown in FIG. 30.

FIG. 33 is a timing chart indicating total operations of the refresh counter 7 shown in FIG. 30. As explained above, the internal refresh enable signals RFE and /RFE as shown in FIG. 33(a) and FIG. 33(b) are applied to the counter RC1. As shown in FIG. 33(c), the counter RC1 outputs an internal address signal RA1 obtained by dividing the frequencies of the internal refresh enable signals RFE and /RFE to ½. Moreover, since the output signals OUT and /OUT of the counter RC1 are impressed as the input signals IN and /IN to the counter RC2, the counter RC2 outputs the internal address signal RA2 obtained by dividing the frequencies of the internal reflesh enable signals RFE and /RFE to ¼. Like these counters RC1, RC2, the other counters also output the internal address signals RA3–RAd. Therefore, this address counter 7 outputs the internal address signals RAd–RA1 in the sequence of "1 . . . 111"→"1 . . . 110"→"1 . . . 101"→"1 . . . 100".

Referring to FIG. 21 again, the multiplex circuit 5 is provided with 2t transfer gates and an inverter 505. In FIG. 21, only the transfer gates 501–504 are representatively indicated. In this multiplex circuit 5, when the reflesh request signal RF of H level is given from the signal generating circuit 8, the transfer gates, for example, 502, 504 corresponding to the reflesh counter 7 become conductive and the transfer gates, for example, 501, 503 corresponding to the address terminal 4 become non-conductive. Therefore, the internal address signals RAt–RA1 from the reflesh counter 7 are applied to the row decoder 1 through the address buffer 6. On the other hand, when the refresh request signal RF of L level is given from the signal generating circuit 8, the transfer gate corresponding to the address terminal 4 becomes conductive and the transfer gate corresponding to reflesh counter 7 becomes non-conductive. Therefore, the external address signal Add is impressed to the row decoder 1 through the address buffer.

(3) Self refresh operation

In the DRAM memory cell DMC, data may be stored depending on whether charges are accumulated in the cell capacitor or not. Therefore, when the predetermined time has passed due to a leak current flowing into the PN junction, data is destroyed. Accordingly, the DRAM memory cell DMC must be refreshed before the data is destroyed.

In this embodiment 16, the refresh request signal RF of H level is generated in the constant period depending on the refresh timer 9. When the refresh request signal RF becomes H level, an internal address signal supplied from the refresh counter 7 is then supplied to an address buffer 6 through the multiplex circuit 5. Therefore, the row decoder 1 selects one word line from a plurality of word lines WL1–WLn responsive to the internally generated internal address signal. For instance, when the word line WL1 is selected, data is read to the bit line pairs SBL1, /SBL1–SBL4, /SBL4, and DBL1, /DBL1–DBL1020, /DBL1020 from all memory cells SMC, DMC connected to the selected word line WL1. Thereby, potential difference is generated between the DRAM bit lines DBL1, /DBL1–DBL1020, /DBL1020. Subsequently, the sense amplifier 3 is activated responsive to the sense amp enable signal SE. A potential difference of each bit line pair is amplified by the sense amplifier 3. Thereby, the potential of one DRAM bit line becomes H level and the potential of the other DRAM bit line becomes L level. Therefore, the H level or L level potentials transferred to the memory node of the DRAM memory cell. When the potential of the word line WL1 falls, the access transistor in the DRAM memory cell DMC becomes non-conductive. Moreover, when the potential of the word line WL1 falls, the refresh timer 9 is reset and is then activated again.

When the refresh request signal RF of H level is generated by the refresh timer 9, a new internal address signal obtained by adding "1" to the preceding internal address signal is applied to the row decoder 1. The row decoder 1 selects one word line, for example, WL2 from a plurality of word lines WL1–WLn responsive to the new internal address signal. Thereby, as in the case of the word line WL1, the DRAM memory cell DMC connected to the word line WL2 is refreshed.

Here, when the number of word lines is 4096 and it is required to refresh the DRAM memory cell DMC in every 64 mS, the period of the refresh timer 9 must be set to 15.625 µs (=64 mS/4096).

In this embodiment 16, the refresh timer 9 is composed of a ring oscillator 90 and a counter 98 which may be replaced with a charge pump circuit for pumping the predetermined amount of charges with a small capacitance capacitor.

Moreover, even in the case of using a no-load type memory cell shown in FIG. 11 as the SRAM memory cell SMC, such SRAM memory cell SMC is also refreshed simultaneously with the DRAM memory cell DMC because the SRAM memory cell SMC and DRAM memory cell DMC are connected in common with one word line.

[Embodiment 17]

Figure 34:
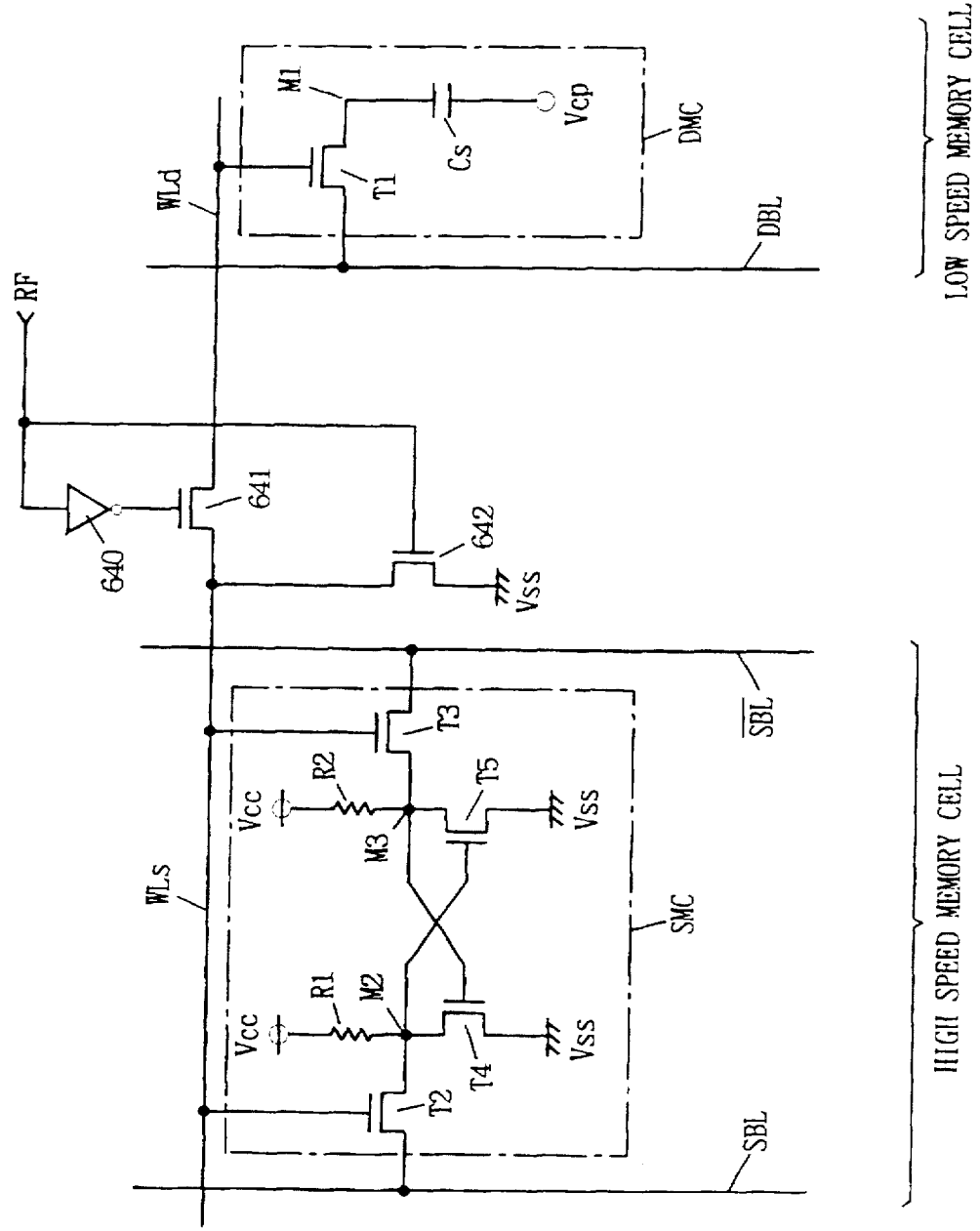
FIG. 34 is a circuit diagram illustrating the essential portion of the semiconductor memory device depending on an embodiment 17 of the present invention.

FIG. 34 is a circuit diagram illustrating the essential portion of the semiconductor memory device depending on an embodiment 17 of the present invention. With reference to FIG. 34, unlike the embodiment 1 shown in FIG. 1, in the embodiment 17, the word line is divided into the part WLs for the SRAM memory cell array and the part WLd for the DRAM memory cell array. Between the part WLs of the SRAM memory cell array and the part WLd of the DRAM memory cell array of the word line, an N channel MOS transistor 641 is connected. An inverted refresh signal/RF inverted by the inverter 640 is applied to the gate electrode of the transistor 641. Moreover, between the part WLs of the word line for the SRAM memory cell array and the ground node, an N channel MOS transistor 642 is connected. To this gate electrode of the transistor 642, the refresh request signal RF is applied.

Therefore, since the refresh request signal RF becomes H level in the refresh mode, the transistor 641 becomes non-conductive, electrically disconnecting the word line into the part WLs for the SRAM memory cell array and the part WLd for the DRAM memory cell array. Therefore, the potential of only the part WLs for the DRAM memory cell array rises up to the upper level and thereby the DRAM memory cell DMC is refreshed. Moreover, in this case, since the transistor 642 becomes conductive, the potential of the part WLs of the word line for the SRAM memory cell array becomes equal to the ground potential Vss. Thereby, since the access transistors T2 and T3 deeply become non-conductive, the SRAM memory cell SMCC can reliably maintain the stored data.

As described, according to the embodiment 17, since only the DRAM memory cell array which requires the refresh operation is refreshed and the SRAM memory cell which does not require the refresh operation is not activated, the current dissipation for the refresh operation can be reduced.

On the other hand, since the refresh request signal RF becomes L level in the ordinary operation mode, the transistor 641 becomes conductive and the transistor 642 becomes non-conductive. The potential of the part WLd of the word line in the DRAM memory cell array is boosted to the value higher than the power source voltage Vcc by the row decoder. Therefore, the access transistor T1 does not cause any voltage drop and the power source voltage Vcc is applied to the memory node M1 when the potential of the DRAM bit line DBL is equal to the power source voltage Vcc. Accordingly, the data storing capability of this memory cell DMC can be improved.

As explained above, the word line WLd in the DRAM memory cell array rises up to the upper level, but the word line WLs in the SRAM memory cell array rises only up to the power source voltage Vcc because the transistor 641 generates a voltage drop as high as its threshold voltage. Thereby, since the potential higher than that required is never applied to the gate electrode of the access transistors T2 and T3, useless power consumption is never detected in the memory cell SMC.

[Embodiment 18]

Figure 35:
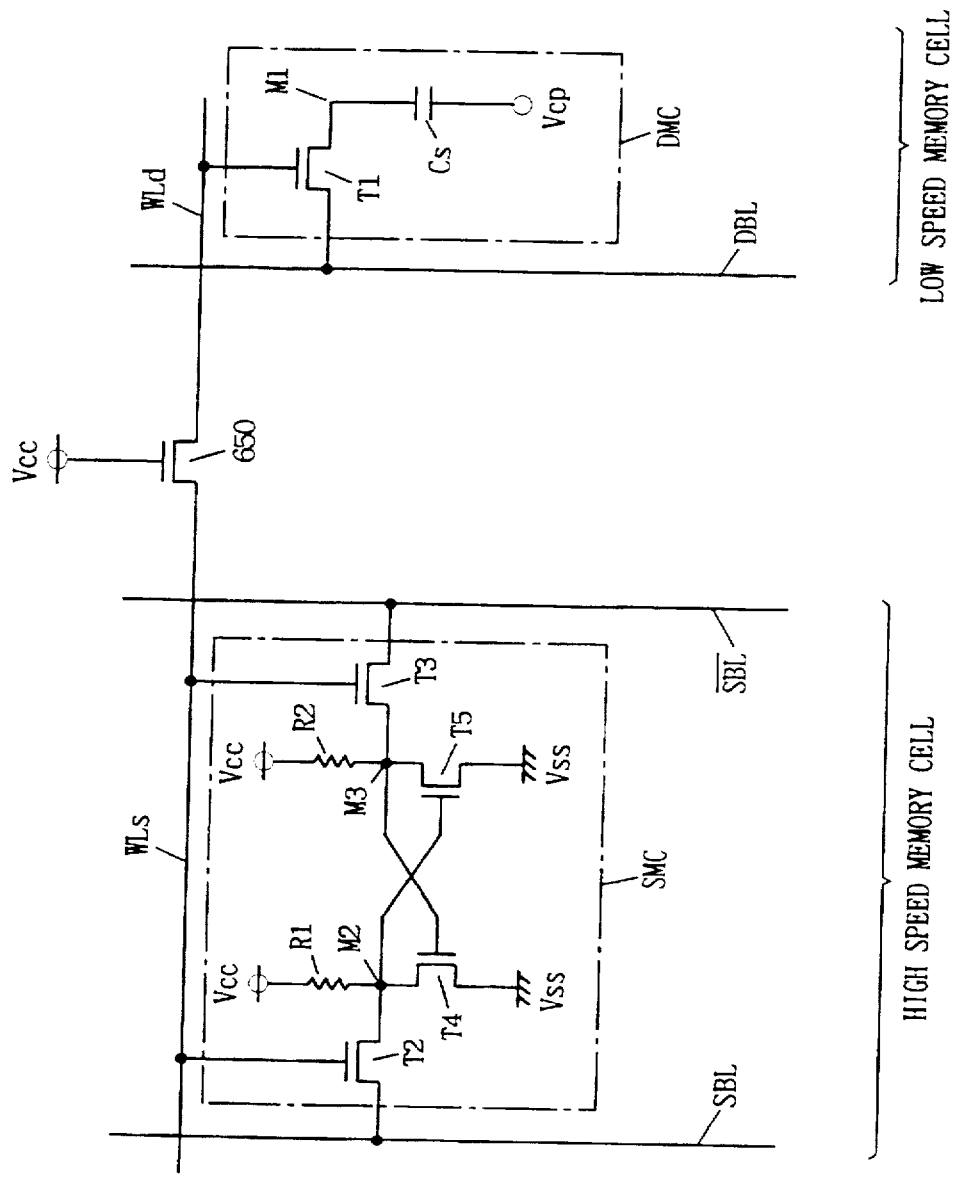
FIG. 35 is a circuit diagram illustrating the essential portion of the semiconductor memory device depending on an embodiment 18 of the present invention.

FIG. 35 is a circuit diagram illustrating the essential portion of the DRAM depending on an embodiment 18 of the present invention. With reference to FIG. 35, unlike the embodiment 1 shown in FIG. 1, in this embodiment 18, the word line is divided into the part WLs in the SRAM memory cell array and the part WLd in the DRAM memory cell array. An N channel MOS transistor 650 is connected between the word line part WLs in the SRAM memory cell array and the word line part WLd in the DRAM memory cell array. The power source voltage Vcc is applied to the gate electrode of the transistor 650.

Therefore, even when the potential of the word line WLd is boosted up to the value which is higher than the power source voltage Vcc by the threshold voltage of the access transistor T1, the potential of the word line WLs rises only to the power source voltage Vcc because the transistor 650 generates a voltage drop, the potential of the word line WLd drops as much as such threshold voltage and such voltage drop is transferred to the word line WLs.

According to this embodiment 18, since voltage rise level is not transferred to the word line WLs in the SRAM memory cell array which does not require voltage rise, useless current dissipation is never detected in the SRAM memory cell SMC.

[Embodiment 19]

Figure 36:
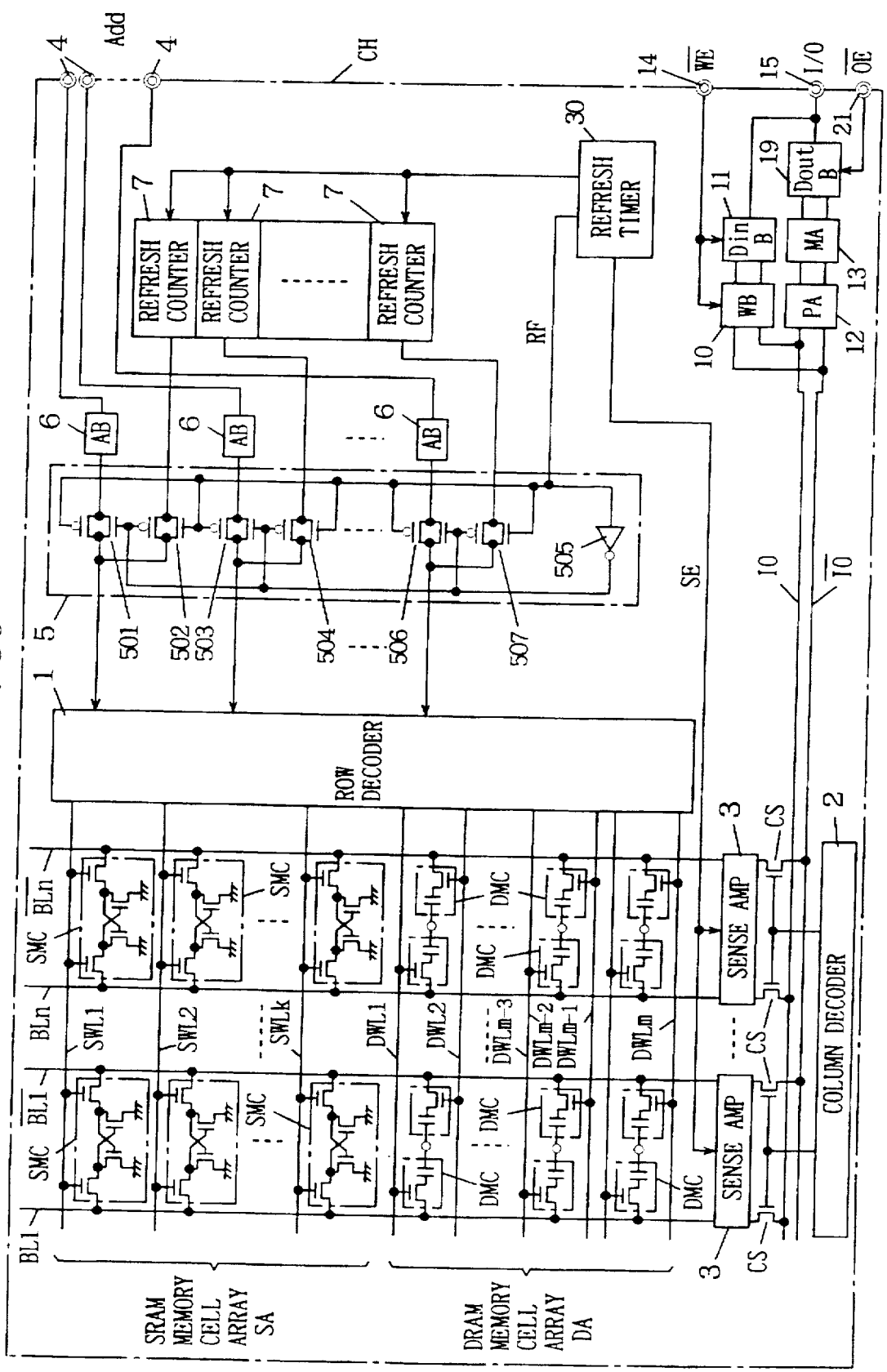
FIG. 36 is a block diagram illustrating a total structure of the semiconductor memory device depending on an embodiment 19 of the present invention.

FIG. 36 is a block diagram illustrating a total structure of the semiconductor memory device depending on an embodiment 19 of the present invention. Referring to FIG. 36, both SRAM memory cell SMC and DRAM memory cell DMC are connected to one bit line pair in this semiconductor memory device. In more details, a plurality of bit line pairs BL1, /BL1–BLn, /BLn are arranged and the SRAM word lines SWL1–SWLk and DRAM word lines DWL1–DWLm are arranged crossing these bit line pairs. A plurality of SRAM memory cells SMC are arranged corresponding to the intersecting points of the SRAM word lines SWL1–SWLK and bit line pairs BL1, /BL1–BLn, /BLn. Here, as the SRAM memory cell SMC, a no-load type memory cell shown in FIG. 11 is employed.

Moreover, the DRAM memory cells DMC are arranged corresponding to the intersecting points of the DRAM word lines DWL1–DWLm and bit line pairs BL1, /BL1–BLn, /BLn. Other structure is almost same as that of FIG. 2. However, the refresh timer of FIG. 36 also has the functions of not only the timer 9 but also the signal generating circuit 8 shown in FIG. 21.

In this semiconductor memory device, the row decoder 1 selects one of the word lines SWL1–SWLK and DWL1–DWLM responsive to the address Add supplied from an external circuit. For instance, when the SRAM word line SWL1 is selected, data is read to all bit line pairs BL1, /BL1–BLn, /BLn from all SRAM memory cells SMC connected to the word line SWL1.

Subsequently, the column decoder 2 selects one of the bit line pairs BL1, /BL1–BLn, /BLn. For instance, when the bit line pair BL1, /BL1 is selected, the data read to the bit line pair BL1, /BL1 is transferred to the data input/output line pair IO, /IO through the column selection gate CS. The data of this data input/output line pair IO, /IO is outputted to the external circuit through the preamplifier circuit 12, main amplifier circuit 13 and data output buffer circuit 19.

Moreover, when the row decoder 1 selects the DRAM word line DWL1, data is read to all bit line pairs BL1, /BL1–BLn, /BLn from all DRAM memory cell DMC connected to the word line DWL1. Subsequently, the sense amplifier 3 is activated responsive to the sense amp enable signal SE and amplifies and latches the data of the bit line pairs BL1, /BL1–BLn, /BLn.

Thereafter, when the column decoder 2 selects a bit line pair BL1, /BL1, the data of this bit line pair BL1, /BL1 is transferred to the data input/output line pair IO, /IO through the column selection gate CS. The data of this data input/output line pair IO, /IO is outputted to the external circuit through the preamplifier circuit 12, main amplifier circuit 13 and data output buffer circuit 19.

As will be obvious from this embodiment 19, the small number of SRAM memory cells SMC and the large number of DRAM memory cells DMC may be connected in common to one bit line pair.

[Embodiment 20]

Figure 37:
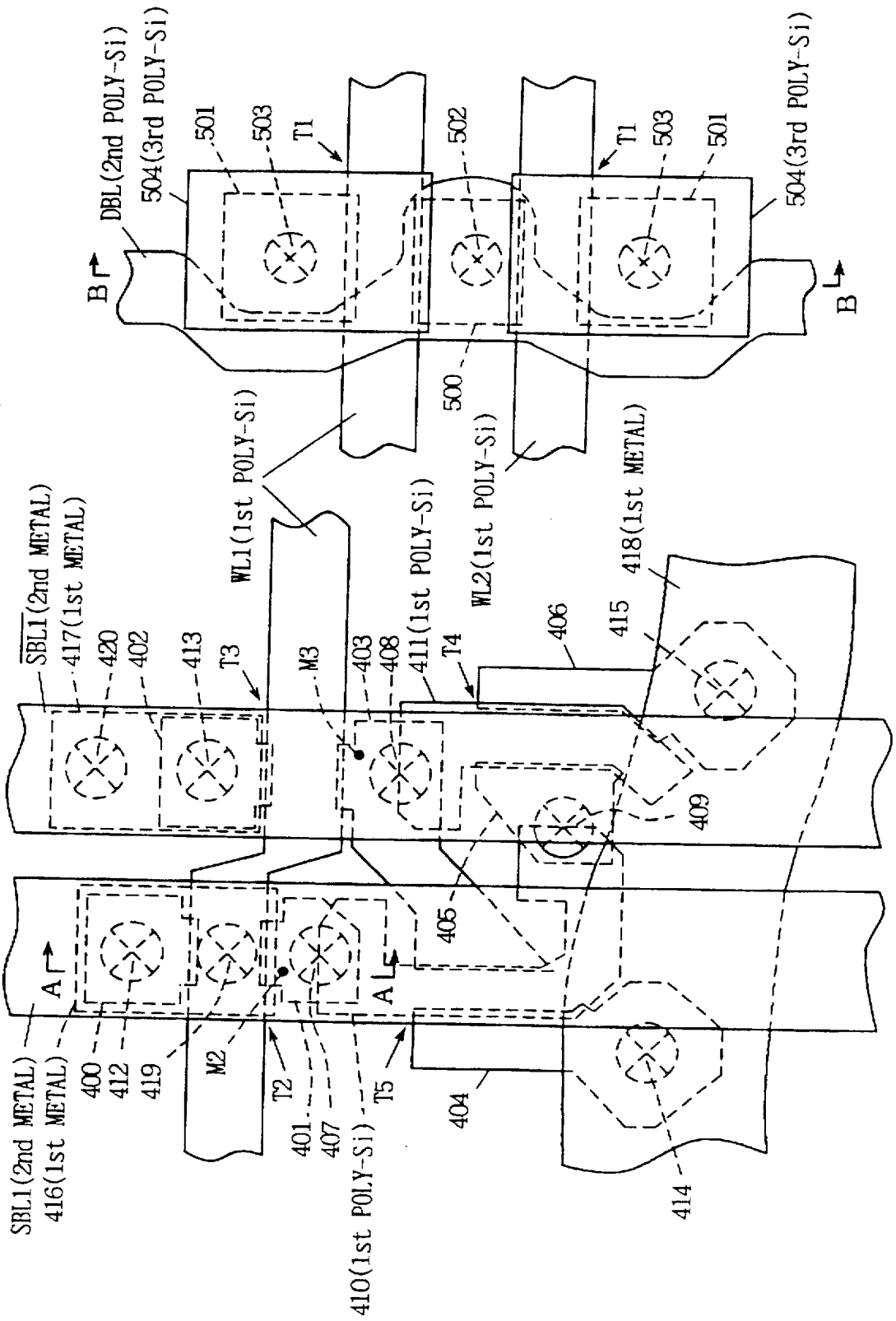
FIG. 37 is a plan view illustrating a structure of the memory cells in the semiconductor memory device depending on an embodiment 20 of the present invention.
Figure 38:
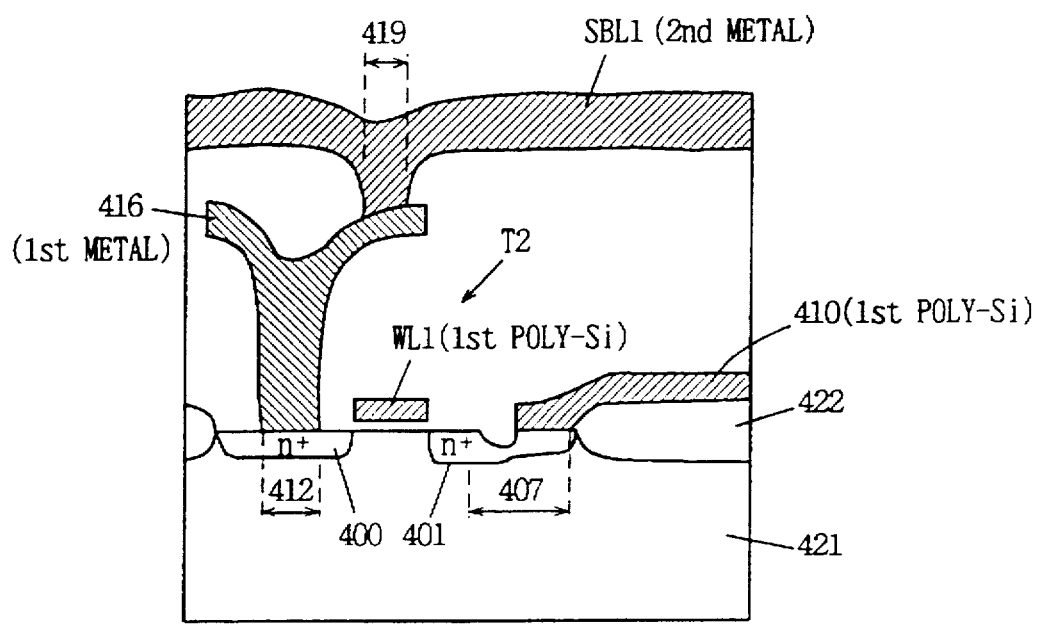
FIG. 38 is a cross-sectional view of FIG. 37 along the line A—A.
Figure 39:
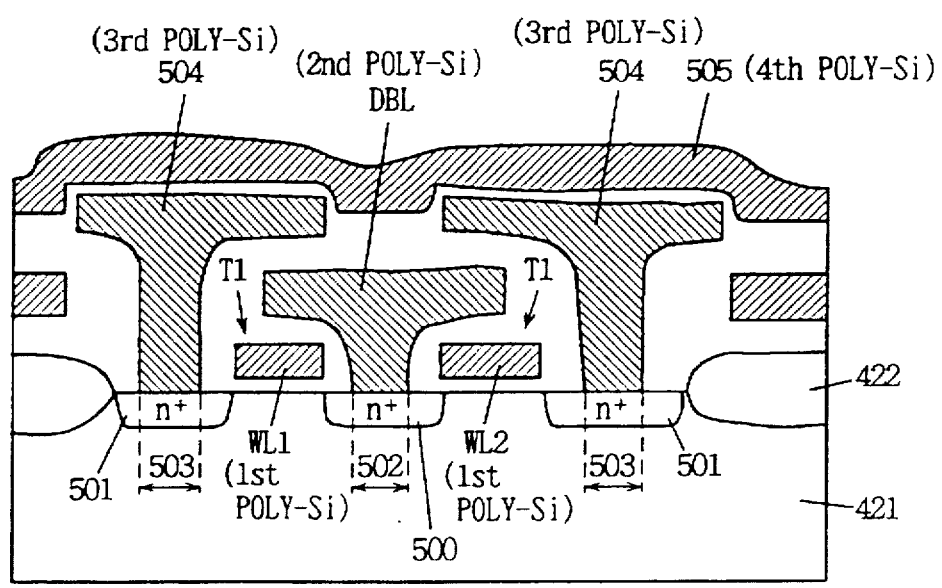
FIG. 39 is a cross-sectional view of FIG. 37 along the line B—B.
Figure 40:
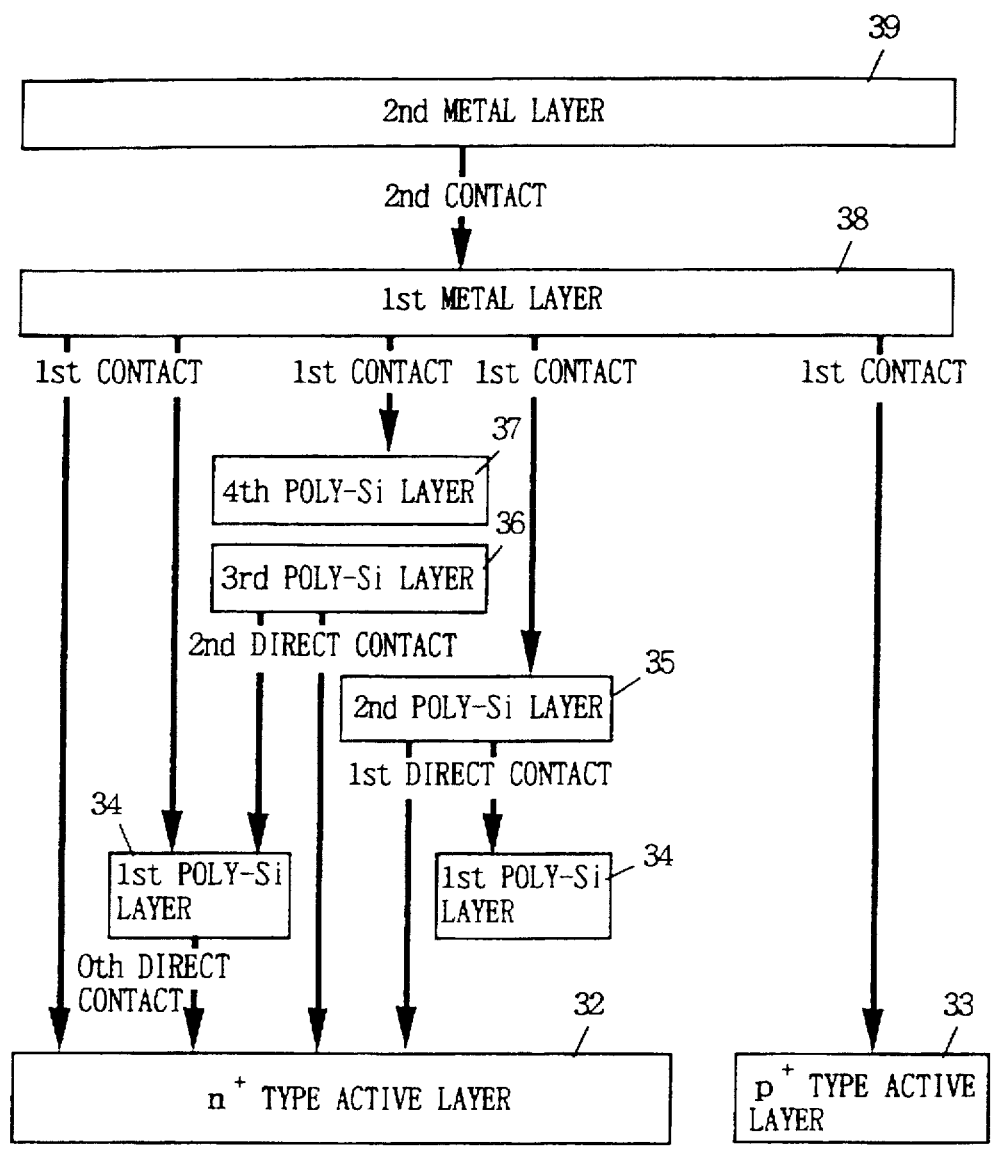
FIG. 40 is a diagram illustrating connections of wiring layers in the semiconductor memory device shown in FIG. 37.
Figure 41:
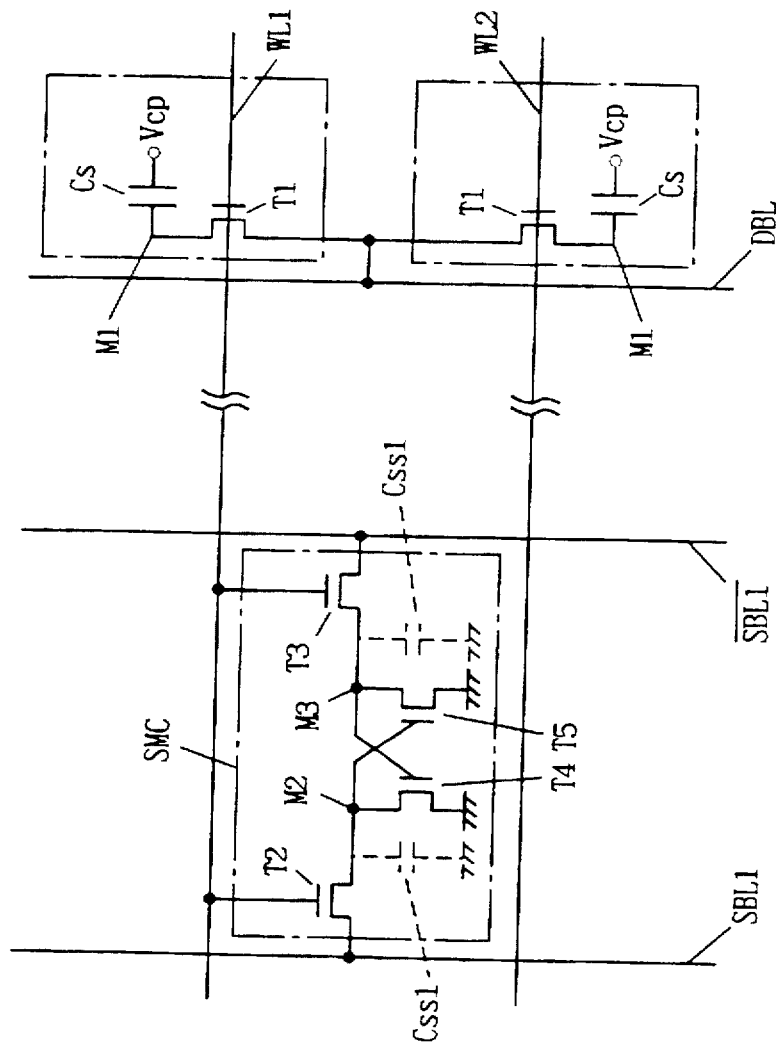
FIG. 41 is a circuit diagram illustrating a structure of the memory cell shown in FIG. 37.

FIG. 37 is a plan view illustrating a part of the structure of the semiconductor memory device depending on an embodiment 20 of the present invention. FIG. 38 is a cross-sectional view of FIG. 37 along the line A—A. FIG. 39 is a cross-sectional view of FIG. 37 along the line B—B. FIG. 40 indicates connection relationship of wiring layers through contact holes in the semiconductor memory device as a whole shown in FIG. 37. FIG. 41 is a circuit diagram illustrating a structure of the SRAM memory cell and DRAM memory cell shown in FIG. 37.

Referring to FIG. 37 to FIG. 39, the n+ type diffused layers 400–406, 500 and 501 are formed on a silicon substrate 421. The diffused layers 400 and 401 form a source/drain region of the access transistor T2 in FIG. 40. The diffused layers 402 and 403 form a source/drain region of the access transistor T3. The diffused layers 403 and 404 form respectively the drain and source regions of the driver transistor T5 of FIG. 40. The diffused layers 405 and 406 form respectively the drain and source regions of the driver transistor T4 of FIG. 40. The diffused layers 500 and 501 form a source/drain region of the access transistor T1 of FIG. 40. These diffused layers 400 to 406, 500 and 501 correspond to the n+ active layers 32. As shown in FIG. 40, the p+ active layer 33 is also formed on the silicon substrate 421, except for the memory cell areas.

Moreover, a first polysilicon layer 34 is formed on the silicon substrate 42 through a gate insulating film. The word lines WL1, WL2 and gate wirings 410, 411 are formed by etching the first polysilicon layer to the predetermined shape. One terminal of the gate wiring 410 is connected to the source/drain region 401 through a contact hole 407 (0th direct contact of FIG. 40). The other end of the gate wiring 410 is connected to the drain region 405 of the driver transistor T4 through a contact hole 409 (0th direct contact). The center area of the gate wiring 410 forms the gate electrode of the driver transistor T5. One end of the gate wiring 411 is connected to the source/drain region of the access transistor T3 through a contact hole 408 (0th direct contact). The center area of the gate wiring 411 forms the gate electrode of the driver transistor T4. The word lines WL1, WL2 form the gate electrodes of the access transistors T1–T3.

As shown in FIG. 40, a second polysilicon layer 35 is formed on the first polysilicon layer 34. The DRAM bit line DBL is formed by etching the second polysilicon layer 35 to the predetermined shape. The DRAM bit line DBL is connected to the source/drain region 500 of the access transistor T1 through a contact hole 502 (1st direct contact).

As shown in FIG. 40, a third polysilicon layer 36 is formed on the second polysilicon layer 35. A storage node 504 shown in FIG. 37 and FIG. 39 is formed by etching the third polysilicon layer 36 into the predetermined shape. The storage node 504 is connected to the source/drain region of the access transistor T1 through a contact hole 503 (2nd direct contact).

As shown in FIG. 40, a fourth polysilicon layer 37 is formed on the third polysilicon layer 36. A cell plate electrode 505 shown in FIG. 39 is formed by etching the fourth polysilicon layer 37 to the predetermined shape. This cell plate electrode 505 covers the storage node 504 through an insulating film. Therefore, the storage node 504 and cell plate electrode 505 form a cell capacitor Cs of FIG. 41.

As shown in FIG. 40, a first metal layer 38, for example, of aluminum is formed on the fourth polysilicon layer 37. The intermediate layers 416, 417 and ground wiring 418 shown in FIG. 37 and FIG. 38 are formed by etching the first metal layer 38 into the predetermined shape. The intermediate layer 418 is connected to the source/drain region 400 of the access transistor T2 through a contact hole 412 (1st contact). The intermediate layer 417 is connected to the source/drain region of the access transistor T3 through a contact hole 4 (1st contact). Moreover, the ground wiring 418 is connected to the source region 404 of the driver transistor T5 through a contact hole 414 and is also connected to the source region 406 of the driver transistor T4 through a contact hole 415 (1st contact).

As shown in FIG. 40, a second metal layer 39, for example, of aluminum is formed on the first metal layer 38.

The SRAM bit lines SBL1 and /SBL1 shown in FIG. 37 and FIG. 38 are formed by etching the second metal layer 39 into the predetermined shape. The bit line SBL1 is connected to the intermediate layer 416 through a contact hole 419 (2nd contact). The bit line /SBL1 is connected to the intermediate layer 417 through a contact hole 420 (2nd contact). A LOCOS oxide film 422 is formed on the source/drain region of transistor and the region other than that under the gate electrode.

In such SRAM memory cell, a load resistance connected to the memory nodes M2, M3 is not formed. However, as shown in FIG. 41, since the memory nodes M2, M3 respectively have a parasitic capacitance Css1, data is held in this parasitic capacitance Css1. Since this SRAM memory cell SMC has no load resistance, its occupation area is rather small.

Next, a method of forming the memory cells SMC and DMC used in the semiconductor memory device will then be explained with reference to FIG. 42.

Figure 43A:
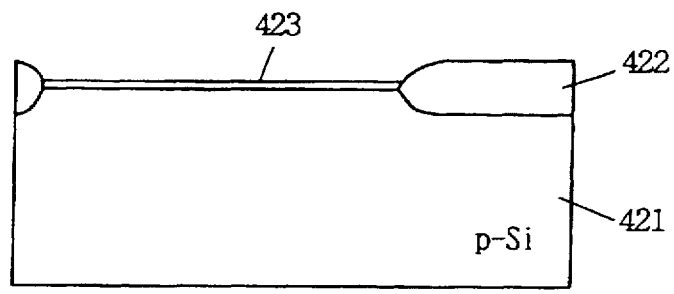
FIG. 43A to FIG. 43C are process diagrams practically illustrating the processing steps S2 and S3 of FIG. 42.

In the step S1, the predetermined region of the silicon substrate 421 is thermally oxidized to form a LOCOS oxide film 422. The region other than that where the LOCOS oxide film 422 is formed becomes a field region of a transistor. After the LOCOS oxide film 422 is formed, the surface of the silicon substrate 421 is thermally oxidized as shown in FIG. 43A and thereby a thin gate oxide film 423 is formed on the silicon substrate 421.

Figure 43B:
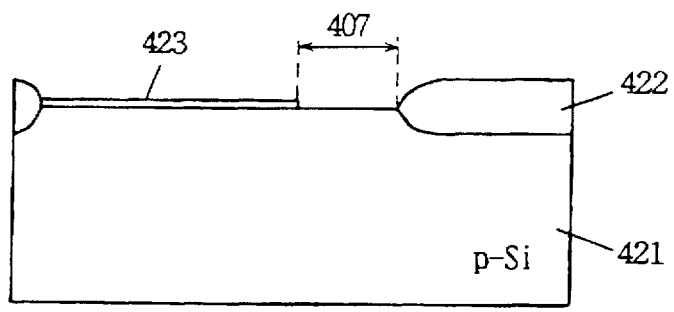
Figure 71:
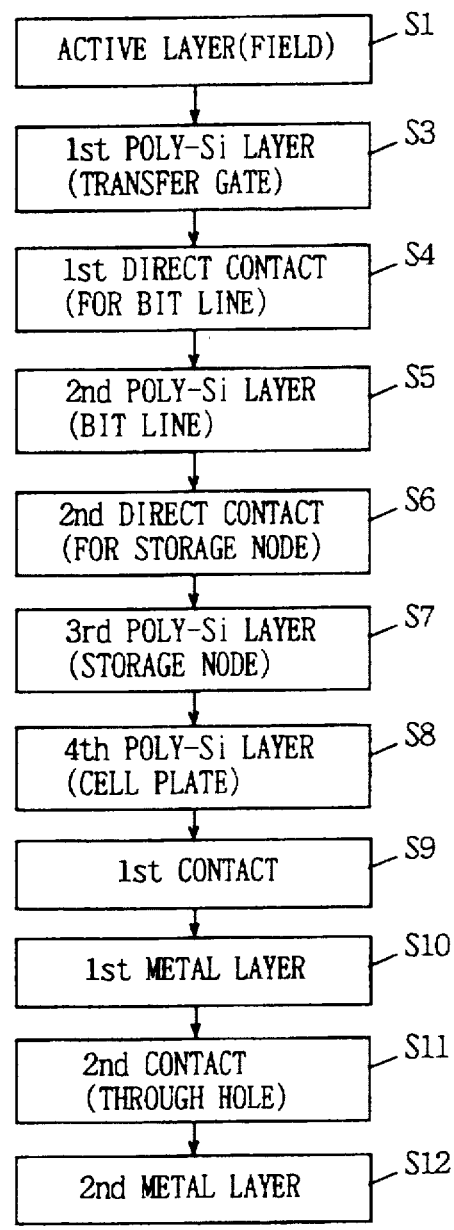
FIG. 71 is a process diagram indicating an ordinary method of manufacturing DRAM.

Successively, before the first polysilicon layer is formed in the step S3 like the DRAM manufacturing process shown in FIG. 71, a contact hole 407 is formed in the predetermined position of the gate oxide film 423 as shown in FIG. 43B in the step S2. The contact holes 408 and 409 are also formed simultaneously with this contact hole 407.

Figure 43C:
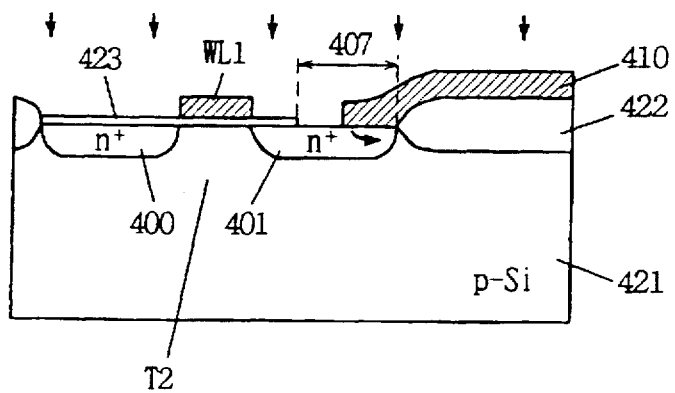

Subsequently, the first polysilicon layer is formed on the gate insulating film 423 in the step S3. The first polysilicon layer is etched into the predetermined shape by the photo resist method and thereby the word line WL1 and a gate wiring 410 are formed as shown in FIG. 43C. The word line WL2 and gate wiring 411 shown in FIG. 37 are also formed simultaneously with the word line WL1. After the word line WL1 is formed, donner impurity is implanted to the surface of silicon substrate 421 as shown in FIG. 43C and thereby the n+ type diffused layers (source/drain regions) 400 and 401 are formed. The n+ type diffused layers 402–406, 501 and 502 are also formed simultaneously with the diffused layer 400. In FIG. 43C, the diffused layer 401 is also formed under the gate wiring 410 because the implanted impurity also diffuses thermally to the area under the gate wiring 410. Thereby, the source/drain region 401 of the access transistor T2 is connected with the gate wiring 410 within the contact hole 407.

Thereafter, after an interlayer insulating film is formed on the first polysilicon layer, a contact hole 502 is formed at the predetermined position of the interlayer insulating film in the step S4.

In the step S5, a second polysilicon layer is formed on the interlayer insulating film. This second polysilicon layer is etched to the predetermined shape by the photoresist method and thereby the DRAM bit line DBL is formed. Therefore, the bit line DBL is connected with the source/drain region 500 of the access transistor T1 through the contact hole 502.

In the step S6, another interlayer insulating film is formed on the second polysilicon layer and a contact hole 503 is then formed at the predetermined position on this interlayer insulating film.

In the step S7, a this polysilicon layer is formed on the interlayer insulating film. This third polysilicon layer is also etched to the predetermined shape by the photoresist method and thereby the storage node 504 is formed. Therefore, the storage node 504 is connected with the source/drain region 501 of the access transistor T1 through the contact hole 503.

In the step S8, another interlayer insulating film is further formed on the third polysilicon layer and a fourth polysilicon layer is further formed. This fourth polysilicon layer is also etched into the predetermined shape by the photoresist method, thereby forming a cell plate electrode 505.

In the step S9, another interlayer insulating film is further formed on the fourth polysilicon layer and contact holes 412–415 are also formed at the predetermined position of the interlayer insulating film.

In the step S10, a first metal layer is formed on the interlayer insulating film explained above. This first metal layer is also etched to the predetermined shape by the photoresist method to form the intermediate layers 416, 417 and the ground wiring 418. Therefore, the intermediate layer 416 is connected to the source/drain region 400 of the access transistor T2 through a contact hole 412. Moreover, the intermediate layer 417 is connected to the source/drain region 402 of the access transistor T3 through the contact hole 413. Moreover, the ground wiring 418 is connected to the source region 404 of the driver transistor T5 through the contact hole 414 and is also connected to the source region 406 of the driver transistor T4 through the contact hole 415.

In the step S11, another interlayer insulating film is further formed on the first metal layer and contact holes 419 and 420 are formed at the predetermined positions of this interlayer insulating film.

In the step S12, a second metal layer is formed on he interlayer insulating film explained above. This second metal layer is also etched to the predetermined shape by the photoresist layer and thereby the SRAM bit lines SBL1 and /SBL1 are formed. Accordingly, the bit line SBL1 is connected to the intermediate layer 415 through the contact hole 419. Moreover, the bit line /SBL1 is connected to the intermediate layer 417 through the contact hole 420.

According to this embodiment 20, since the end portions of the gate wirings 410, 411 are respectively connected respectively to the source/drain regions 401, 403, 405 through the contact holes 407 to 409 formed on the gate insulating film, the SRAM memory cell SMC can be formed with simplified processes. Moreover, the SRAM memory cell SMC can be formed simultaneously with formation of the DRAM memory cell DMC.

[Embodiment 21]

Figure 44:
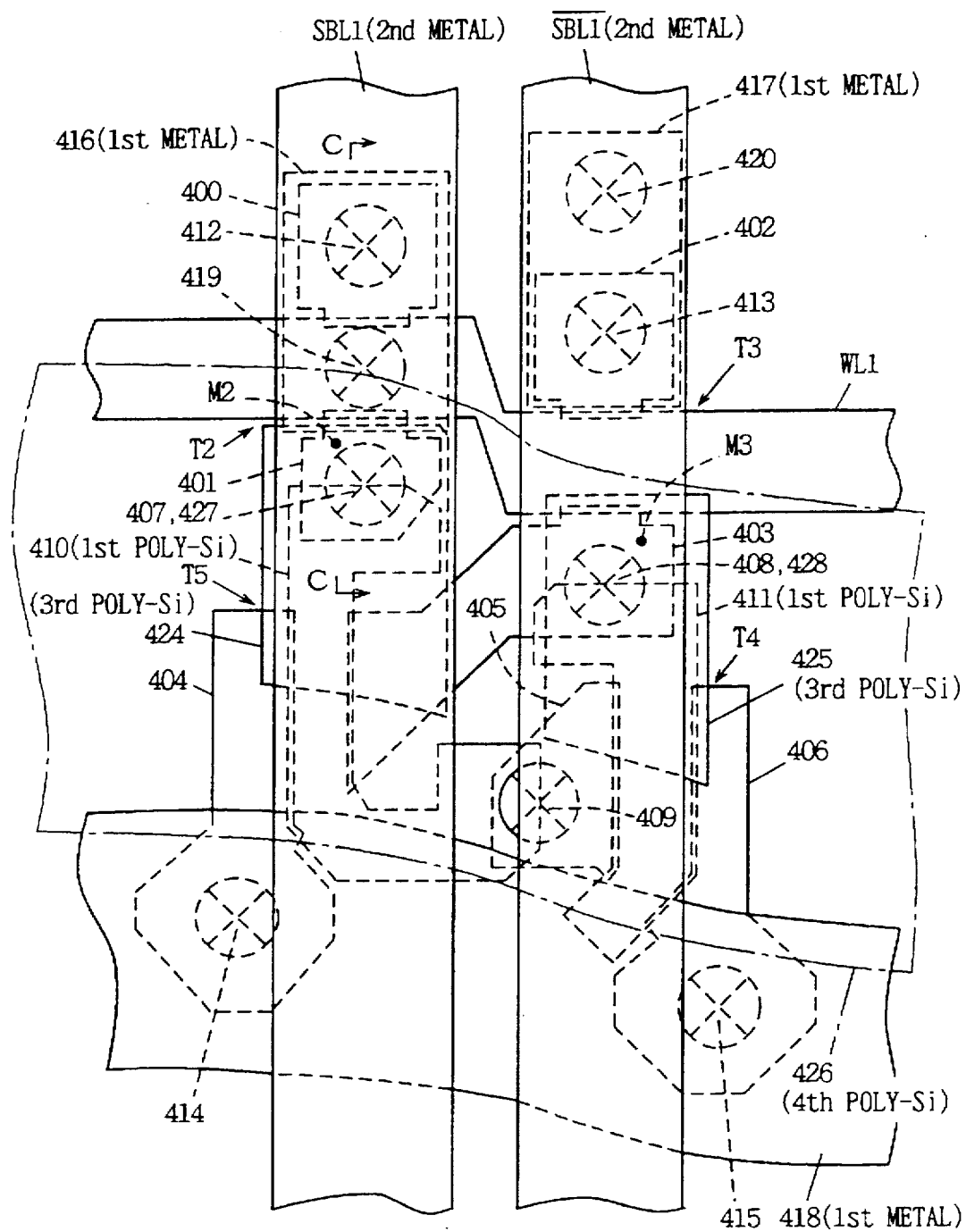
FIG. 44 is a plan view illustrating a structure of the memory cell in the semiconductor memory device depending on an embodiment 21 of the present invention.
Figure 45:
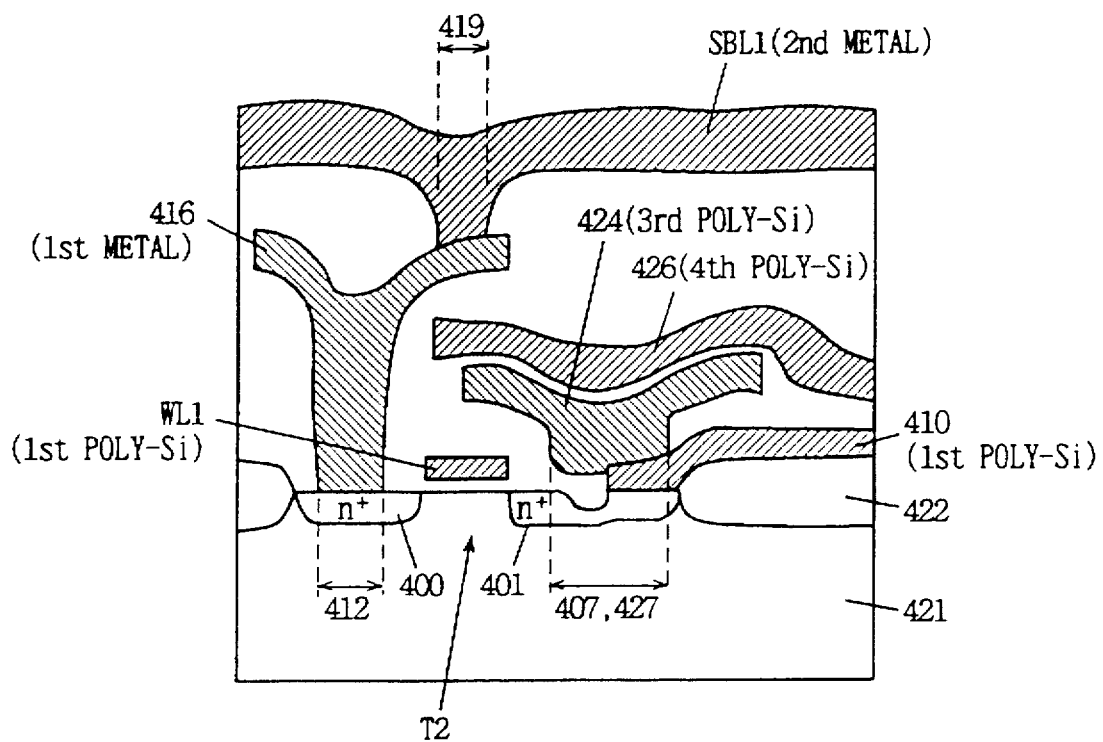
FIG. 45 is a cross sectional view of FIG. 44 along the line C—C.
Figure 46:
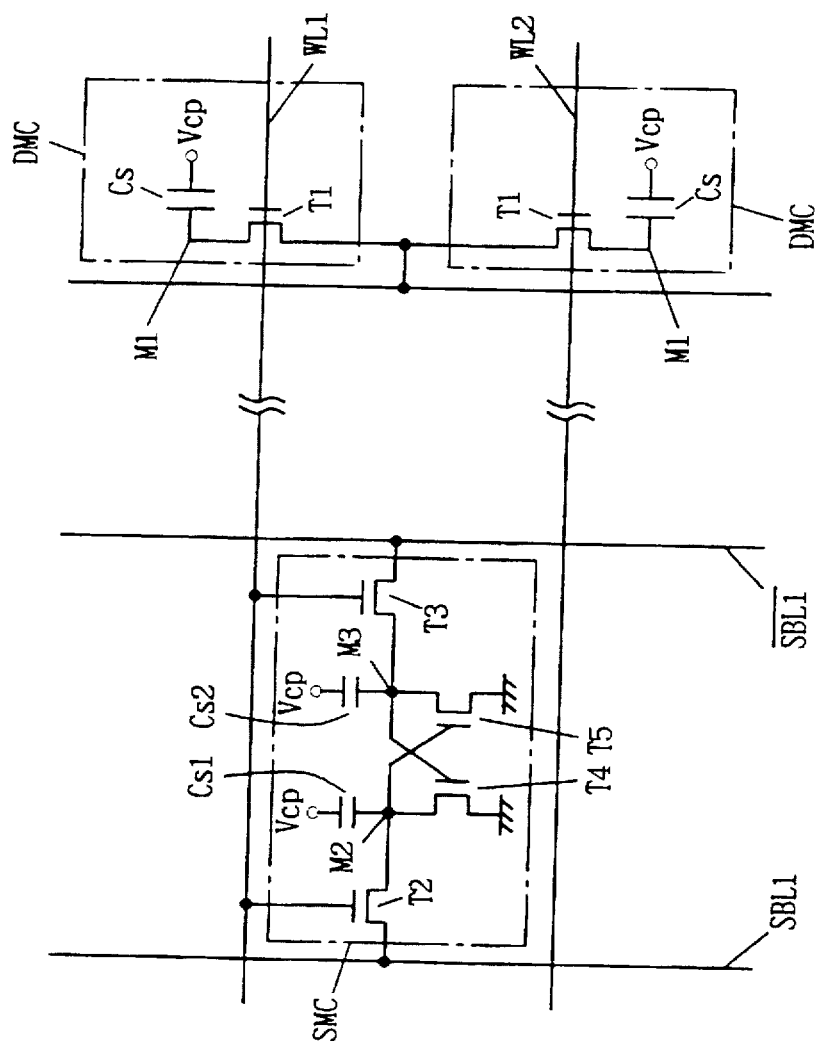
FIG. 46 is a circuit diagram illustrating a structure of the memory cell shown in FIG. 44.

FIG. 44 is a plan view illustrating a structure of the SRAM memory cell in the semiconductor memory device depending on an embodiment 21 of the present invention. FIG. 45 is a cross-sectional view of FIG. 44 along the line C—C. FIG. 46 is a circuit diagram illustrating a structure of the SRAM memory cell shown in FIG. 44.

With reference to FIG. 44 and FIG. 45, the storage nodes 424 and 425 and cell plate electrode 426 are formed in this embodiment 21, unlike the memory cell shown in FIG. 37 to FIG. 39. The storage node 424 in the third polysilicon layer is connected to the gate wiring 410 through the contact hole 427. Moreover, the storage node 425 is connected to the gate wiring 411 through the contact hole 428. These storage nodes 424 and 425 are covered with the cell plate electrode 426 in the fourth polysilicon layer through an insulating film. Therefore, the storage node 424 and cell plate electrode 426 form a cell capacitor Cs1 shown in FIG. 46. Moreover, the storage node 425 and cell plate electrode 426 form a cell capacitor Cs2. The predetermined cell plate potential Vcp is applied to the cell plate electrode 426.

Next, a method of forming the storage nodes 424 and 425 will then be explained.

Figure 47A:
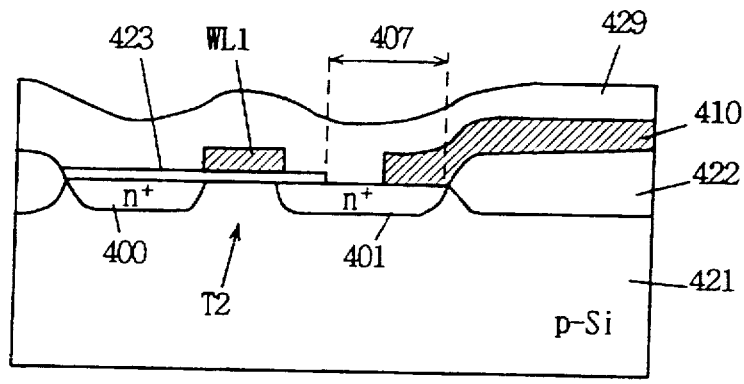
FIG. 47A to FIG. 47C are process diagrams illustrating a method of manufacturing the memory cell shown in FIG. 44.

As shown in FIG. 47A, the word line WL1, gate wiring 410 are formed and after the source/drain regions 400, 401 are formed, an interlayer insulating film 429 is formed.

Figure 47B:
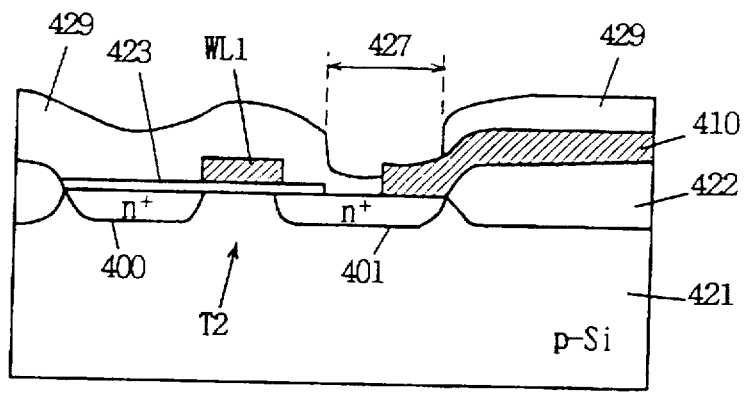

Successively, as shown in FIG. 47B, a contact hole 427 is formed at the predetermined position of the interlayer insulating film 429, here, at the same position as the contact hole 407. Thereby, the end part of the gate wiring 410 is exposed. The contact hole 428 shown in FIG. 44 is also formed at the same position as the contact hole 408.

Figure 47C:
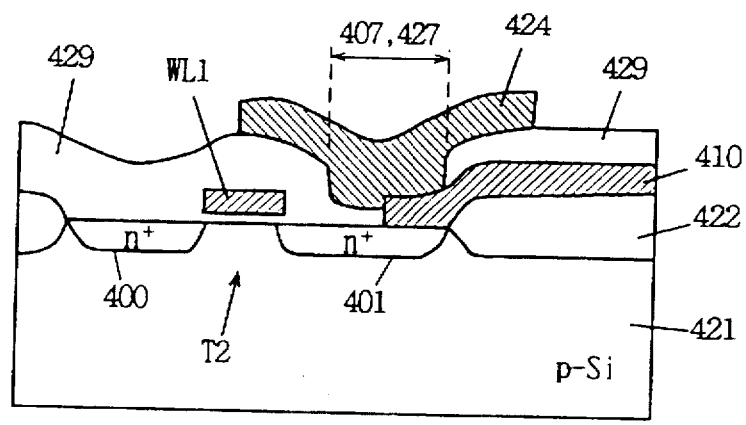

As shown in FIG. 47C, the third polysilicon layer is formed on the interlayer insulating film 429. This third polysilicon layer is etched to the predetermined shape by the photoresist method. Thereby, the storage nodes 424, 425 are formed. Accordingly, the storage node 424 is connected to the gate wiring 410 through the contact hole 427. Moreover, the storage node 425 is connected to the gate wiring 411 through the contact hole 428.

Next, a thin insulating film is formed on the storage nodes 424 and 425 and moreover the fourth polysilicon layer is also formed thereon. This fourth polysilicon layer is also etched to the predetermined shape by the photoresist method to form a cell plate electrode 426.

According to the embodiment 21, the storage nodes 424, 425 are formed in the memory nodes M2, M3 and moreover since the storage nodes 424, 425 are covered with the cell plate electrode 426, a large amount of charges is stored in the memory nodes M2, M3. Therefore, this SRAM memory cell SMC can store the data for a longer period than the memory cell SMC shown in FIG. 28. Moreover, so-called soft-error which results in inversion of the logic of data with $a_1$ particles emitted from a package can be reduced. Therefore, the larger the area of the storage nodes 424, 425, the more the data storing performance is improved and the more the soft-error is reduced.

Here, it is preferable that a larger storage node 424 is formed so that a capacitance between the storage node 424 and cell plate 426 becomes larger than the capacitance between the gate wiring 410 and cell plate 426. It is also preferable that a capacitance between the storage node 425 and cell plate 426 is larger than the capacitance between the gate wiring 411 and cell plate 426, because if a capacitance in relation to the storage node is smaller than the capacitance in relation to the gate wiring, the effect of improving data storing performance which can be obtained by forming the storage node cannot be demonstrated sufficiently.

[Embodiment 22]

Figure 48:
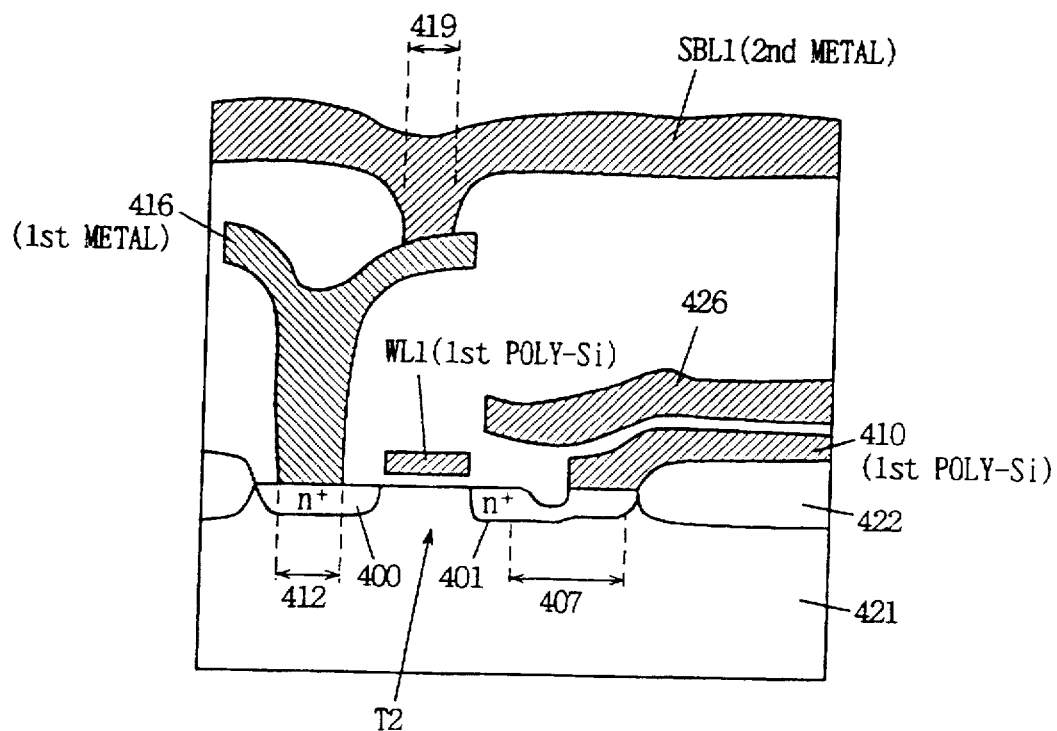
FIG. 48 is a part of the cross sectional view of the memory cell in the semiconductor memory device depending on an embodiment 22 of the present invention.

FIG. 48 is a cross-sectional view of the SRAM memory cell in the semiconductor memory device depending on an embodiment 22 of the present invention and corresponds to FIG. 45. As shown in FIG. 48, a cell plate electrode 426 may be formed on the gate wiring 410 through a thin insulating film. Namely, the storage node 424 of FIG. 45 is not particularly required to be formed.

According to this embodiment 22, a capacitance of the memory nodes M2, M3 becomes smaller than that of the embodiment 1, but since it is not required to form the storage node, the manufacturing process can be simplified.

[Embodiment 23]

Figure 49:
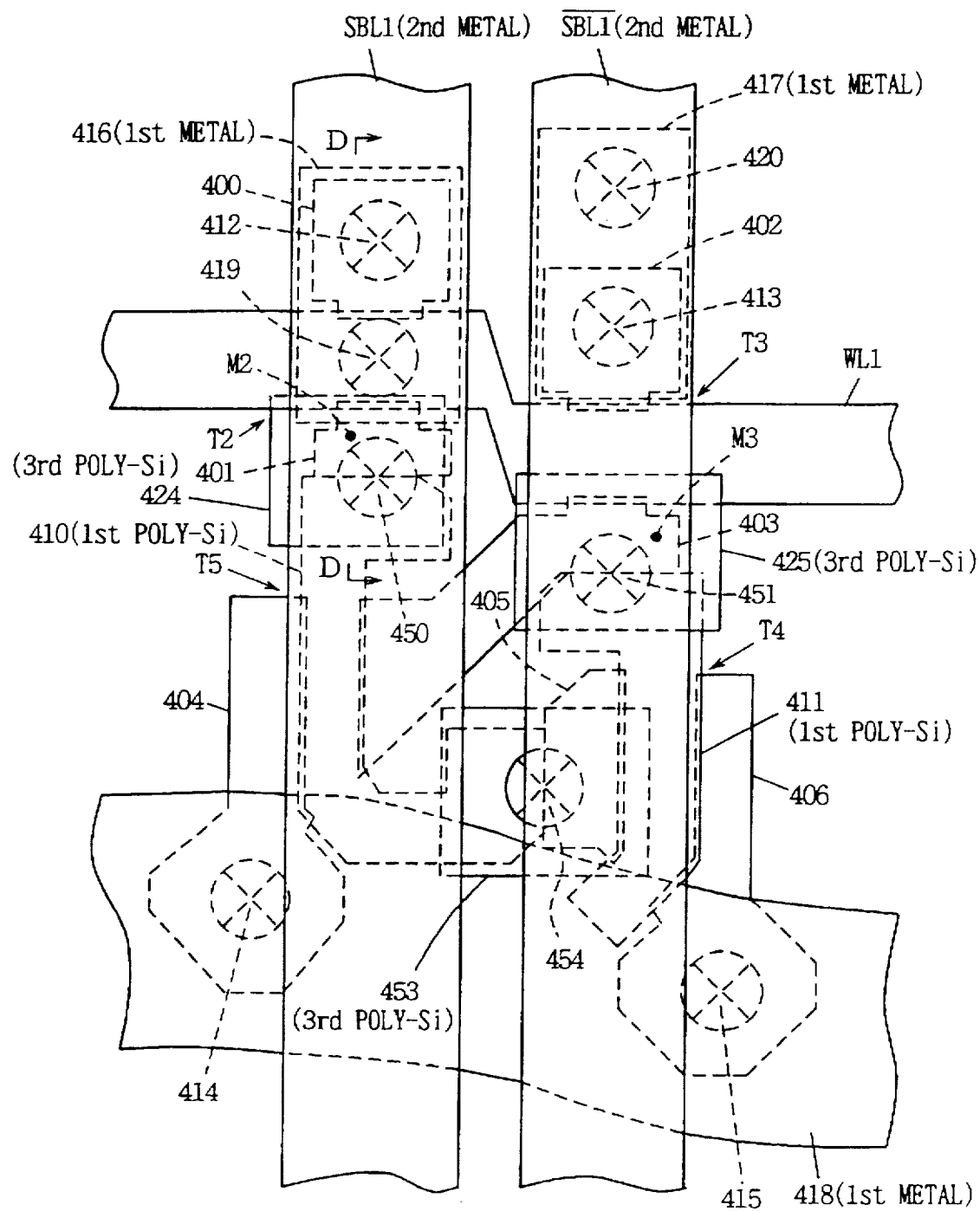
FIG. 49 is a plan view illustrating a structure of the memory cell in the semiconductor memory device depending on an embodiment 23 of the present invention.
Figure 50:
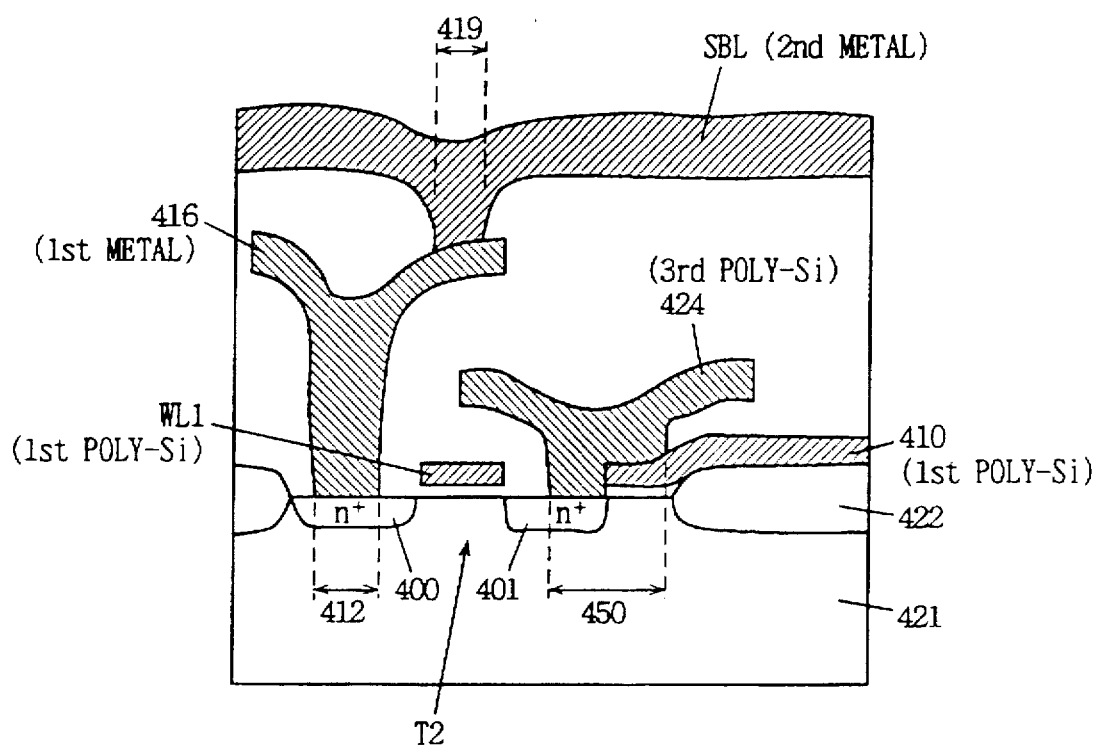
FIG. 50 is a cross sectional view of FIG. 49 along the line D—D.

FIG. 49 is a plan view illustrating a structure of the SRAM memory cell in the semiconductor memory device depending on an embodiment 23 of the present invention. FIG. 50 is a cross-sectional view of FIG. 49 along the line D—D.

With reference to FIG. 29 and FIG. 50, unlike FIG. 45, the storage nodes 424, 425 and 453 are formed on the contact holes 450, 451 and 454 in the SRAM memory cell depending on this embodiment 23. Therefore, one end of the gate wiring 410 is connected to the source/drain region 401 through the storage node 424 in the contact hole 450. The other end of the gate wiring 410 is connected to the drain region 405 through the storage node 453 in the contact hole 454. The gate wiring 411 is connected to the source/drain region 403 through the storage node 425 in the contact hole 451. The cell plate electrode 426 of FIG. 45 is not formed.

Next, a method of forming such SRAM memory cell will be explained hereunder with reference to FIG. 51 and FIG. 52.

Figure 51A:
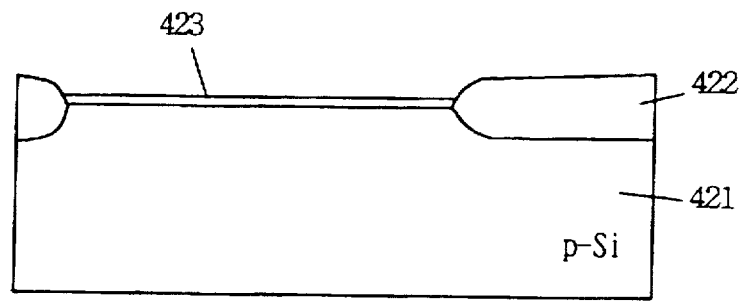
FIG. 51A to FIG. 51C are process diagrams illustrating a method of manufacturing the memory cell shown in FIG. 49.

As shown in FIG. 51A, a LOCOS oxide film 422 is formed in the predetermined area of the silicon substrate 421 and moreover a thin gate insulating film 423 is formed on the silicon substrate 421.

Figure 51B:
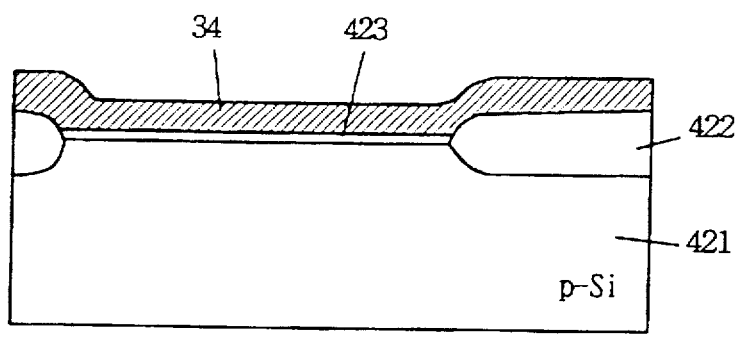

Thereafter, as shown in FIG. 51B, a first polysilicon layer 34 is formed to cover the LOCOS oxide film 422 and gate insulating film 423.

Figure 51C:
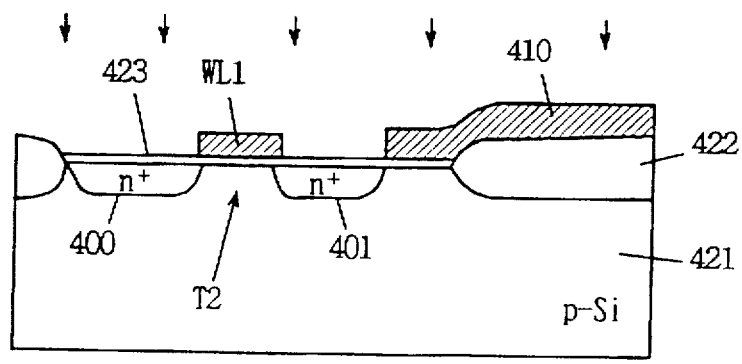

Next, as shown in FIG. 51C, the first polysilicon layer 34 is etched into the predetermined shape by the photoresist method and thereby the word line WL1 and gate wiring 410 are formed. Then, donner impurity is implanted to the surface of the silicon substrate 421, thereby to form the source/drain regions 400 and 401.

Figure 52A:
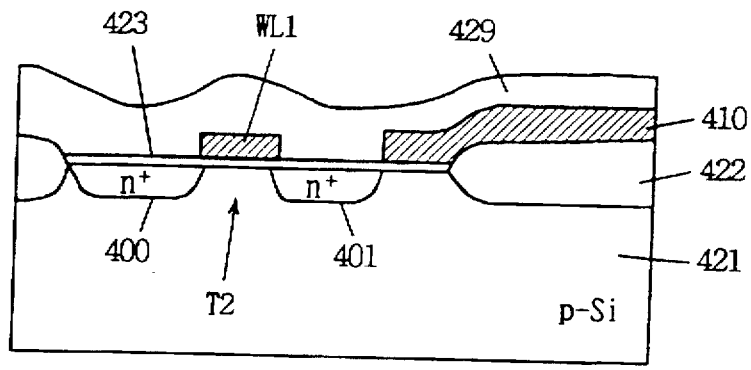
FIG. 52A to FIG. 52C are diagrams illustrating the next process of FIG. 51.

Next, as shown in FIG. 52A, an interlayer insulating film 429 is formed to cover the word line WL1 and gate wiring 410.

Figure 52B:
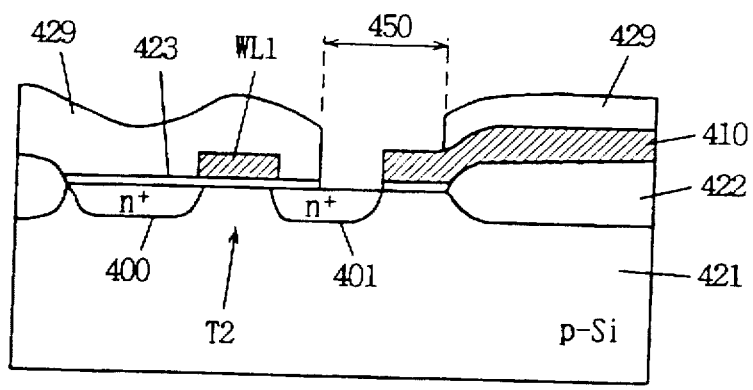

Subsequently, as shown in FIG. 52B, a contact hole 450 is formed at the predetermined position of the interlayer insulating film 429, that is, at the boundary of the source/drain region 401 of the access transistor T2 and the gate wiring 410. Thereby, the end portion of the gate wiring 410 is exposed and the source/drain region 401 of the access transistor T2 is also exposed.

Figure 52C:
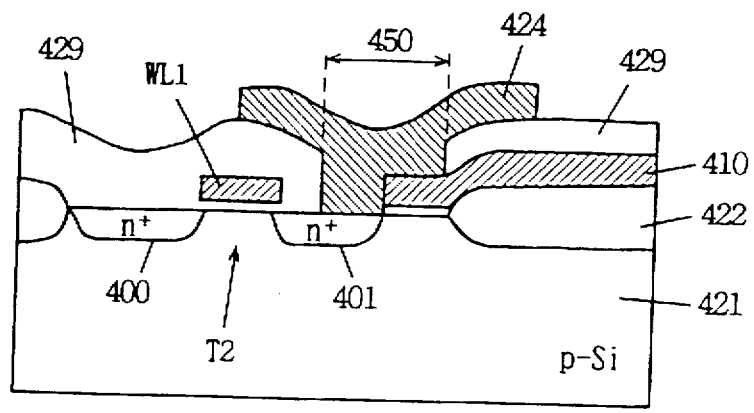

Next, a third polysilicon layer is formed on the interlayer insulating film 429 and the third polysilicon layer is etched to the predetermined shape by the photoresist method as shown in FIG. 52C. Thereby, the storage node 424 is formed. Therefore, the storage node 424 is connected to the gate wiring 410 through the contact hole 450 and is also connected to the source/drain region 401 of the access transistor T2. Therefore, the gate wiring 410 is connected to the source/drain region 401 of the access transistor T2 through the storage node 424.

According to the embodiment 23, since the gate wiring 410 is connected to the source/drain region 410 only by forming one contact hole 450 in the interlayer insulating film 429, the manufacturing process can be more simplified than that of the embodiments explained previously. Moreover, the gate wiring can be reliably connected to the source/drain region 401 even when the source/drain region 401 is not diffused under the gate wiring 410.

[Embodiment 24]

Figure 53:
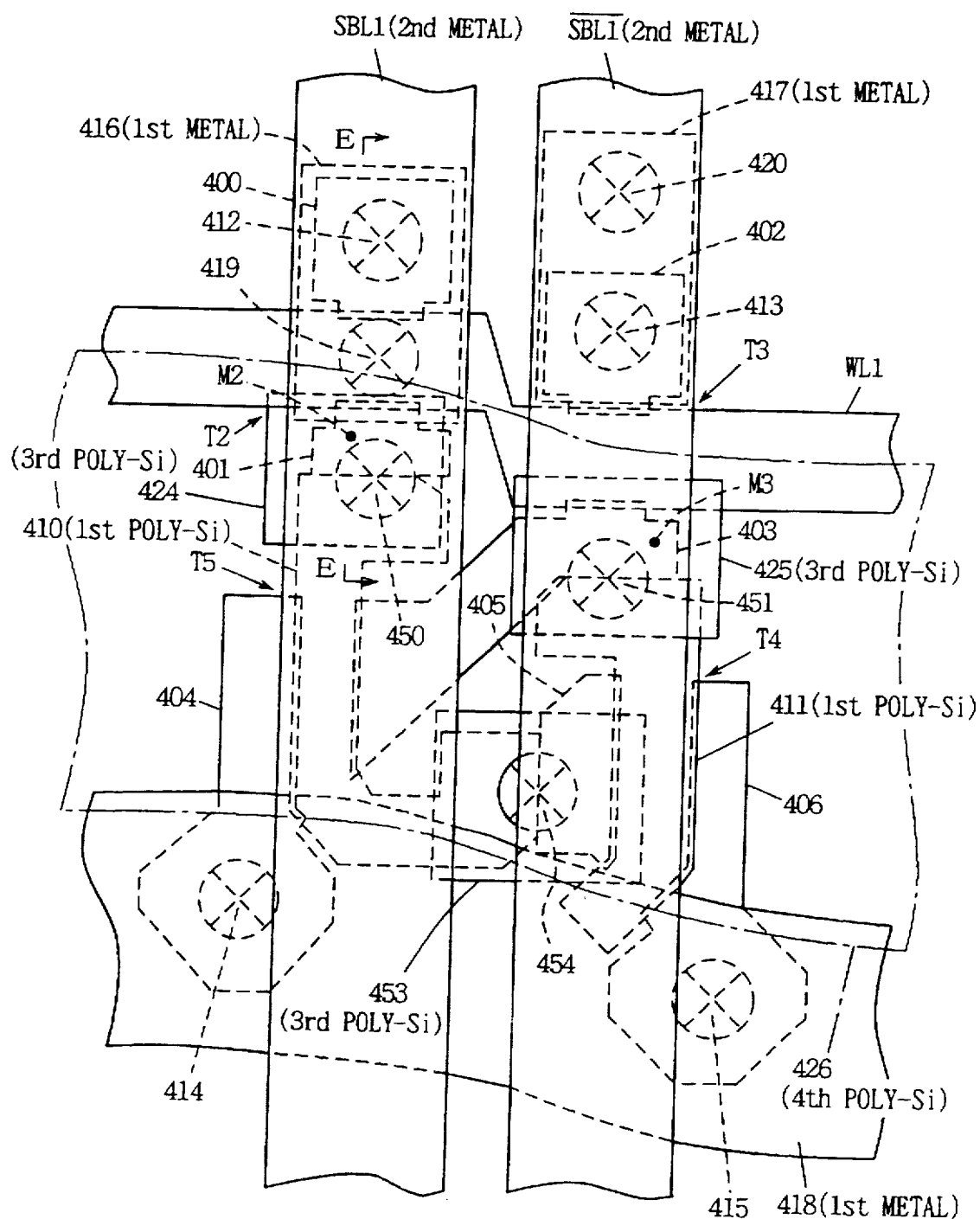
FIG. 53 is a plan view illustrating a structure of the memory cell in the semiconductor memory device depending on an embodiment 24 of the present invention.
Figure 54:
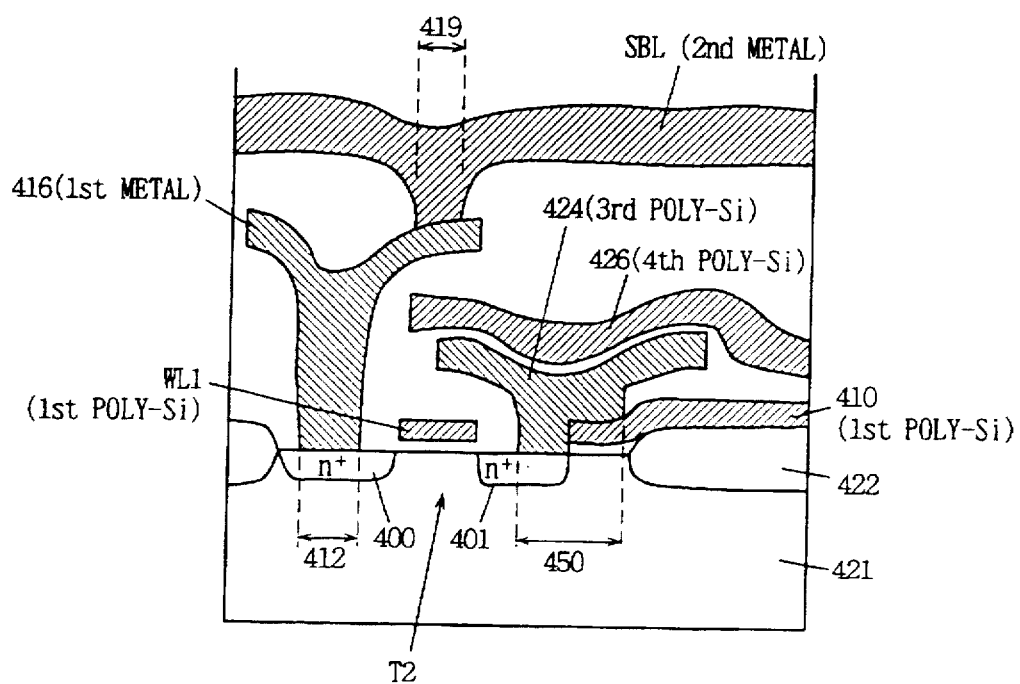
FIG. 54 is a cross sectional view of FIG. 53 along the line E—E.

FIG. 53 is a plan view illustrating a structure of the SRAM memory cell in the semiconductor memory device depending on an embodiment 24 of the present invention. FIG. 54 is a cross-sectional view of FIG. 53 along the line E—E.

With reference to FIG. 53 and FIG. 54, different from FIG. 29 and FIG. 50, the storage nodes 424 and 425 are covered with a cell plate electrode 426 through a thin insulating film in the embodiment 24. Therefore, a capacitance of the memory nodes M2 and M3 becomes larger than that of FIG. 49 and FIG. 50. Therefore, the data storing performance of the SRAM memory cell can be improved.

[Embodiment 25]

Figure 55:
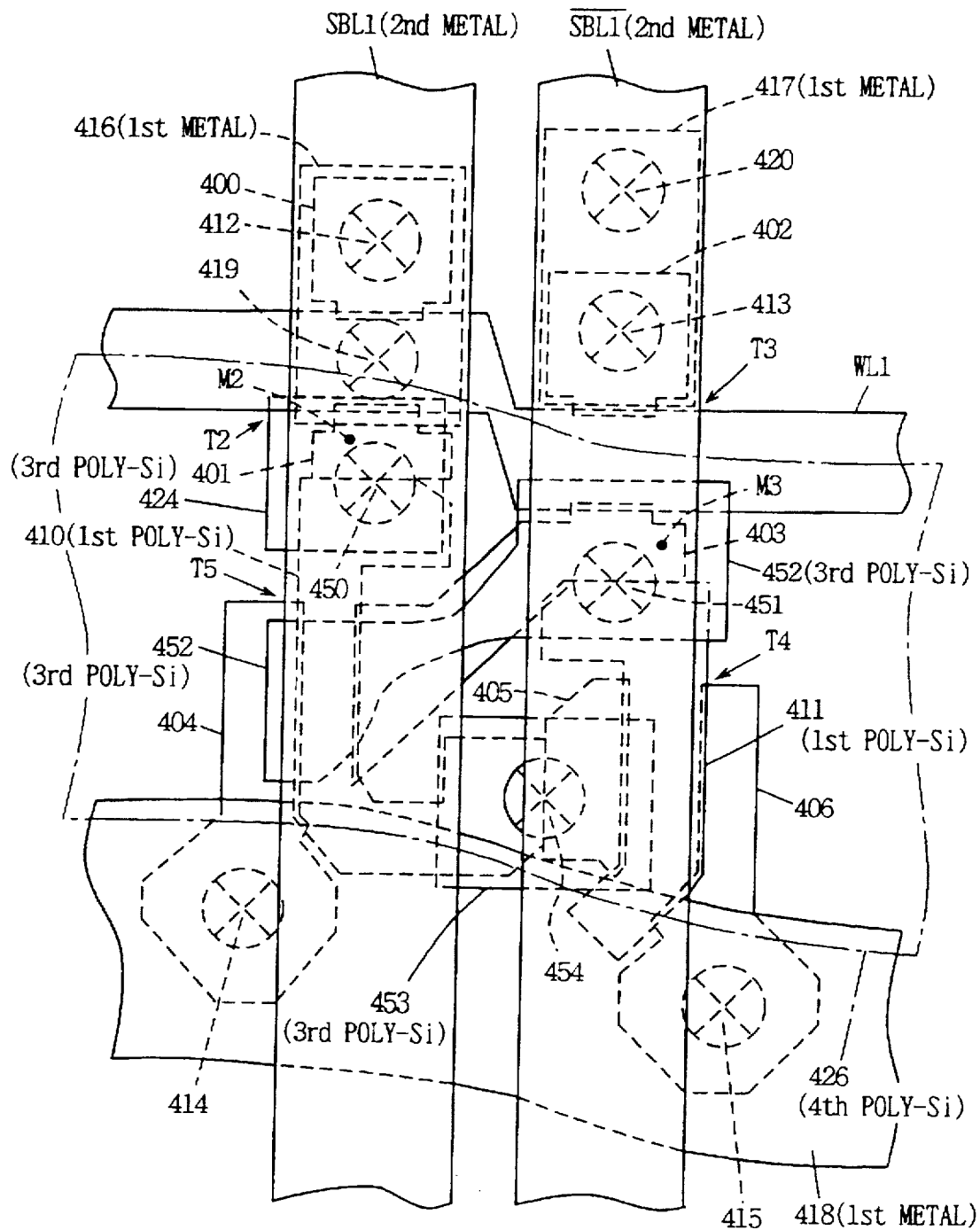
FIG. 55 is a plan view illustrating a structure of the memory cell in the semiconductor memory device depending on an embodiment 25 of the present invention.

FIG. 55 is a plan view illustrating a structure of the SRAM memory cell in the semiconductor memory device depending on an embodiment 25 of the present invention. Referring to FIG. 55, the storage node 452 is extended, different from FIG. 53, up to the area above the driver transistor T5 in the SRAM memory cell of the embodiment 25.

In the embodiment 24 of FIG. 53, two storage nodes 424, 453 are connected to the memory node M2, while only one storage node 425 is connected to the memory node M3. Therefore, the capacitance of the memory node M2 is larger than the capacity of the memory node M3.

Meanwhile, in the embodiment 25, since the storage node 452 connected to the memory node M3 is extended up to the area above the driver transistor T5, the capacitance of the memory node M3 is almost equal to the capacitance of the memory node M2. Therefore, data can be held in good balance in the memory nodes M2 and M3.

[Embodiment 26]

Figure 56:
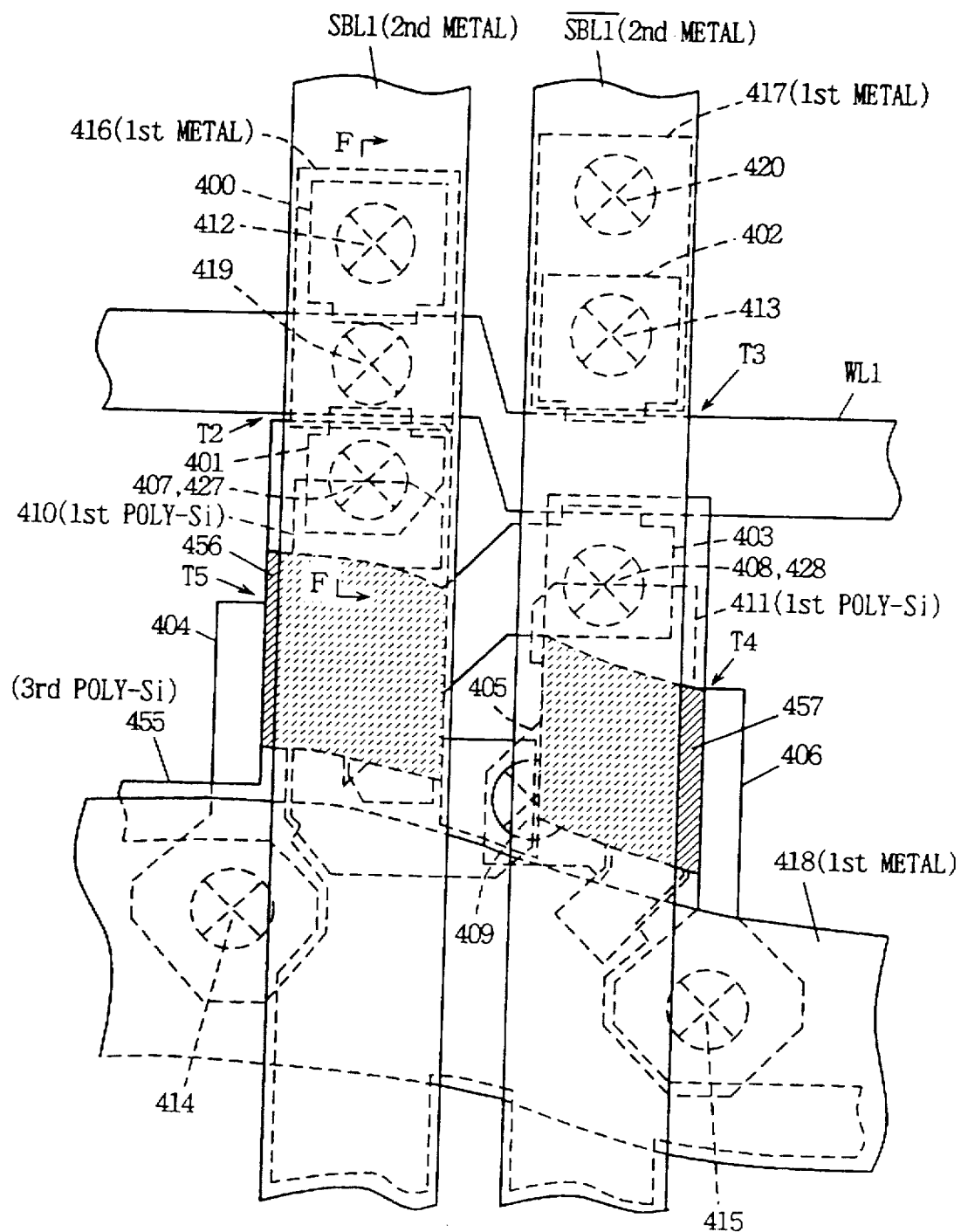
FIG. 56 is a plan view illustrating a structure of the memory cell in the semiconductor memory device depending on an embodiment 26 of the present invention.
Figure 57:
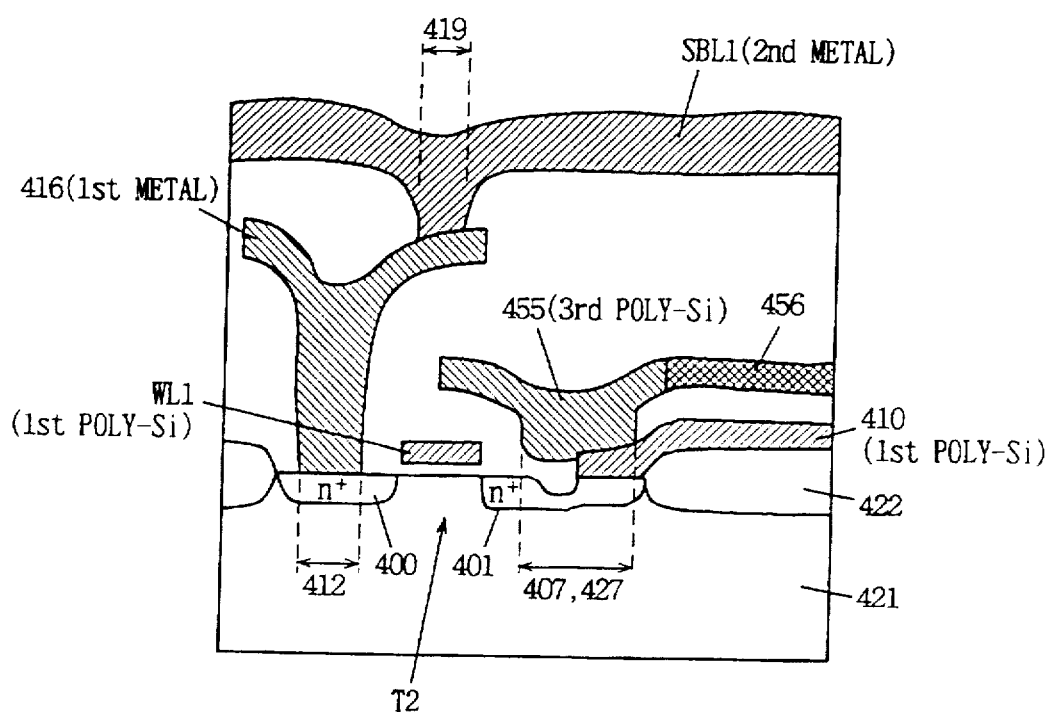
FIG. 57 is a cross sectional view of FIG. 56 along the line F—F.

FIG. 56 is a plan view illustrating a structure of the SRAM memory cell in the semiconductor memory device depending on an embodiment 26 of the present invention. FIG. 57 is a cross-sectional view of FIG. 56 along the line F—F.

With reference to FIG. 56 and FIG. 57, the power supply wiring 455 is connected, different from FIG. 44, to the gate wiring 410 through the contact hole 427 and to the gate wiring 411 through the contact hole 428 in the SRAM memory cell of this embodiment 26. This power supply wiring 455 is formed, like the storage nodes 424, 425 of FIG. 44, by etching the third polysilicon layer to the predetermined shape. The power supply voltage Vcc is applied to the power supply wiring 455. The power supply wiring 455 has high resistances 456 and 457. The high resistances 456, 457 have sheet resistances of several G $\Omega$ to several T $\Omega$. Low resistances other than the high resistances 456, 457 of the power supply wiring 455 have sheet resistances of several tens $\Omega$ to several hundreds $\Omega$. Moreover, the cell plate electrode 426 is not formed, different from FIG. 44 in this embodiment 24.

Figure 58:
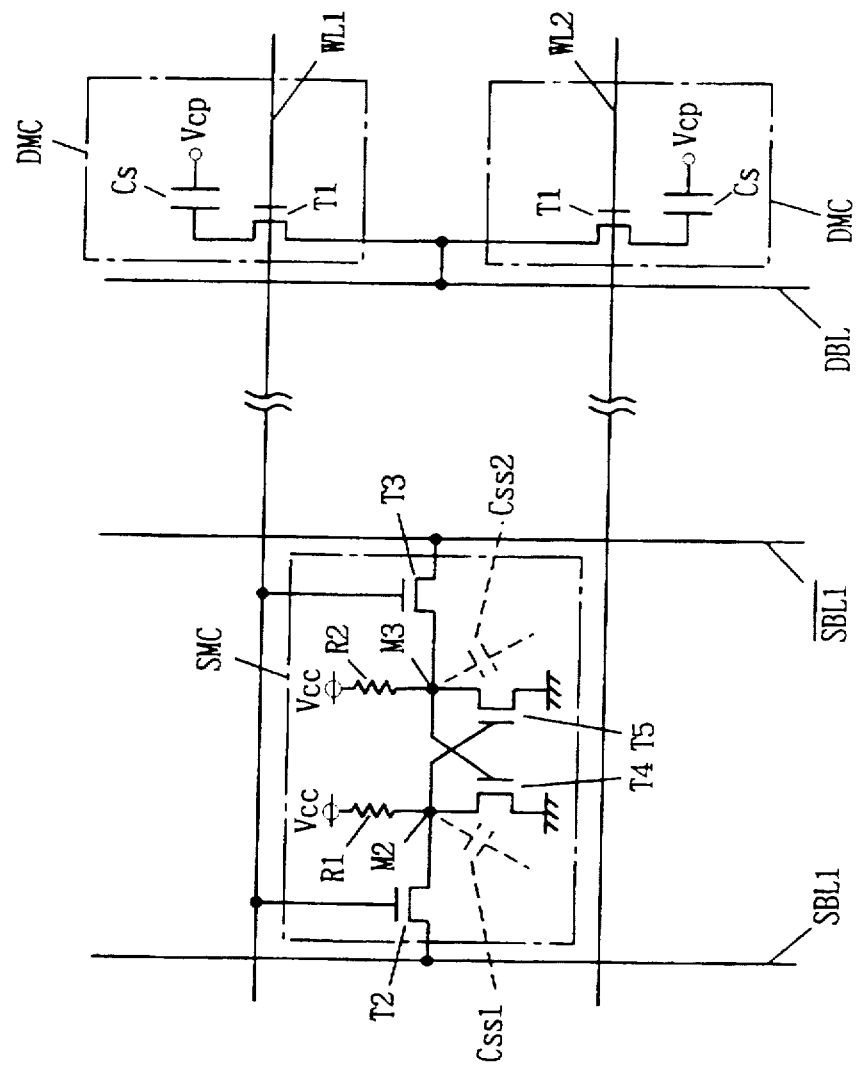
FIG. 58 is a circuit diagram illustrating a structure of the memory cell shown in FIG. 56.

The high resistance 456 corresponds to a load resistance R1 in FIG. 58, while the high resistance 457 corresponds to a load resistance R2. Therefore, the power supply voltage Vcc is impressed to the memory node M2 through the high resistance 456 (R1). Moreover, the power supply voltage Vcc is applied to the memory node M3 through the high resistance 457 (R2).

In this SRAM memory cell SMC, a cell plate electrode is not formed, but the memory node M2 has a parasitic capacitance Css1, while the memory node M3 has a parasitic capacitance Css2 as shown in FIG. 58.

The SRAM memory cell SMC has load resistances R1, R2, the memory nodes M2 and M3 are complimentarily pulled up to the power supply voltage Vcc by the load resistances R1, R2. Therefore, the data of this memory cell SMC is never destroyed with passage of time.

Next, a method of forming the SRAM memory cell SMC will be explained with reference to FIG. 59.

Figure 42:
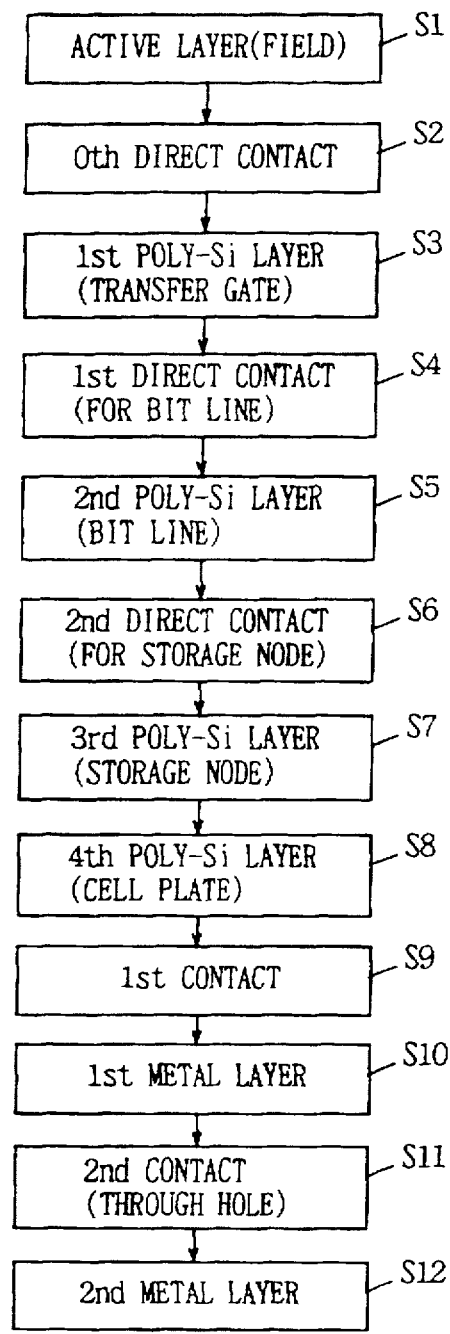
FIG. 42 is a process diagram illustrating a method of manufacturing the memory cell shown in FIG. 37.
Figure 59:
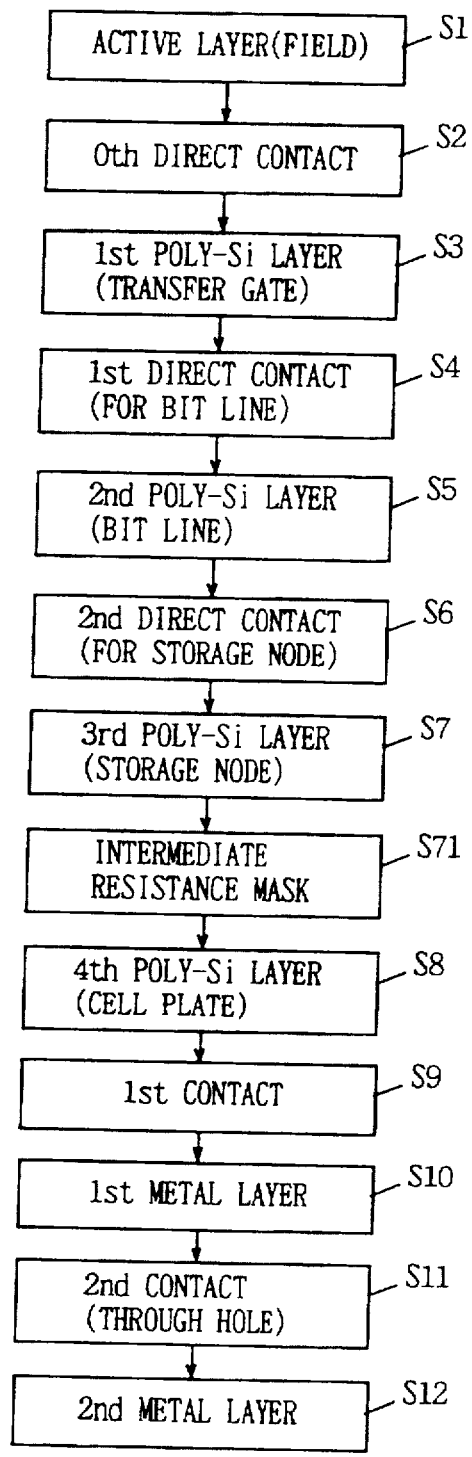
FIG. 59 is a process diagram indicating a method of manufacturing the memory cell shown in FIG. 56.

In the manufacturing process of FIG. 59, the step S71 for partially changing a resistance value of the power supply wiring 455 using an intermediate resistance mask is added between the steps S7 and S8 shown in FIG. 42.

Therefore, in the step S7, the third polysilicon layer is etched to the predetermined shape by the photoresist method and thereby the power supply wiring 455 is formed. The power supply wiring 455 initially has a sheet resistance of several G $\Omega$ to several T $\Omega$.

In the step S71, a part of the power supply wiring 455 is covered with an intermediate resistance 458 as shown in FIG. 60. An impurity is doped to this power supply wiring 455. Thereby, a greater part of the power supply wiring 455 has a low resistance value. However the portions 456 and 457 covered with the intermediate resistance mask 458 are maintained as the initial high resistance portions. Therefore, only the portions 456, 457 of the power supply wiring 455 become high resistance value.

According to the embodiment 26, since the high resistance portions 457 and 456 are formed respectively on the driver transistors T4 and T5, a size of the SRAM memory cell is sufficiently small. Moreover, the SRAM memory cell providing a load resistance can be formed only by adding the step S71 of the intermediate resistance mask.

[Embodiment 27]

Figure 62:
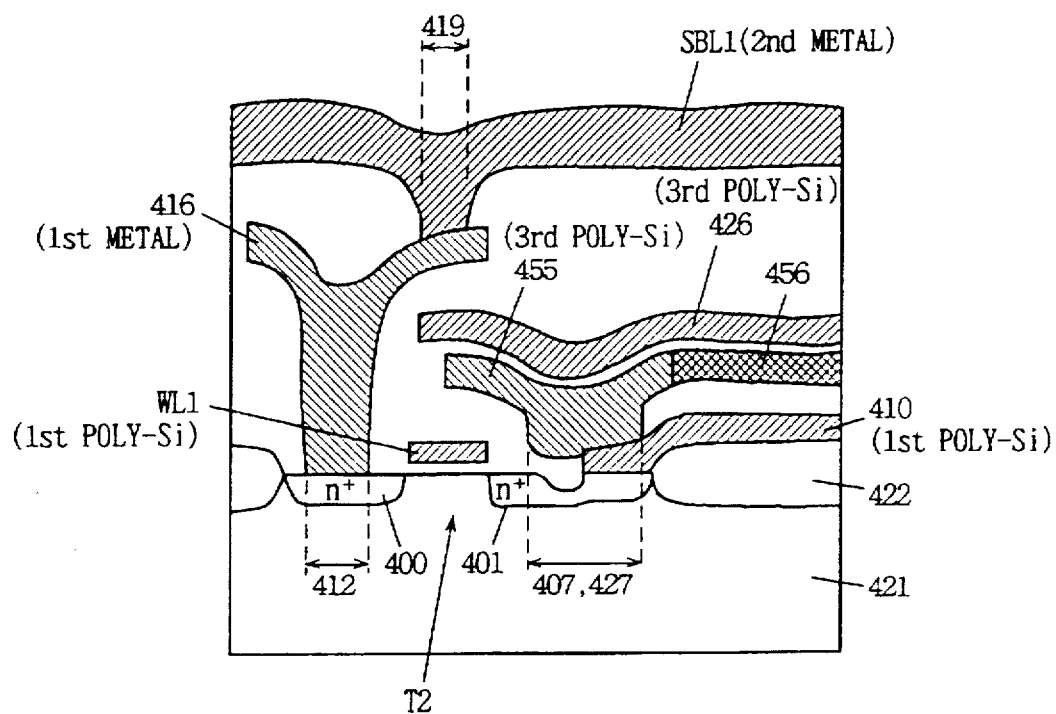
FIG. 62 is a cross sectional view of FIG. 61 along the line G—G.

FIG. 61 is a plan view illustrating a structure of the SRAM memory cell in the semiconductor memory device depending on an embodiment 27 of the present invention. FIG. 62 is a cross-sectional view of FIG. 61 along the line G—G.

Figure 63:
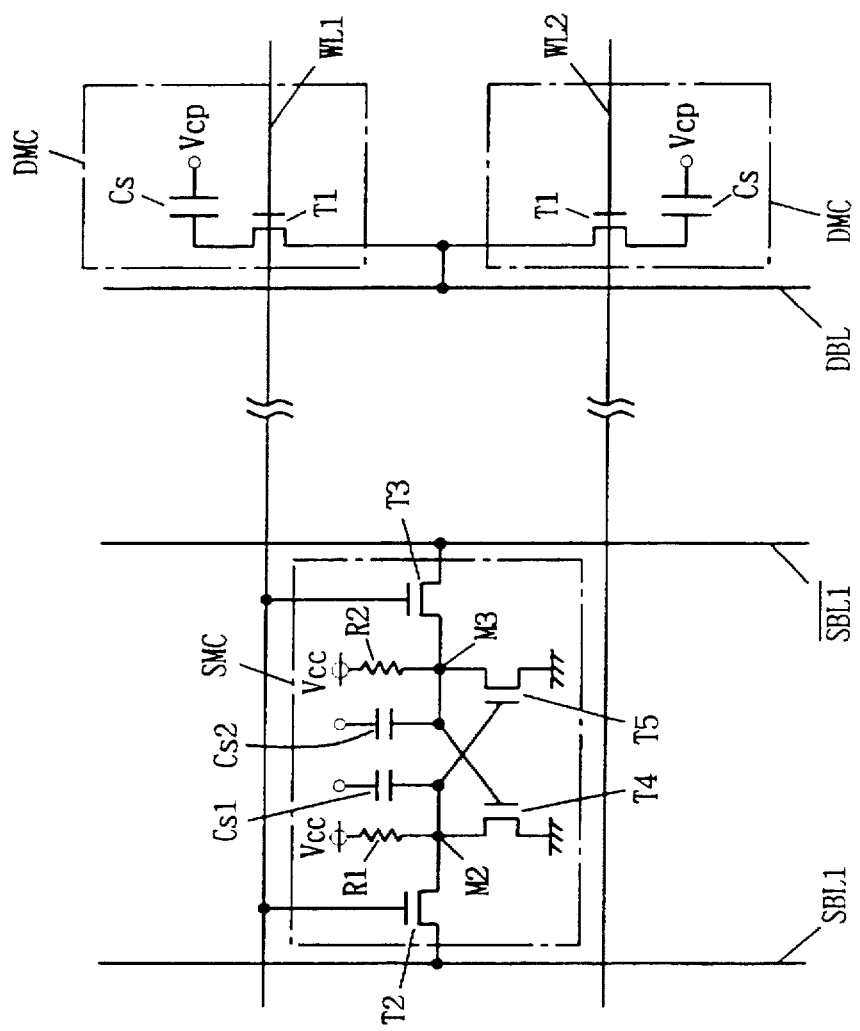
FIG. 63 is a circuit diagram illustrating a structure of the memory cell shown in FIG. 61.
Figure 64:
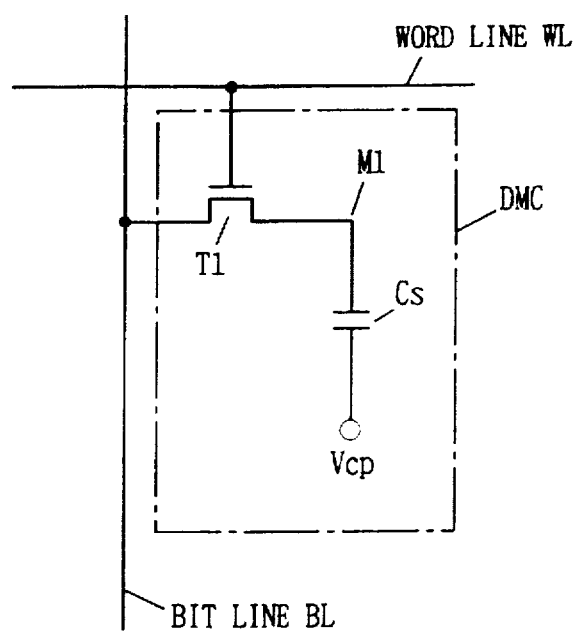
FIG. 64 is a circuit diagram illustrating a structure of the memory cell for DRAM.
Figure 65A:
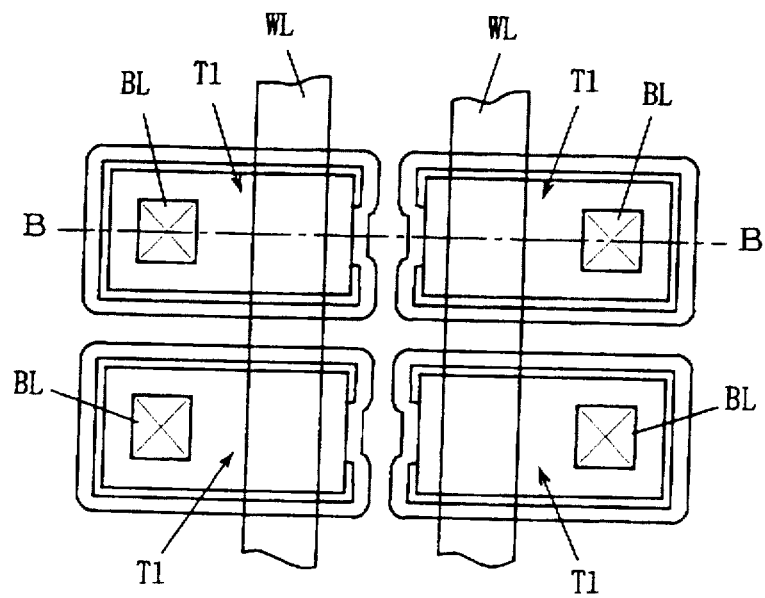
FIG. 65A is a plan view illustrating a structure of the memory cell shown in FIG. 64
Figure 65B:
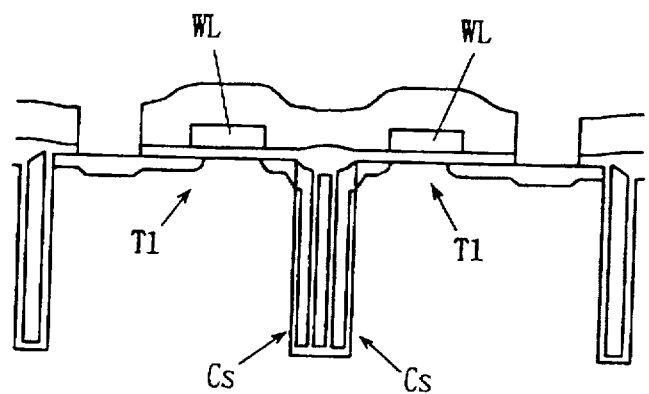
FIG. 65B is a cross sectional view of FIG. 65A along the line B—B.
Figure 66:
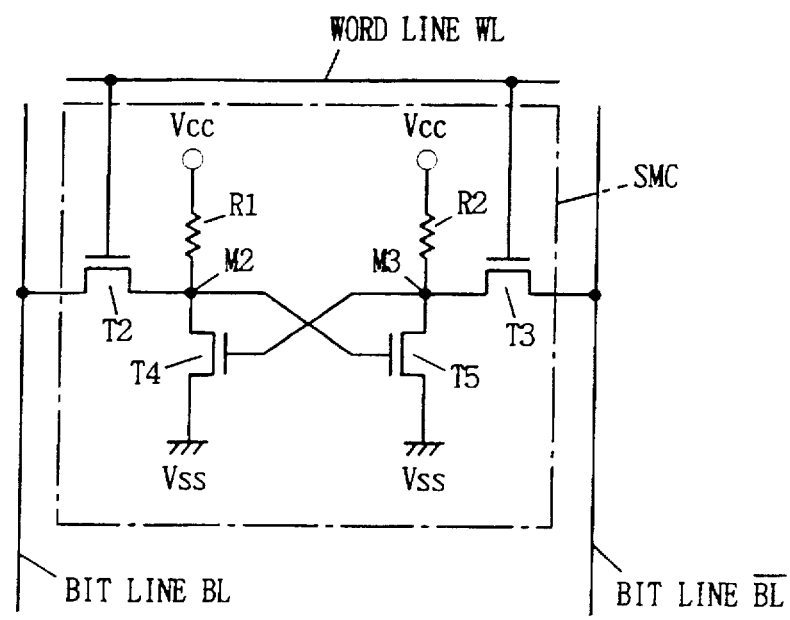
FIG. 66 is a circuit diagram illustrating a structure of the memory cell for SRAM.
Figure 67:
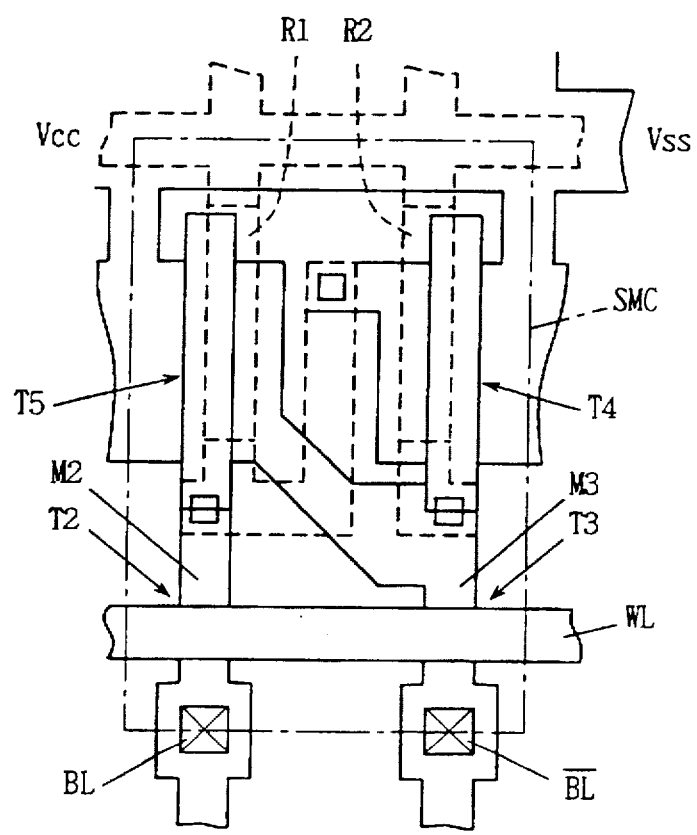
FIG. 67 is a plan view illustrating a structure of the memory cell shown in FIG. 66.
Figure 68:
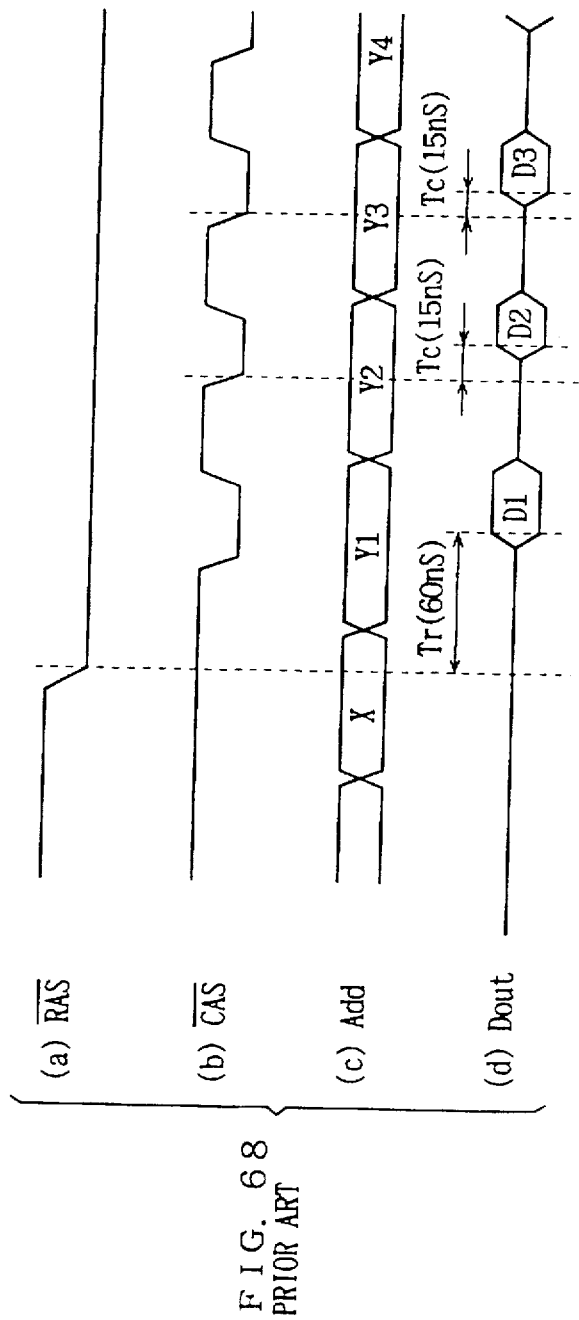
FIG. 68 is a timing chart indicating read operation of DRAM in the page mode.
Figure 69:
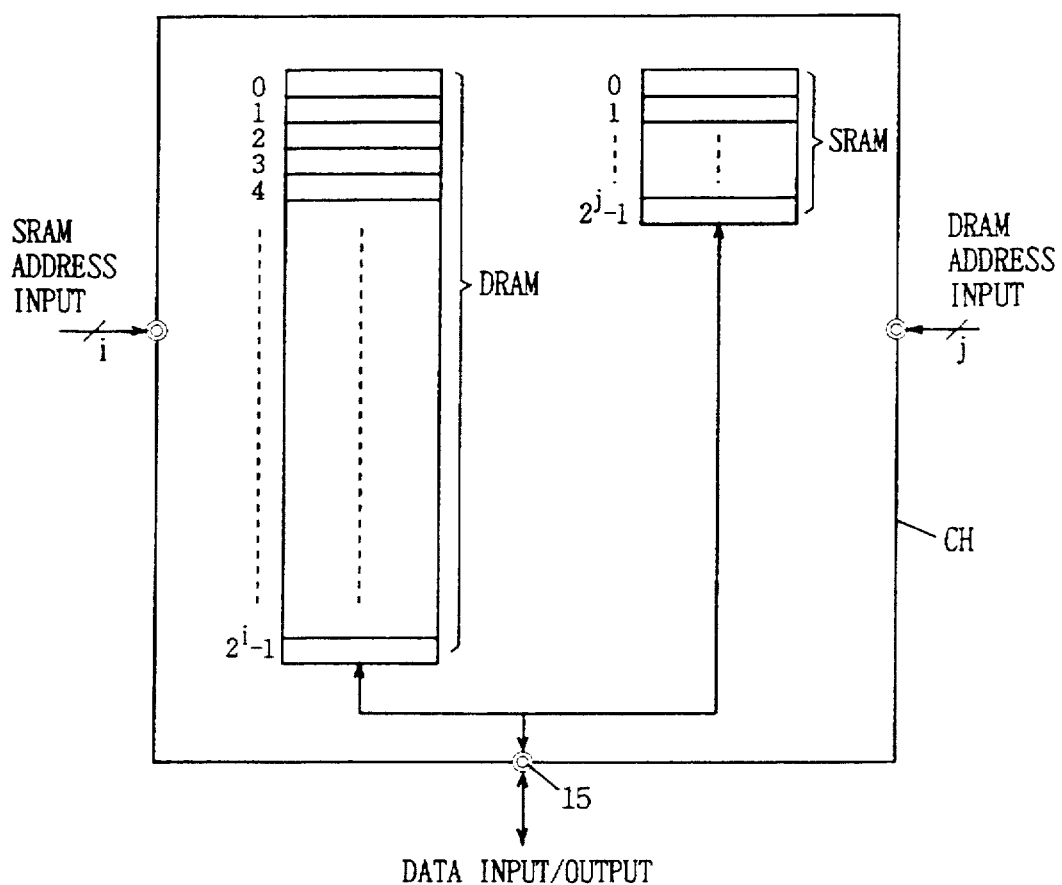
FIG. 69 is a diagram illustrating a structure of a cash DAM memory.
Figure 70:
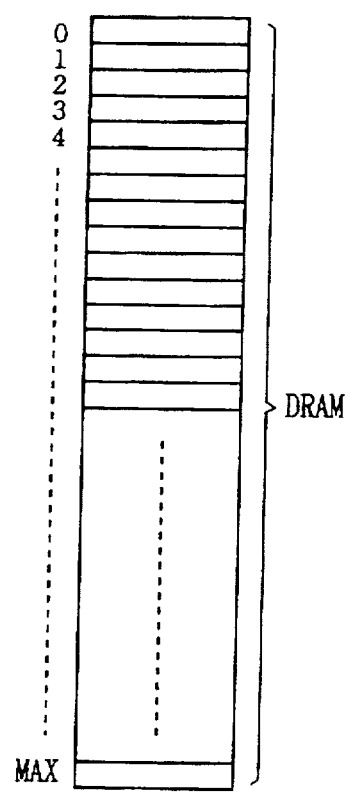
FIG. 70 is a diagram illustrating a structure of the memory in such a case that DRAM is used as the main memory of a computer.

With reference to FIG. 61 and FIG. 62, the cell plate electrode 426 is formed, different from FIG. 56, to cover the power supply wiring 455 in the SRAM memory cell of the embodiment 27. Therefore, the power supply wiring 455 and cell plate electrode 426 form the capacitors Cs1 and Cs2 shown in FIG. 63. The cell capacitor Cs1 is connected to the memory node M2 and the cell capacitor Cs2 is connected to the memory node M3.

According to the embodiment 27, since the cell plate electrode 426 is formed, the data can reliably be stored in the memory nodes M2 and M3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of operating a semiconductor memory device comprising:

a plurality of word lines arranged in a plurality of rows;

a plurality of first bit line pairs arranged in a plurality of columns;

a plurality of first memory cells arranged corresponding to any interesting points of said plurality of word lines and said plurality of first bit line pairs, each having a first access rate and connected to a corresponding word line and a corresponding first bit line pair;

a second bit line pair arranged crossing said plurality of word lines;

a plurality of second memory cells arranged corresponding to any intersecting points of said plurality of word lines and said second bit line pair, each having a second access rate faster than said first access rate and connected to the corresponding word line and the second bit line pair;

said method comprising the steps of:

selecting any one of said plurality of word lines;

latching data read to said second bit line pair from the second memory cell connected to said selected word line;

latching data read to said plurality of first bit line pairs from the plurality of first memory cells connected to said selected word line;

selecting one data from said latched data of the plurality of first memory cells;

transferring said selected data to said second bit line pair; and transferring said latched data of the second memory cell to one of said plurality of first bit line pairs.

2. A method of operating a semiconductor memory device comprising:

a plurality of word lines arranged in a plurality of rows;

a plurality of first bit line pairs arranged in a plurality of columns;

a plurality of first memory cells arranged corresponding to any intersecting points of said plurality of word lines and said plurality of first bit line pairs, each having a first access rate and connected to a corresponding word line and a corresponding first bit line pair;

a second bit line pair arranged crossing said plurality of word lines; and a plurality of second memory cells arranged corresponding to any intersecting points of said plurality of word lines and said second bit line pair, each having a second access rate faster than said first access rate and connected to the corresponding word line and the second bit line pair;

said method comprising the steps of:

selecting any one of said plurality of word lines;

latching data read to said second bit line pair from the second memory cell connected to said selected word line; and transferring said latched data of the second memory cell to one of said plurality of first bit line pairs.

3. A method of operation a semiconductor memory device comprising:

a plurality of word lines arranged in a plurality of row;

a plurality of first bit line pairs arranged in a plurality of columns;

a plurality of first memory cells arranged corresponding to any intersecting points of said plurality of word lines and said plurality of first bit lines pairs, each having a first access rate and connected to a corresponding word line and a corresponding first bit line pair;

a second bit line pair arranged crossing said word lines; and a plurality of second memory cells arranged corresponding to any intersecting points of said plurality of word lines and said second bit line pair, each having a second access rate faster than said first access rate and connected to the corresponding word line and the second bit line pair;

said method comprising the steps of:

selecting any one of said plurality of word lines;

latching data read to said plurality of first bit line pairs from the plurality of first memory cells connected to said selected word line; and transferring one of said latched data of the plurality of first memory cells to said second bit line pair.

* * * * *